United States Patent
Hotomi et al.

(10) Patent No.: US 6,297,577 B1
(45) Date of Patent: Oct. 2, 2001

(54) LIGHT CONTROLLING APPARATUS

(75) Inventors: Hideo Hotomi, Toyonaka; Kenji Masaki, Nagaokakyo; Kusunoki Higashino, Osaka, all of (JP)

(73) Assignee: Minolta Co., Ltd., Osaka (JP)

( * ) Notice: Subject to any disclaimer, the term of this patent is extended or adjusted under 35 U.S.C. 154(b) by 0 days.

(21) Appl. No.: 09/583,857

(22) Filed: May 31, 2000

Related U.S. Application Data

(62) Division of application No. 08/587,844, filed on Jan. 11, 1996.

(30) Foreign Application Priority Data

| Jan. 12, 1995 | (JP) | 7-003502 |
| Jan. 12, 1995 | (JP) | 7-003504 |
| Mar. 15, 1995 | (JP) | 7-055719 |
| Apr. 4, 1995 | (JP) | 7-078659 |

(51) Int. Cl.$^7$ .................................... H01L 41/08
(52) U.S. Cl. ............... 310/330; 310/331; 310/378; 310/354; 310/365
(58) Field of Search ............... 310/330, 331, 310/348, 354, 365

(56) References Cited

U.S. PATENT DOCUMENTS

| 2,875,253 | 2/1959 | Cavalieri et al. ............... 310/8.2 |
| 3,093,719 | 6/1963 | Eyck ............... 179/110 |
| 3,110,824 | * 11/1963 | Flanagan ............... 310/330 |
| 3,950,638 | * 4/1976 | Terayama ............... 310/330 |
| 4,342,936 | * 8/1982 | Marcus et al. ............... 310/330 |
| 4,387,318 | * 6/1983 | Kolm et al. ............... 310/330 |
| 4,431,938 | 2/1984 | Inoue ............... 310/348 |
| 4,439,780 | 3/1984 | DeYoung et al. ............... 347/68 |
| 4,441,023 | 4/1984 | Doctor et al. ............... 250/338 |
| 4,490,641 | * 12/1984 | Takeuchi et al. ............... 310/366 |
| 4,503,350 | 3/1985 | Nakatani ............... 310/321 |
| 4,533,849 | * 8/1985 | Schnell ............... 310/330 |
| 4,565,940 | 1/1986 | Hubbard, Jr. ............... 310/326 |
| 4,585,970 | * 4/1986 | Koal et al. ............... 310/331 |
| 4,605,919 | 8/1986 | Wilner ............... 338/2 |
| 4,678,957 | 7/1987 | Harnden, Jr. et al. ............... 310/332 |
| 4,752,788 | 6/1988 | Yasuhara ............... 346/140 R |
| 4,806,859 | 2/1989 | Hetrick ............... 324/207 |
| 4,893,048 | * 1/1990 | Farrall ............... 310/331 |
| 5,091,671 | 2/1992 | Yoshida ............... 310/358 |
| 5,170,089 | 12/1992 | Fulton ............... 310/328 |
| 5,247,222 | * 9/1993 | Engle ............... 310/328 |
| 5,376,857 | 12/1994 | Takeuchi et al. ............... 310/328 |
| 5,536,963 | 7/1996 | Polla ............... 257/417 |
| 5,597,610 | 1/1997 | Miura ............... 427/58 |
| 5,631,463 | * 5/1997 | Kawasaki et al. ............... 250/306 |
| 5,708,524 | 1/1998 | Min ............... 359/290 |
| 5,841,217 | * 11/1998 | Kizaki et al. ............... 310/348 |

FOREIGN PATENT DOCUMENTS

| 57-13781 A | 1/1982 | (JP) | ............... H01L/41/07 |
| 57-202112 A | 12/1982 | (JP) | ............... H03H/9/125 |
| 61-32487 A | 2/1986 | (JP) | ............... H01L/41/07 |
| 62-60482 A | 3/1987 | (JP) | ............... H02N/2/00 |

* cited by examiner

*Primary Examiner*—Thomas M. Dougherty
(74) *Attorney, Agent, or Firm*—Sidley Austin Brown & Wood

(57) ABSTRACT

A piezo-electric actuator is rigidly mounted for a portion of one surface and provided with opposing electrodes for application of a bias. Because the mounted portion is constrained from deformation, the piezo-electric actuator deforms in a bending manner upon application of a bias. The actuator is provided with a mirror surface for selective reflection of an incident light beam in accordance with a bending deformation of the actuator. The actuator can also modulate a light beam by selectably deflecting into the light path to thereby block the light beam.

38 Claims, 49 Drawing Sheets

////// BONDED REGION

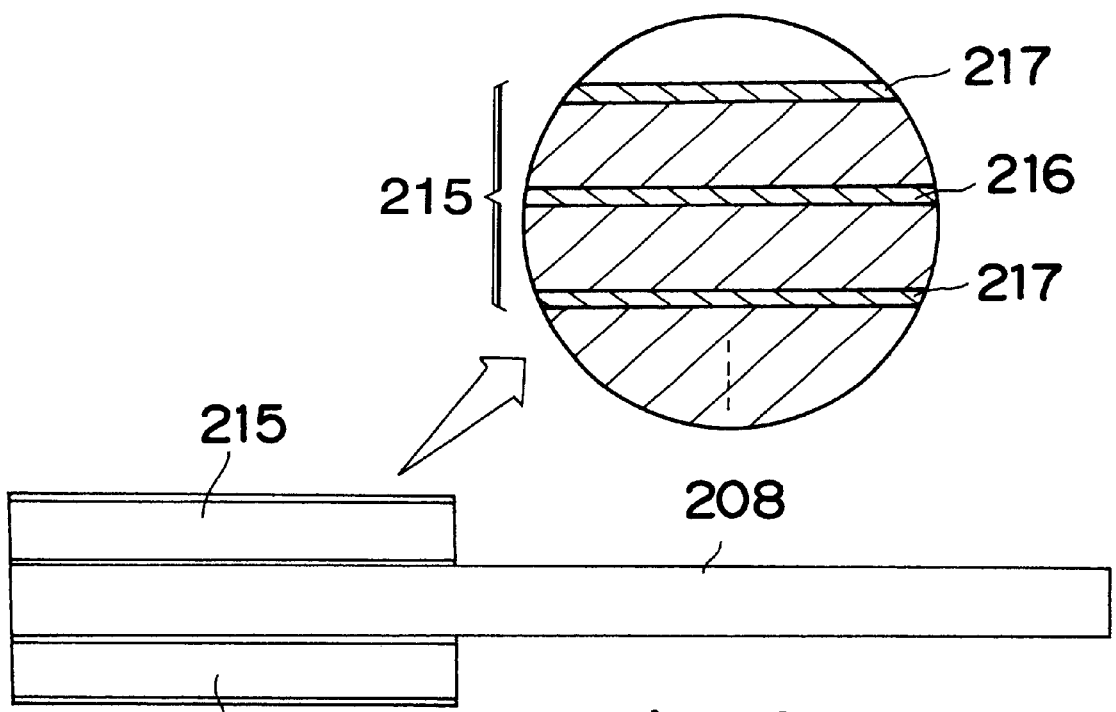

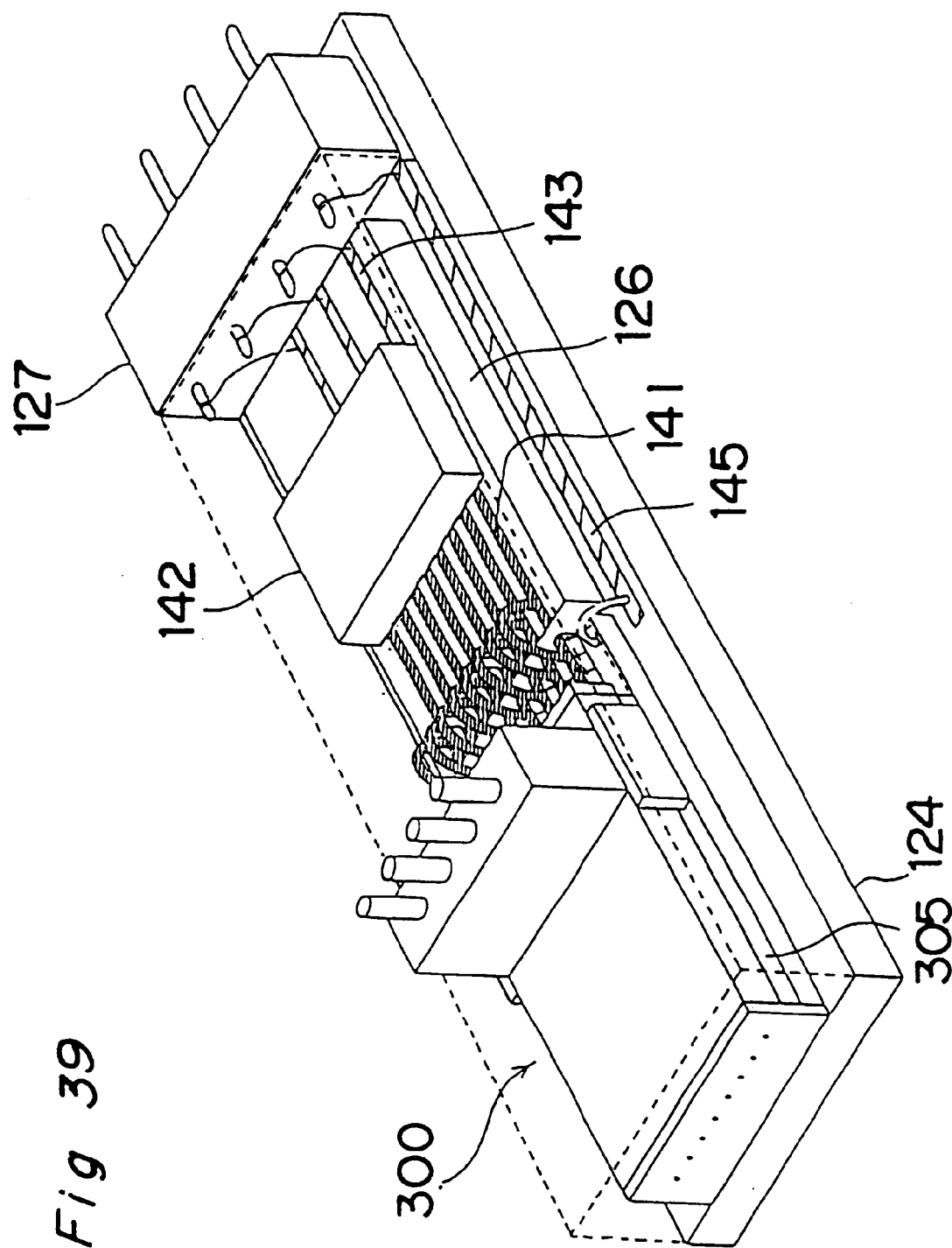

LIGHT CONTROLLING APPARATUS

RELATED APPLICATIONS

This application is a division of copending application Ser. No. 08/587,844, filed Jan. 11, 1996, claiming priority from Japanese Patent Application Nos. 7-003502, filed Jan. 12, 1995, 7-003504, filed Jan. 12, 1995, 7-055719, filed Mar. 15, 1995 and 7-078659, filed Apr. 4, 1995 each of which is hereby incorporated by reference in its entirety.

BACKGROUND OF THE INVENTION

1. Field of the invention

The present invention relates to an ink jet recording apparatus. More particularly, the invention concerns an electro-mechanical transducer employed in the ink jet recording apparatus.

2. Background of the invention

Conventionally, an electro-mechanical transducer having piezo-electric members is employed in an ink jet recording device. The piezo-electric member vibrates in different vibrating modes depending upon its shape, the direction that the member is polarized, or the direction that an electronic field applied thereto. For example, where the piezo-electric member is in the form of plate which is rectangular in cross-section and is polarized in a direction along its transverse direction, applying an electronic field along its polarized direction makes the piezo-electric member contract along its longitudinal direction and expand along its transverse direction, while applying an electronic field to the piezo-electric member reverse to the polarized direction makes the piezo-electric member expand along its longitudinal direction and contract along its transverse direction. A vibration along the longitudinal direction will be referred to as "a d(31) mode" while a vibration mode along the transverse direction will be referred to as "a d(33) mode". Further, applying the electronic field to the piezo-electric member perpendicular to its polarized direction introduces therein a shear stress along its surface. This vibration mode is referred to as "a d(15) mode" hereinafter.

Each prior art electro-mechanical transducer employs one of these vibration modes, the d(33) or d(31) mode being mainly employed among them. Further, a prior art ink jet recording device includes the electro-mechanical transducer. Each transducer has therein an ink chamber in which an elongated piezo-electric member is arranged. The piezo-electric member is vibrated according to image signals. Then, in response to displacements of the piezo-electric member and the resultant energy generated in the ink, ink droplets are ejected from the ink chamber through a nozzle formed in a wall of the chamber.

For instance, U.S. Pat. No. 4,752,788 discloses an ink jet head which is shown in FIG. 1. This ink jet head 10 includes a piezo-electric member 11 in which a plurality of parallel slots 12 are formed, and a plate 13 for covering the slots 12 to define respective ink chambers 14. Each slot 12 has at its bottom portion a pair of slits extending in a longitudinal direction thereof so as to define therebetween an elongated mount 15. An electrode 16 is arranged on the upper surface of the mount 15, and another electrode 17 is provided on a lower surface of the piezo-electric member 11 opposing electrode 16. In operation of the head 10 thus constructed, applying a voltage between the electrodes 16 and 17 causes the mount 15 to deform, which varies a volume of the ink chamber 14. This energizes ink in the chamber 14 so that a droplet of the ink is ejected through a nozzle which is not shown.

Further, Japanese Patent Laid-Open Publication No. 6-143563 discloses another ink jet head 20 depicted in FIG. 2. The head 20 has a first base plate 21. The plate 21 includes a plurality of parallel slots 22 which are covered by a compliant film 23 to define a plurality of corresponding ink chambers 24. The head 20 also has a second base plate 25. This plate 25 has thereon a plurality of mutually spaced piezo-electric vibrators 26 for drive as well as a dummy piezo-electric vibrator 27. These piezo-electric vibrators 26 and 27 are constructed by superimposing piezo-electric thin layers and electrode layers alternately. The second base plate 25 is arranged on the first base plate 21 so that each vibrator 26 contacts with the compliant film 23 over the ink chamber 24. The drive and dummy vibrators 26 and 27 are typically formed by first bonding a layered piezo-electric plate on the plate 25 and second forming grooves in the plate at equal intervals. The first base plate 21, compliant film 23, and the second base plate 25, including the vibrators 26 and 27, are held securely by rigid plates 28 and 29 using bolts. In operation of the ink jet head 20 thus constructed, applying voltage on the vibrator 26 causes it to deform, which moves the complaint film 23 to force the ink so that the volume of the ink chamber 24 varies and then an ink droplet is ejected through a nozzle which is not shown.

However these prior arts ink jet heads employs one of d(31), d(33), or d(15) vibration modes, each of which provides for only a small deformation with the piezo-electric member. Therefore, the ink is not sufficiently energized in response to the image signals.

Further, in the above mentioned systems, the vibration of one piezo-electric member is transmitted to the neighboring ink chambers and piezo-electric members, i.e., a cross-talk from chamber to chamber is occurred, which results in unexpected ink ejections from those ink chambers so that the resultant image of a recording device is damaged.

SUMMARY OF THE INVENTION

It is therefore an object of the present invention to provide an improved piezo-electric transducer which is capable of providing a piezo-electric member with a large deformation to eject an ink droplet vigorously.

Another object of the invention is to provide an improved piezo-electric transducer which is capable of ejecting ink droplets vigorously.

Further object of the invention is to provide an improved ink jet recording apparatus which employs a piezo-electric transducer capable of providing a piezo-electric member with a large deformation and then ejecting ink droplets vigorously.

In accordance with these objects, the present invention provides an ink jet recording apparatus which includes an ink chamber in which an ink is filled, said ink chamber having a nozzle from which the ink is ejected; a strip member which is provided along with said ink chamber, said strip member being extending in an extending direction from a first portion corresponding to said ink chamber to a second portion not corresponding to said ink chamber; and driver which is connected with said strip member to induce a displacement of said first portion in a direction orthogonal to the extending direction.

Further the present invention provides an electro-mechanical device which includes a base member; a piezo-electric member which has a strip shape extending in an extending direction, said piezo-electric member having a first surface along with said extending direction and a second surface opposing to said first surface, a part of said first surface being fixedly connected with said base plate, said second surface having at least one groove; a first electrode which is disposed on said first surface; and a second electrode which is disposed on said second surface throughout said groove.

Furthermore the present invention provides an electro-mechanical device which includes a strip member which has a strip shape extending in an extending direction, said strip member having a surface along the extending direction; a piezo-electric member which is fixedly connected with said surface at an edge portion of said strip member with respect to said extending direction; and a pair of electrodes which is provided on said piezo-electric member.

Moreover the present invention provides an electro-mechanical device which includes a piezo-electric member having a length (1) in an extending direction, said piezo-electric member having a first surface parallel to said extending direction, and having a second surface opposing to said first surface; a first electrode which is provided on said first surface; a second electrode which is provided on a first portion of said second surface, said first portion having a length (t) with respect to said extending direction from a first edge of said piezo-electric member; a base member on which a second portion of said piezo-electric member is fixedly connected, said second portion having a length (s) with respect to said extending direction from a second edge of said piezo-electric member, said second end being opposing to said first edge, wherein the lengths (1), (s) and (t) satisfy the following formations, (1)>(t)

(1)>(s).

Still further the present invention provides an electro-mechanical device which includes a piezo-electric member which has a first portion which is polarized in a predetermined direction and a second portion which is not polarized; and a base member on which said second portion is fixedly connected.

Furthermore, the present invention provides an ink jet recording device which includes an ink chamber in which ink is filled, said ink chamber having a aperture and a nozzle from which ink is ejected; a strip member a portion of which is inserted into said ink chamber from said aperture; a filling material which is provided a gap between said aperture and said strip member to prevent leakage on the ink.

BRIEF DESCRIPTION OF THE DRAWINGS

This and other objects and features of the present invention will become clear from the following description taken in conjunction with a preferred embodiment thereof with reference to the accompanying drawings throughout which like parts are designated by like reference numerals, and in which:

FIGS. 30A–30B show other modifications of the electro-mechanical transducer in which piezo-electric member has plurality of layers;

FIG. 39 is a perspective view of the ink jet head of the third embodiment;

DETAILED DESCRIPTION OF THE INVENTION (I) ELECTRO-MECHANICAL TRANSDUCER

Figure 1:
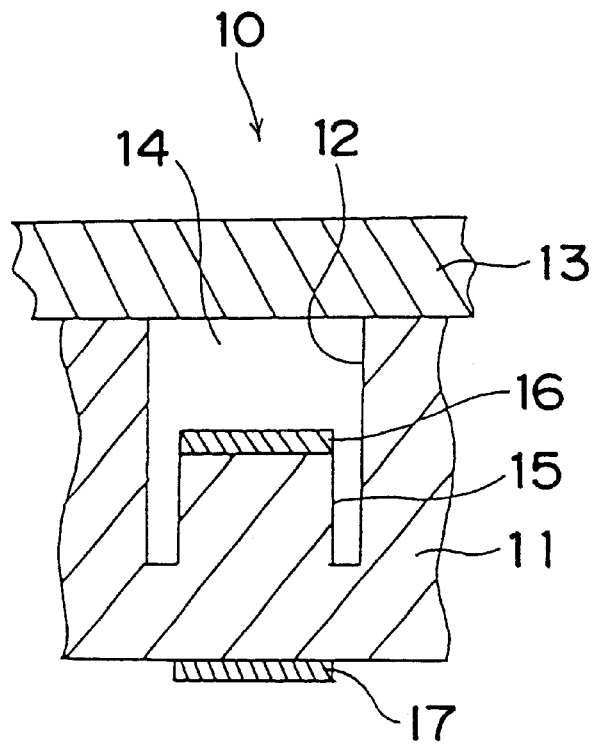
FIG. 1 is a transverse sectional view of a prior art electro-mechanical transducer.
Figure 2:
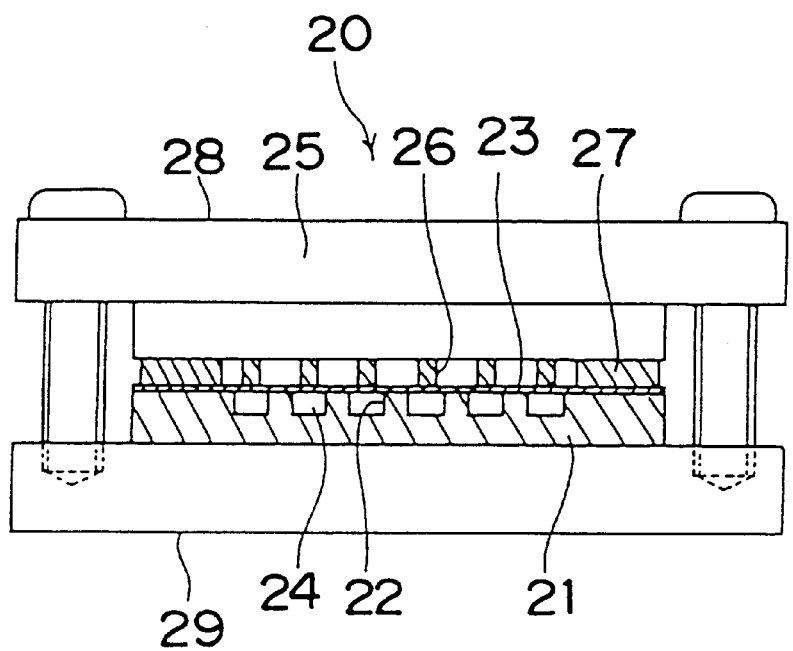
FIG. 2 is a transverse sectional view of another prior art electro-mechanical transducer.
Figure 3:
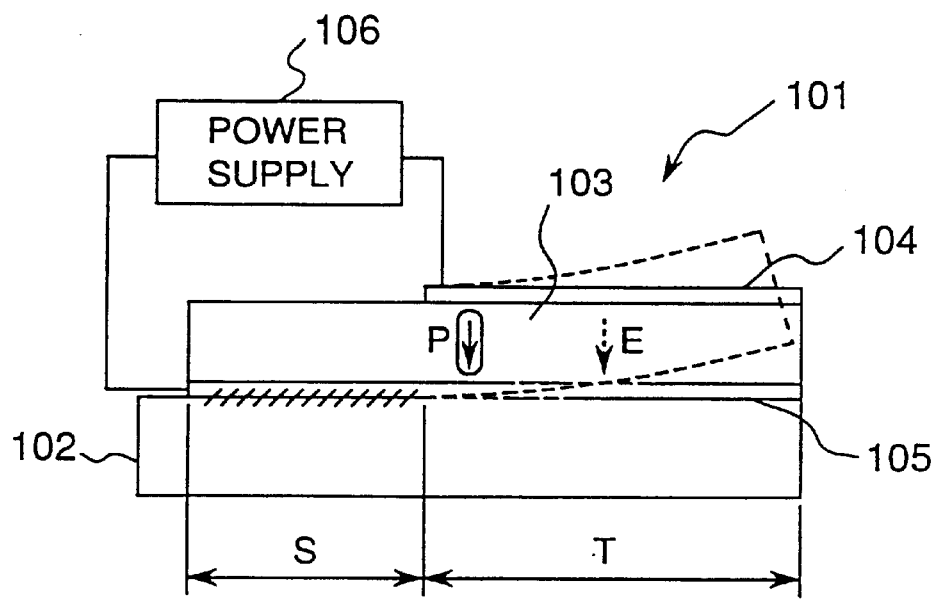
FIG. 3 is an elevation view of an electro-mechanical transducer of the present invention.

A discussion is made to an electro-mechanical transducer of the present invention. Referring to FIG. 3, which illustrates a structure of an electro-mechanical transducer of the invention, a reference numeral 101 generally indicates a piezo-electric transducer. This transducer 101 comprises a base plate 102 made of non-piezo-electric material and an elongated piezo-electric member 103. The piezo-electric member 103, preferably being a rectangular cross section, is polarized in its transverse direction indicated by an arrow P. Provided on the surfaces of the member 103, i.e., on surfaces through which the arrow P extends, are electrodes 104 and 105, respectively, made of electrically conductive material. The piezo-electric member 103 is bonded to the base plate 102 for a specific region S along the electrode 105. This bonded region S extends from one end of the member 103 for a predetermined distance so that the opposite end of the member 103 can bend upward. While the electrode 105 extends over all of the length of the member 103, the other electrode 104 extends only for a region T which positioned outside the bonded region S. This region T is referred to as un-bonded region hereinafter. The electrodes 104 and 105 are electrically connected to a power supply 106 to apply a predetermined voltage between the electrodes 104 and 105.

Figure 4:
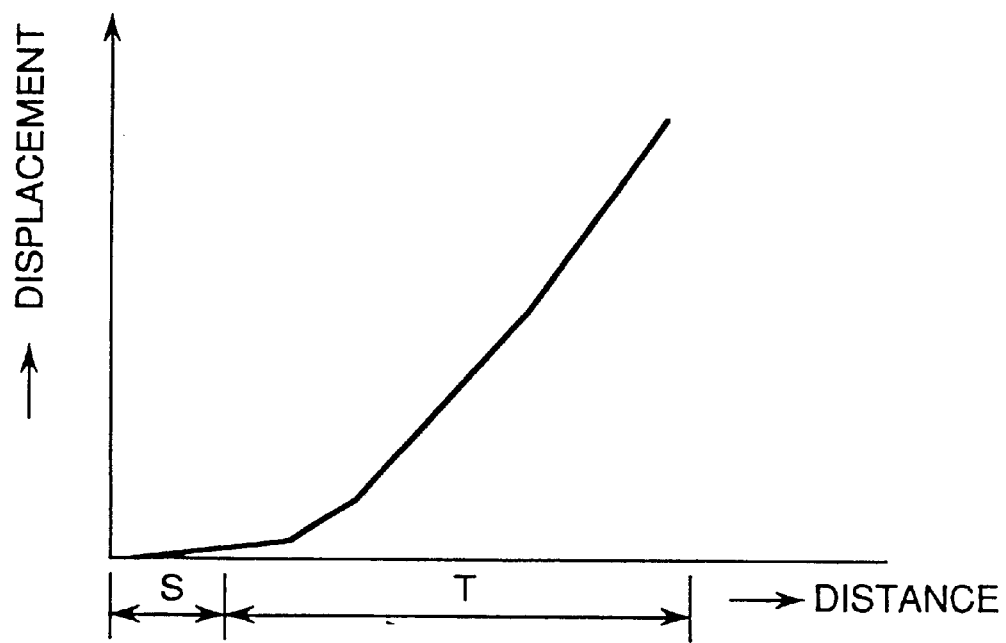
FIG. 4 is a graph which shows a relationship between a distance from a fixed position and a displacement of a piezo-electric member in the electro-mechanical transducer in FIG. 3.

In operation, upon turning on the power supply 106 to apply a voltage between the electrodes 104 and 105 so that an electronic field is formed in a direction indicated by an arrow E which is parallel to the polarized direction P, the opposite or free end of the piezo-electric member 103 in the un-bonded region T deforms to bend upward as illustrated by dotted lines. This is because the piezo-electric member 103 is secured to the base plate 102 only in the bonded region S, and it is not secured to the base plate 102 along the un-bonded region T. If instead, the piezo-electric member were bonded to the base plate over all of the length thereof, the piezo-electric member would contract in the longitudinal direction and expand in the traverse direction according to the d(33) vibration mode. Each displacement of the bent portion increases as the distance from the bonded region S increases as shown in FIG. 4, and the maximum displacement of the piezo-electric member is far greater than that of d(33) mode.

Upon turning off the power supply 106 to eliminate the electronic field, the piezo-electric member 103 in the un-bonded region returns its original position as depicted by riveting solid lines.

Figure 5:
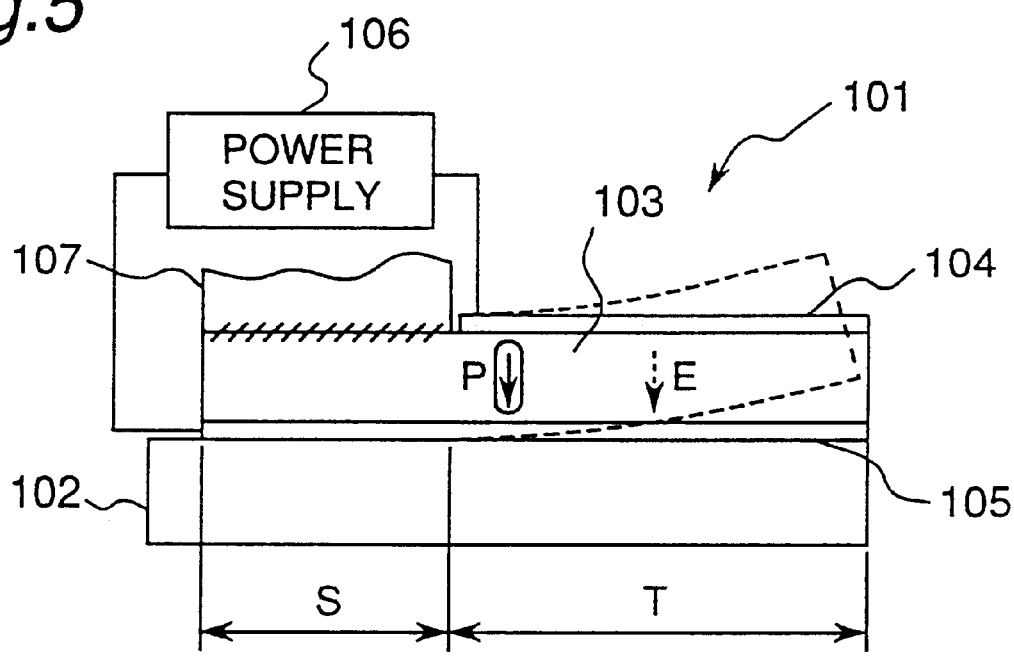
FIG. 5 is an elevation view of a modification of the electro-mechanical transducer.
Figure 6:
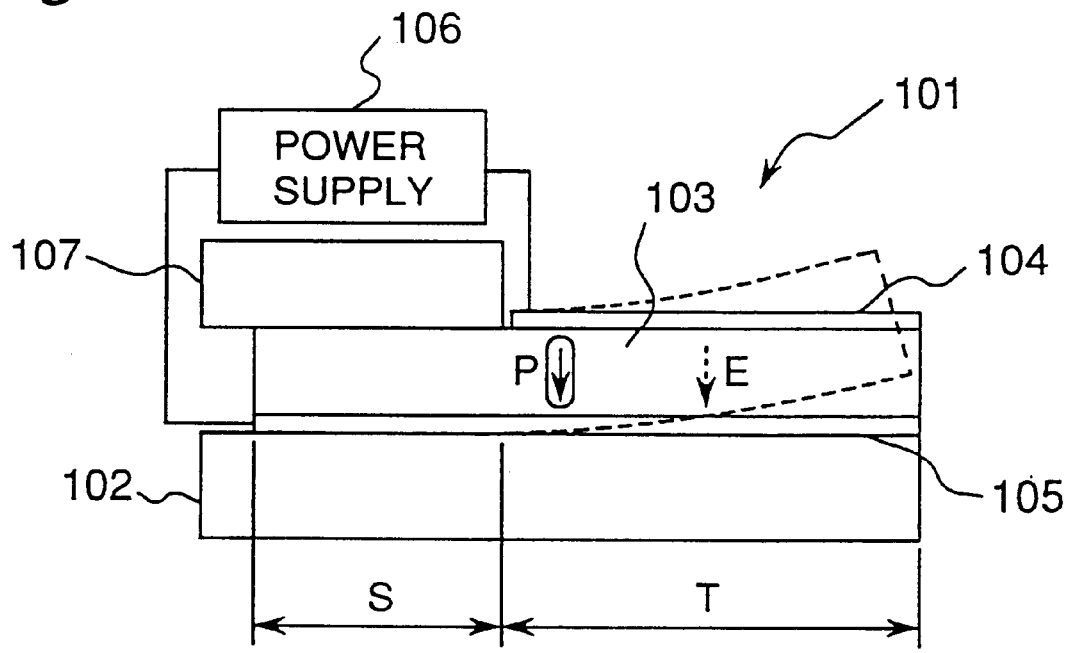
FIG. 6 is an elevation view of another modification of the electro-mechanical transducer.

Although bonding is employed for securing the piezo-electric member 103 to the base plate 102 in the previous embodiment, the member 103 may be secured by rivetting, molding, or the like. Alternately, as shown in FIG. 5, the member 103 may be secured by first bonding it to a retaining member 107 and then holding the piezo-electric member 103 together with the base plate 102, and finally holding the retaining member 107 firmly using, for example, clamps without bonding the member 107 to the base plate 102. Furthermore, it is not necessary to bond the piezo-electric member 103 either to the base plate 102 to or the retaining member 107, because the member 103 may be secured by clamping it between the base plate 102 and the retaining member 107, as illustrated in FIG. 6.

(II) INK JET RECORDING DEVICE

A. FIRST EMBODIMENT

Figure 7:
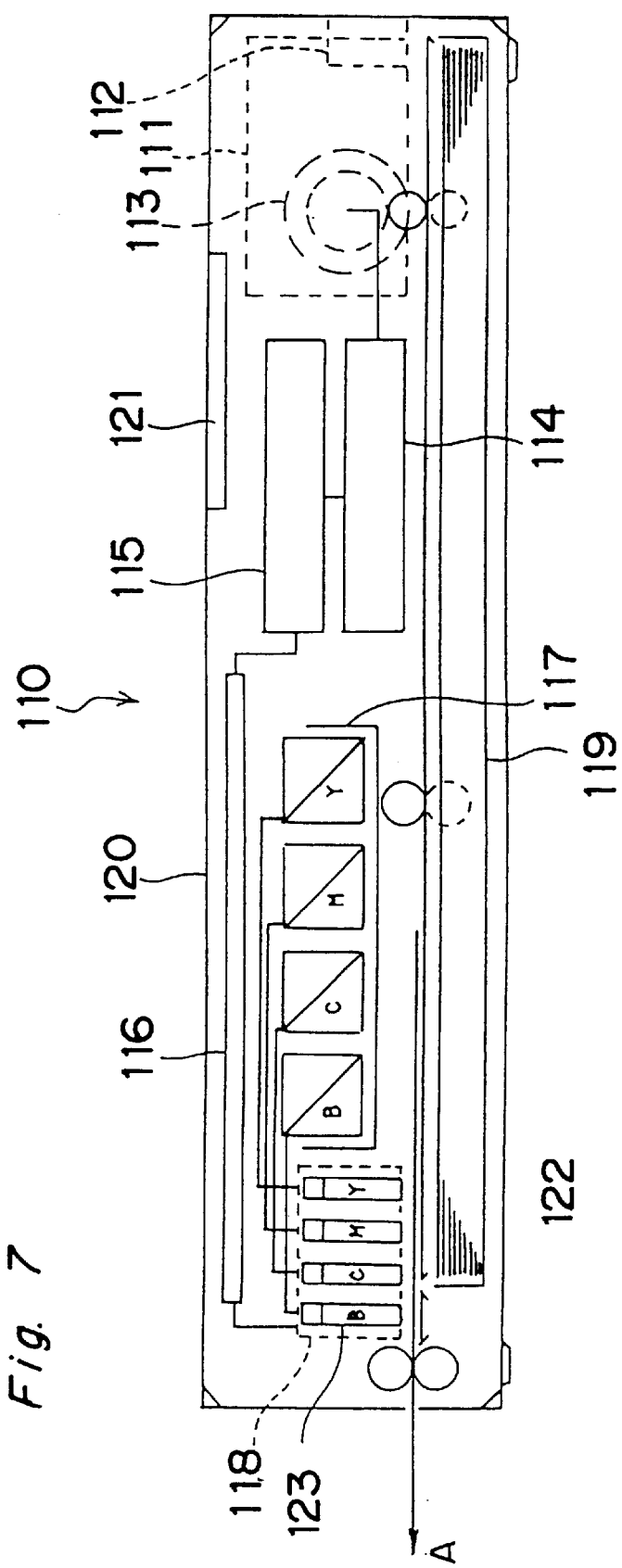
FIG. 7 is a cross-sectional view of a printer in which the electro-mechanical transducer of the present invention is installed.

A first preferred embodiment of an ink jet recording device of the present invention will be described below. Referring to FIG. 7, a reference numeral 110 generally designates an ink jet recording device of the invention. The ink jet recording device 110 generally includes a power circuit 111 having a plug 112, a driving source 113, a first controller 114, a memory 115, a second controller 116, an ink supply, a scan carriage 118, a sheet feeder 119, a housing 120, and an operation panel 121. The scan carriage 118 is so mounted as to scan in a direction which intersects perpendicularly to a direction indicated by arrow A, along which a sheet 122 from the feeder 119 advances. The carriage 118 houses four ink jet heads 123 having black, cyan, magenta, and yellow inks, respectively. These heads 123 are arranged along the sheet transporting direction with ink ejecting nozzles not shown being directed downward. Ink supply 117 supplies ink to heads 123.

Figure 8:
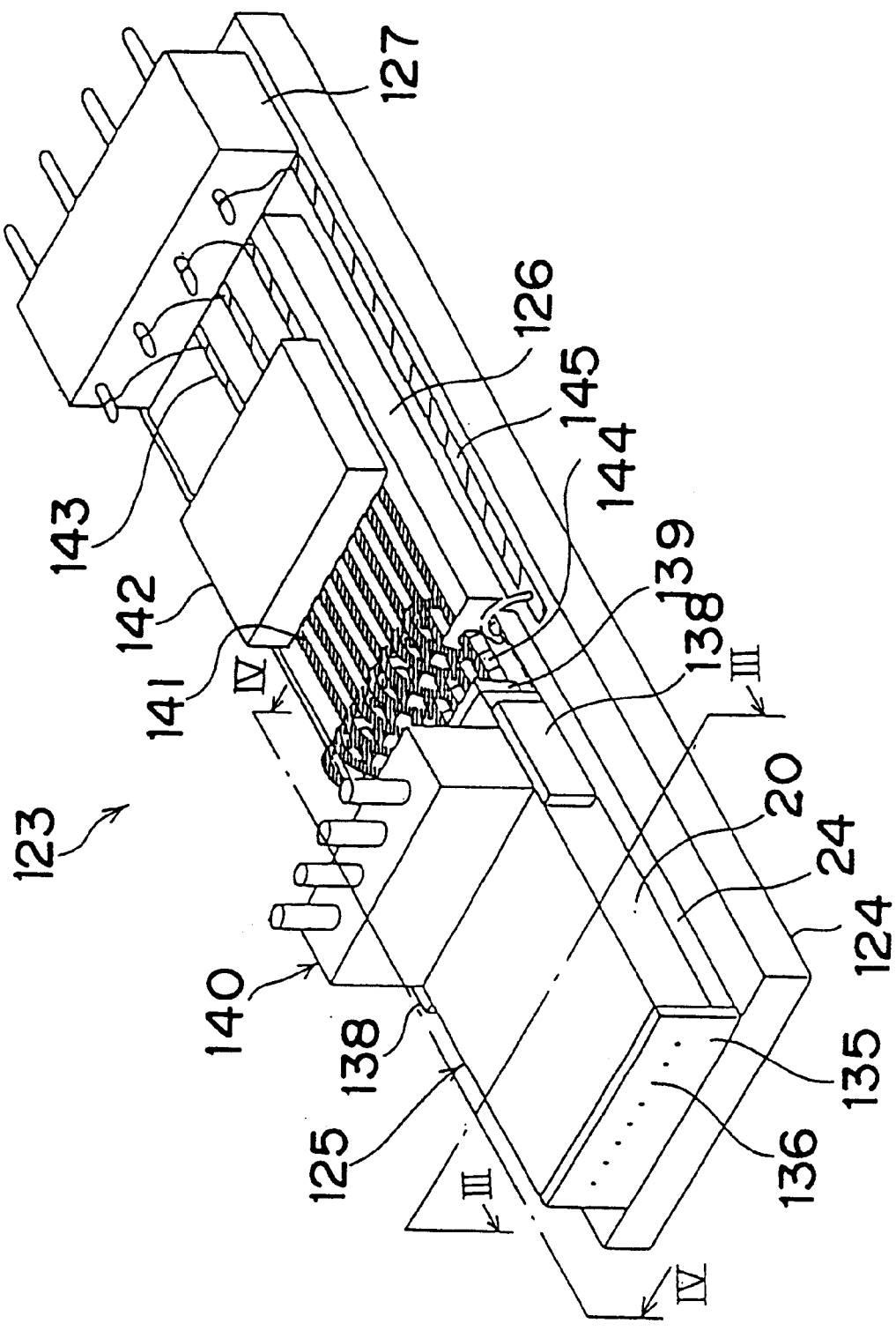
FIG. 8 is a perspective view of the ink jet head in which the electro-mechanical transducer of the present invention is installed.
Figure 9:
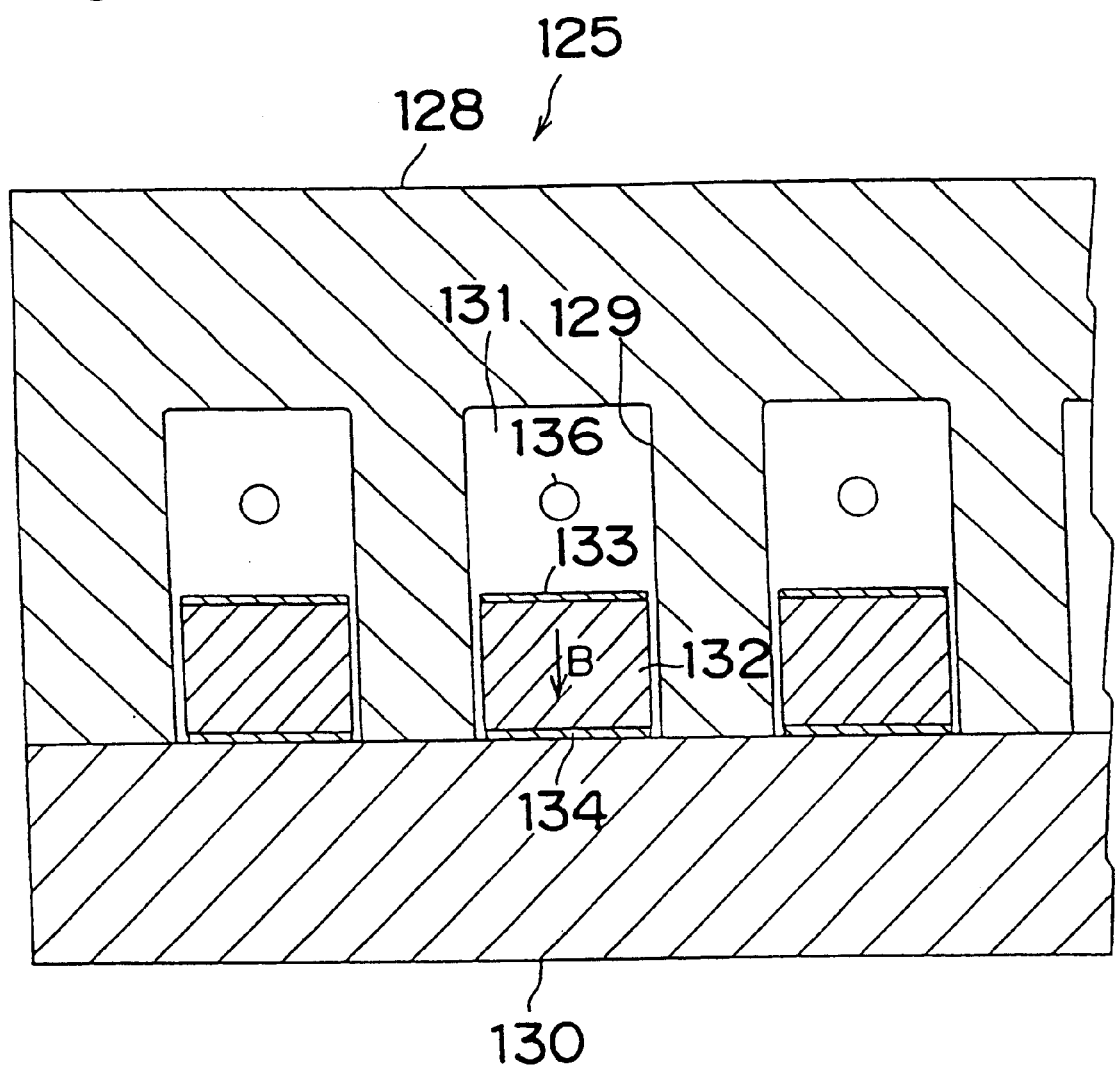
FIG. 9 is a transverse sectional view of the electro-mechanical transducer of the first embodiment.
Figure 10:
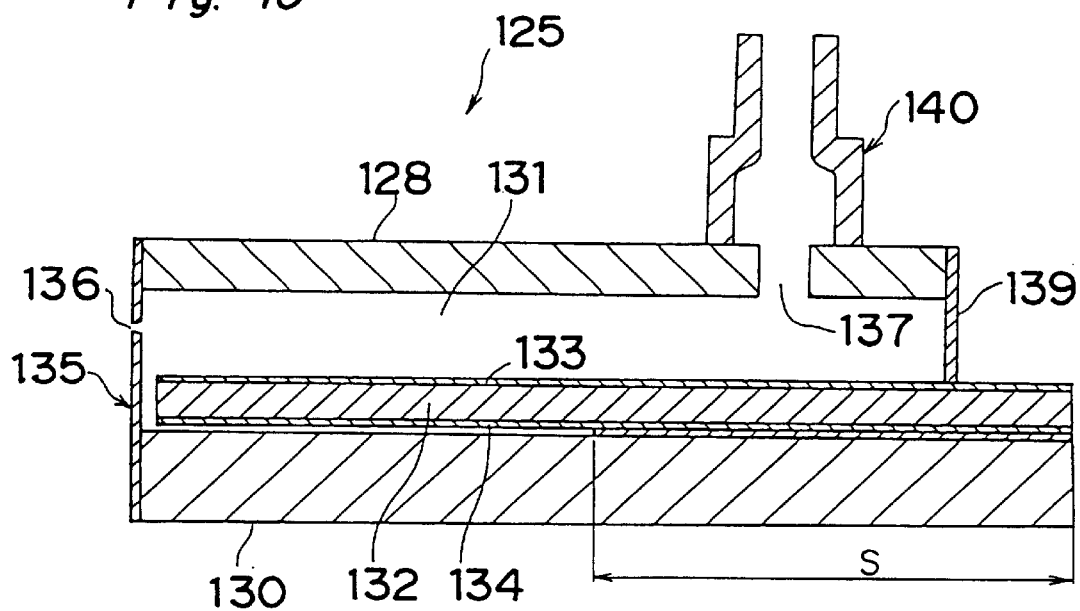
FIG. 10 is a longitudinal sectional view of the electro-mechanical transducer of the first embodiment.
Figure 11A:
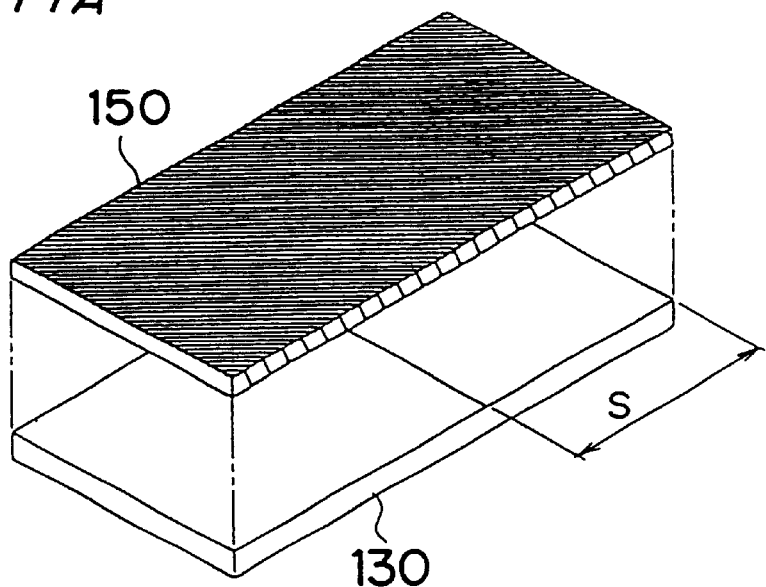
FIGS. 11A–11C shows a process for manufacturing a second plate and piezo-electric members in the electro-mechanical transducer of the first embodiment.
Figure 11B:
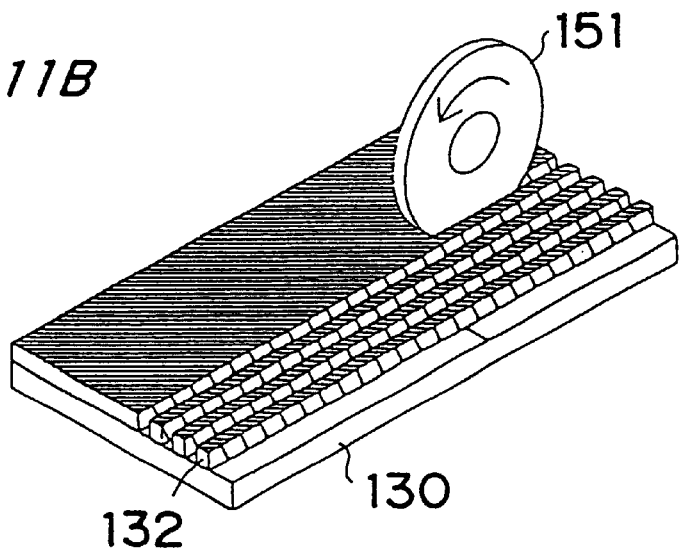
Figure 11C:
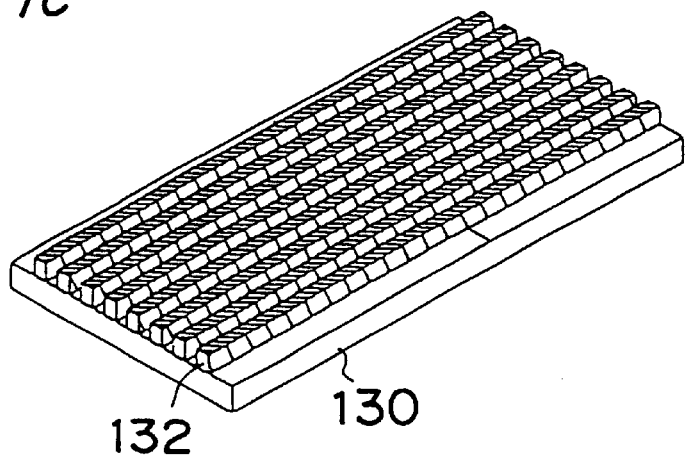

FIG. 8 shows the ink jet head 123. This Head 123 includes a base plate 124 on which an ink ejector 125, a terminal plate 126, and a connector 127 are arranged sequentially from one end of the plate 124. As best shown in FIGS. 9 and 10, the ink ejector 125 has a first plate 128 made of non-piezo-electric material such as aluminum. The first plate 128 has a plurality of slots 129. Each slot 129 extends parallel in a longitudinal direction of the plate 128 leaving specific separation from neighboring slots. Also, each slot 129 has a predetermined width. The ink ejector 125 further includes a second plate 130, which is attached to the surface of the first plate 128 so as to cover the slots 129 to define corresponding ink chambers 131, respectively.

Mounted on the second plate 130 are a plurality of piezo-electric members 132 extending parallel in a longitudinal direction of plate 130. The piezo-electric member 132 is made of, for example, lead zuconate titanate (PZT) piezo-electric material and preferably has a rectangular cross-section. The piezo-electric members 132 are arranged at equal intervals as the slots 129. Therefore, upon assembling the first and second plates 128 and 130 into an integrated unit, each piezo-electric member 132 is accommodated in and along the slot 129 leaving specific spaces from either side walls of the slot 129. Each piezo-electric member 132 has an individual electrode 133 on one surface and a common electrode 134 on the other surface. Also, each piezo-electric member 132 is polarized in a direction indicated by an arrow B, which is identical to the direction along which an electronic field will be formed when biasing a voltage between the individual and common electrodes 133 and 134. As best shown in FIG. 10, the piezo-electric member 132 is bonded at its rear region, i.e., right hand side thereof, indicated by region S, to the second plate 130 by an electrically conductive adhesive so that the front region can bend. Therefore, upon application of a biasing voltage between the individual and common electrodes 133 and 134 to form the electronic field in the piezo-electric member 132, the front side portion of the piezo-electric member 132 will deform and bend, which energizes an ink (not shown) in the ink chamber 131.

Although, the front portion of the piezo-electric member 132 is spaced a gap apart from the second plate 130 by a gap in a region outside the region S, the gap can be eliminated by shaving off a rear surface of second plate 130 in region S to form a thin recess having a depth of approximately several microns (um) for positioning the adhesive therein.

The integrated unit of the first and second plates 128 and 130 has at its front end a nozzle plate 135 made of, for example, polyimide film of approximately 25–200 μm in thickness. This nozzle plate 135 has a plurality of nozzles 136 positioned in a line, each axis of the nozzles 136 being spaced the same distance as that of ink chambers 131 from each other. Suitably the distance is, for example, about 42.3–254 μm where a pixel density is from 600–100 dpi.

The first plate 128 has at its rear portion an opening 137 which extends in the transverse direction to cross the ink chambers 131. Either side of this opening 137 is closed by a side plate 138 as best shown in FIG. 8. Further, rear end openings of the ink chambers 131 are closed by a back plate 139. Furthermore, the first plate 128 has thereon a manifold 140 which communicates through the opening 137 to the ink chambers 131 for supplying ink into the chamber 131.

As shown in FIG. 8, each piezo-electric member 132 is extended out beyond the back plate 139 from the ink chamber 131. The individual electrode 133 is connected through a conductive member 141, the drive IC 142, a conductive member 143, and a connector 127 to the controller 112 (see FIG. 7). The common electrodes 134 are connected each other through the electrically conductive adhesive which bonds the piezo-electric member 132 to second plate 130. This conductive adhesive is further connected to an electrically conductive member 144. Further, the member 144 is connected to a conductive member 145 by wire-bonding technique, then to a connector 127.

Referring to FIGS. 11 through 15, a process for manufacturing the ink jet head 125 will be described below. FIGS. 11A–11C shows a process for making the piezo-electric members 132 on the second plate 130. In this process, first a rectangular plate 150 of PZT is processed to form electrode layers of about 10–0.1 μm in thickness, on both sides thereof, by an electroless plating or sputtering. Advantageously, Au/Ni is preferably used for the electroless plating while Au/Ni or Au/Cr is used for sputtering. Next, the PZT plate 150 is placed on the second plate 130 preferably having the same size as PZT plate 150. These two plates are bonded each other by applying adhesive in a specific region indicated by the region S. Then, the PZT plate is cut at equal intervals into a folk-like configuration using a dicing saw 151 so that a plurality of mutually spaced piezo-electric members 132 and slots therebetween are formed side by side. Last, an entire surface of the piezo-electric member 132 is applied with a specific resin such as polyimide and then heated at 180° C. for about an hour to form a protection layer. This protection layer prevents moisture in the atmosphere from penetrating into the piezo-electric member to degrade performance. Accordingly, the piezo-electric member keeps its original deformation rate even though it is exposed to moisture. Note that this process can be eliminated if the piezo-electric member is made of another piezo-electric material having greater resistance to moisture.

Figure 12A:
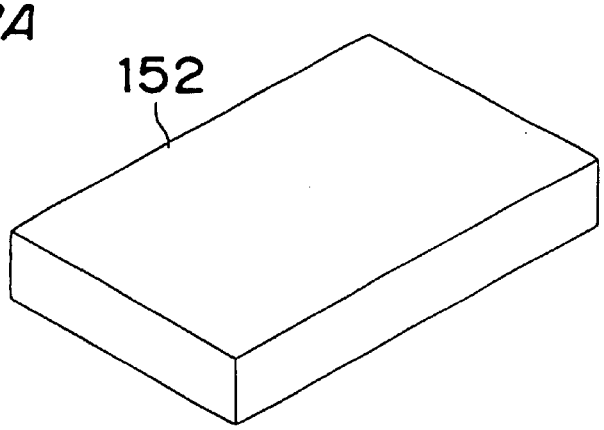
FIGS. 12A–12C show a process for manufacturing a first plate in the electro-mechanical transducer of the first embodiment.
Figure 12B:
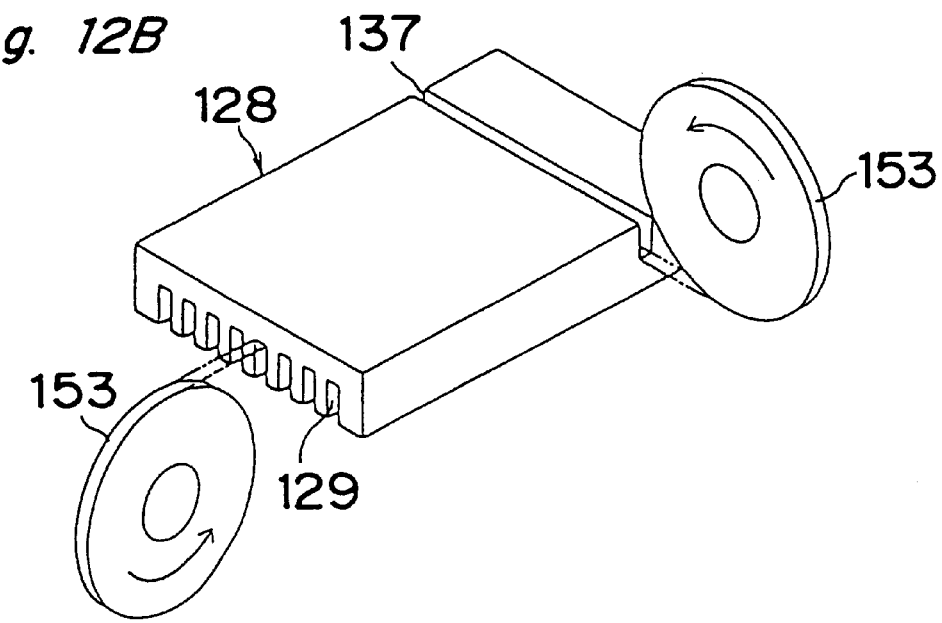
Figure 12C:
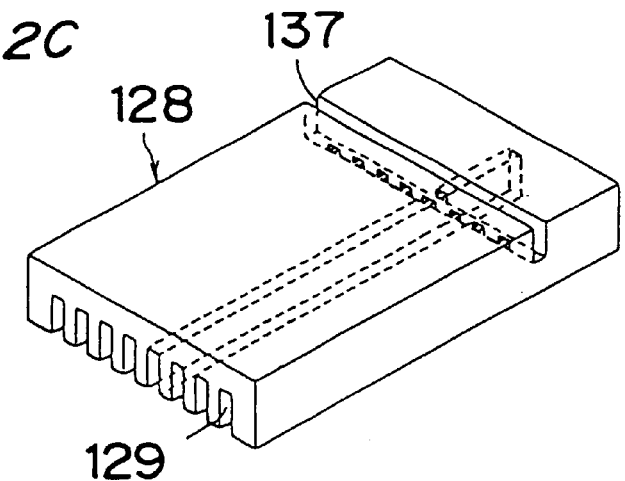

The first plate 128 is manufactured as shown in FIGS. 12A–12C. Plate 128 is made from a rectangular plate 152 of non-piezo-electric material, for example, aluminum, or ceramic. The rectangular plate 152 is first cut to form grooves on one side by a dicing saw 153 so that a plurality of parallel slots 129 are formed at the same interval as that of piezo-electric members 132 on the second plate 130. Each slot 129 has a width greater than that of piezo-electric member 132 so that piezo-electric member 132 can be inserted therein. On the opposite side of plate 152 is formed a slot or opening 137 which runs in the transverse direction so that this opening 137 communicates with each of slots 129.

Figure 13A:
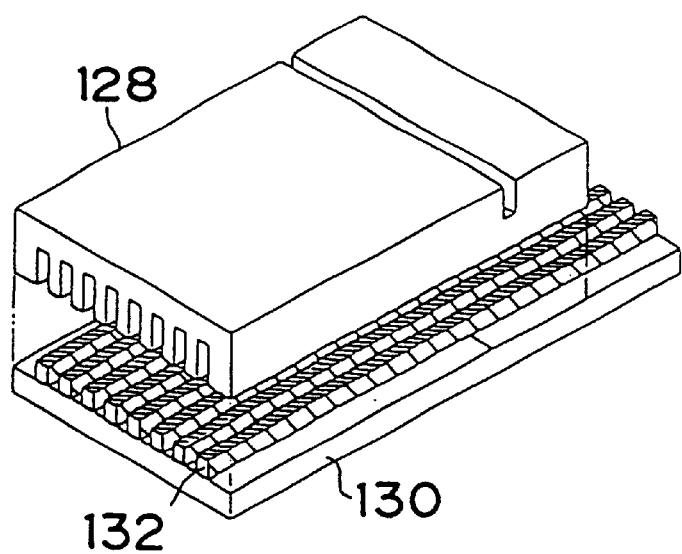
FIGS. 13A–13C show a process for assembling the electro-mechanical transducer of the first embodiment.
Figure 13B:
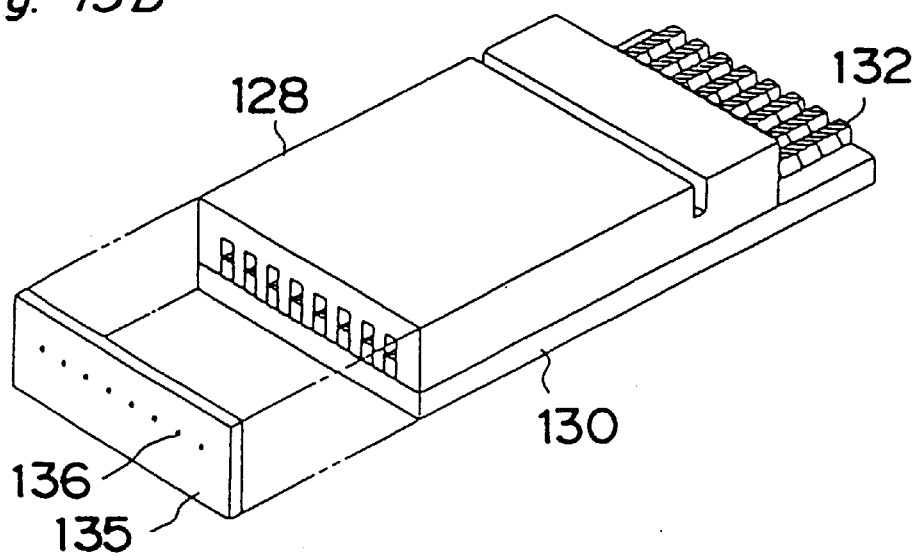
Figure 13C:
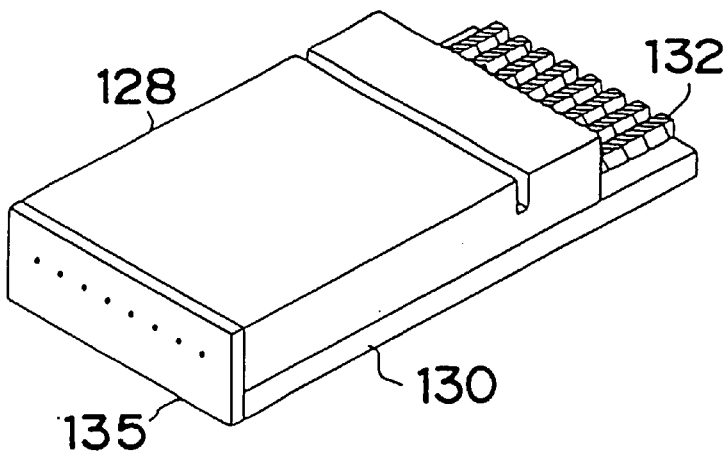

As shown in FIGS. 13A–13C, these plates 128 and 130 thus manufactured are assembled and bonded each other while positioning each piezo-electric member 132 in the corresponding slot 129. Further, the nozzle plate 135 is bonded to the front end of the integrated plates, with each of the nozzles 136 being positioned at the center of the corresponding ink chamber 131.

Figure 14A:
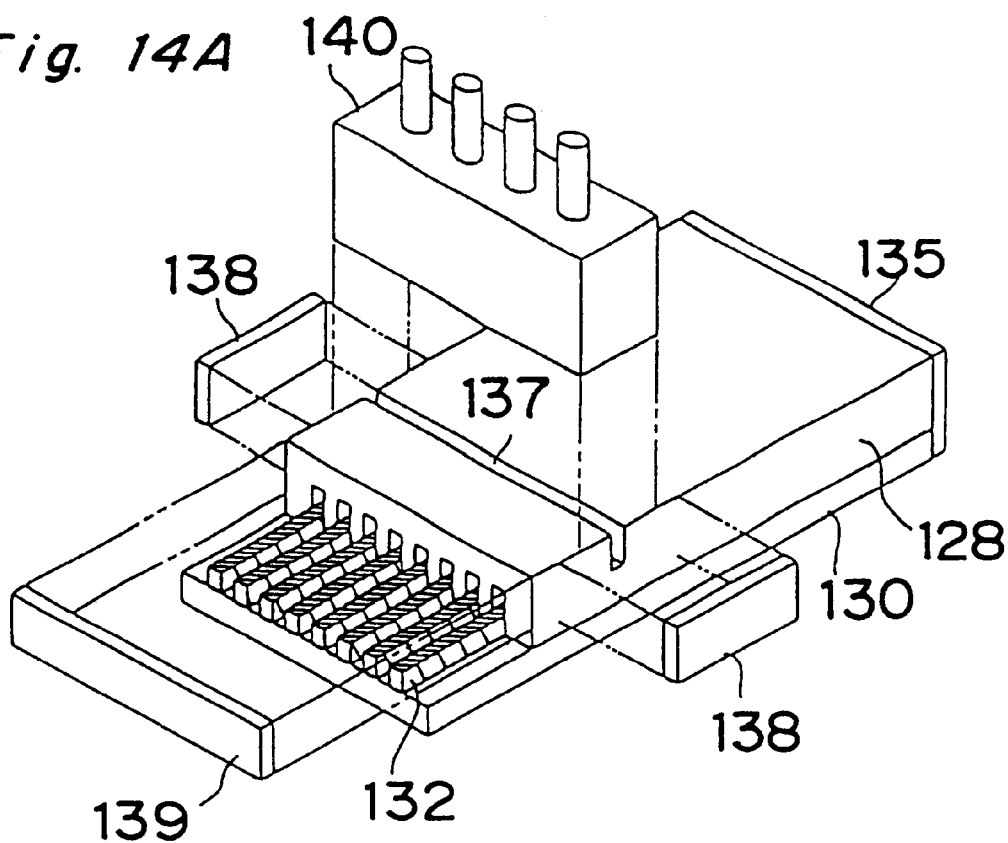
FIGS. 14–14B show a process for assembling the electro-mechanical transducer of the first embodiment.
Figure 14B:
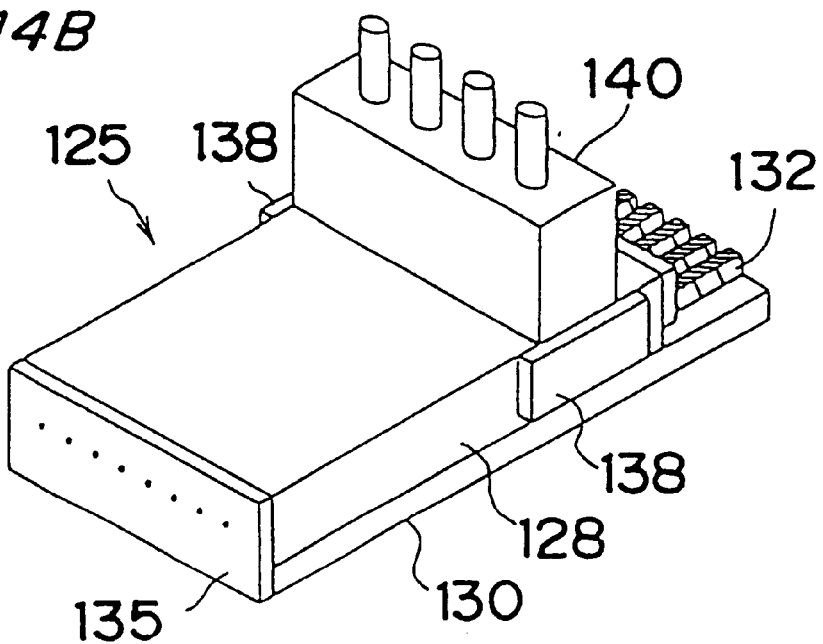

Further, as best shown in FIGS. 14A and 14B, the manifold 140 is attached on the first plate 128 to cover the opening 137, and then the side plates 138 are attached on both sides of first plate 128 to enclose the opening 137. Still further, the back plate 139 is bonded to the rear end of the integrated plates to enclose the ink chambers 131.

Figure 15:
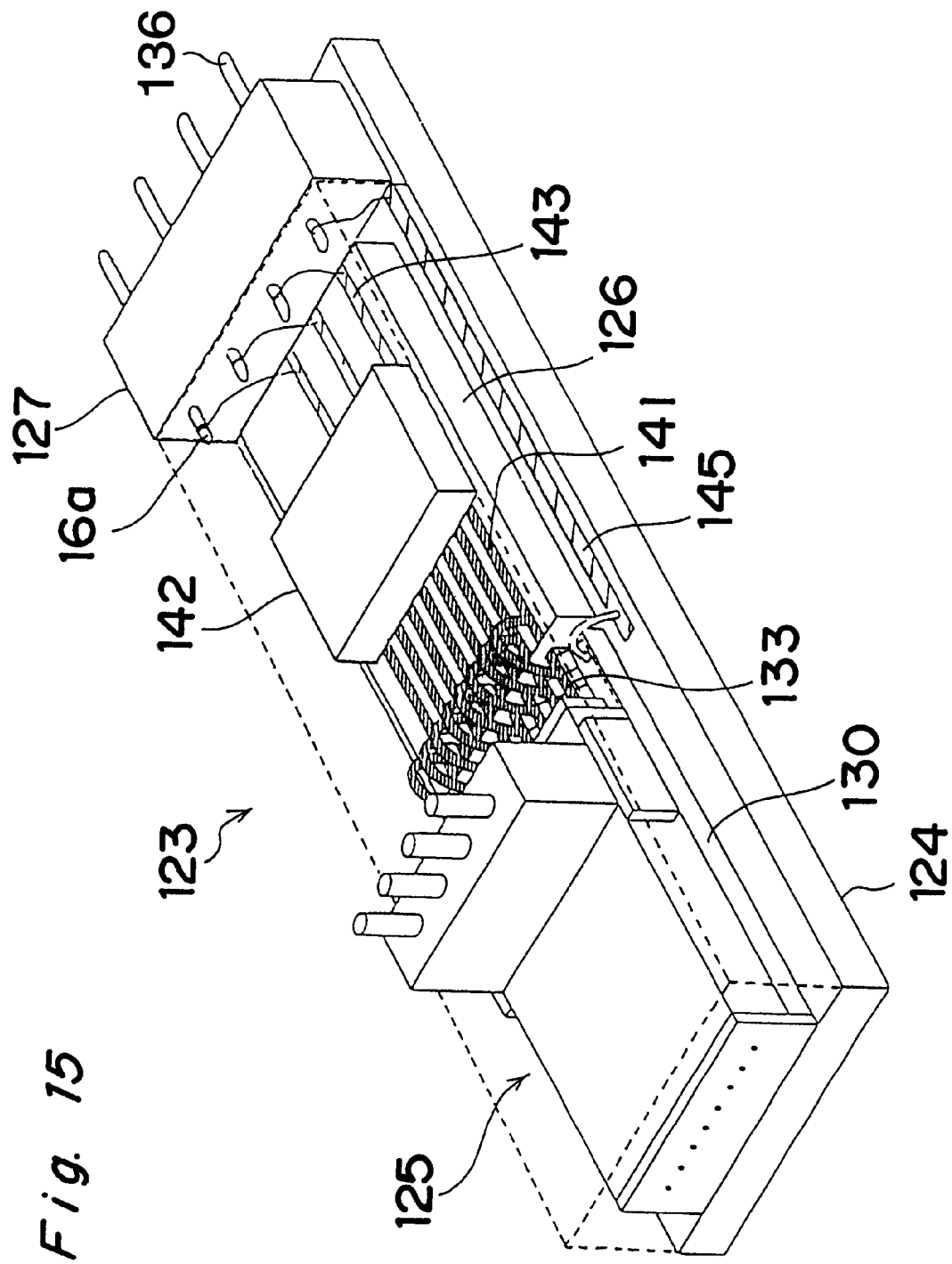
FIG. 15 is a perspective view of the ink jet head which includes the electro-mechanical transducer of the first embodiment.

Furthermore, as shown in FIG. 15, the ink ejector 125, the terminal plate 126 having thereon the drive IC 142 and the conductive members 141 and 143, the connector 127 are bonded on the base plate 124 having conductive member 145. Then the individual electrode 133 of piezo-electric member 132 is connected to the corresponding conductive members 141 while the conductive adhesive extended from the common electrode 134 is connected to the conductive member 145. The conductive members 141 are connected through the drive IC 142 to the corresponding terminals in the connector 127 while the conductive member 145 is connected to the associated terminal in the connector 127. Finally, resin molding is provided over the base plate 124 so that the elements on the base plate 124 are covered except nozzles 136.

Figure 18:
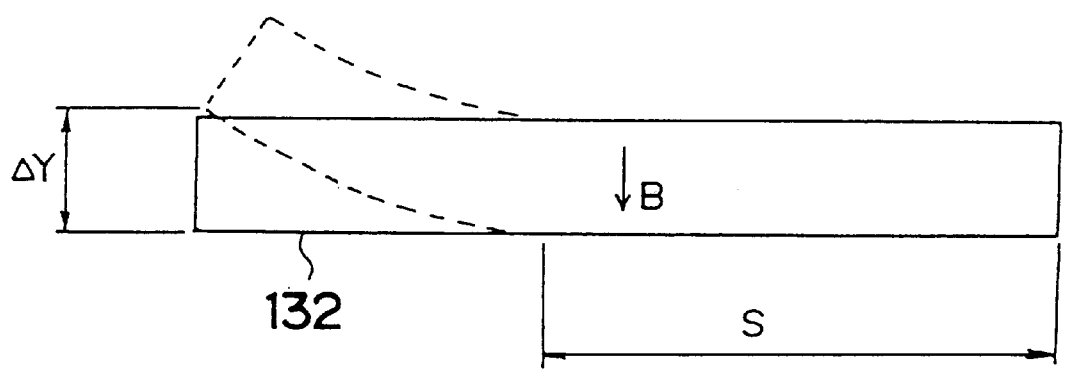
FIG. 18 shows a deformation of the piezo-electric member which is bonded at its entire longitudinal surface to a base plate.
Figure 19:
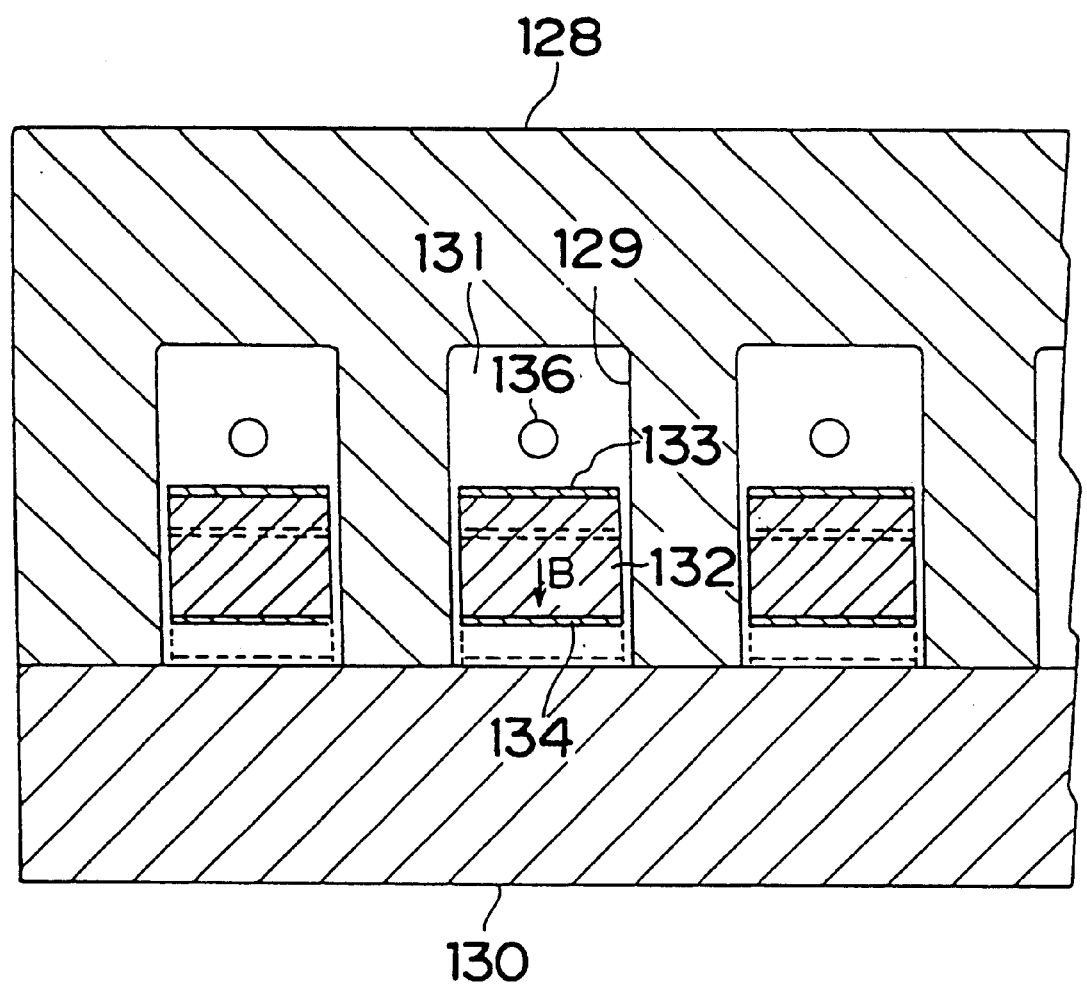
FIG. 19 is a transverse sectional view of the electro-mechanical transducer of the first embodiment in which the deformation of the piezo-electric member is illustrated.

A discussion will be made next to an ejection of ink. The ink is supplied from the ink supply 117 through the manifold 140 into the ink chambers 131. Upon applying a pulse voltage (see FIG. 16A) between the individual and common electrodes 133 and 134 according to an image signal, an electric field is generated in the direction parallel to the polarized direction indicated by the arrow B in FIG. 9. As a result, because the piezo-electric member 132 is bonded to the second plate 130 only in the region S, the un-bonded free portion of the piezo-electric member 132 deforms and bends upward in a instance(see FIG. 18). Displacement of the piezo-electric member 132 above the second plate 130 increase gradually along the length of piezo-electric member 132 with a maximum displacement at the distal end of the piezo-electric member 132.

Figure 17:
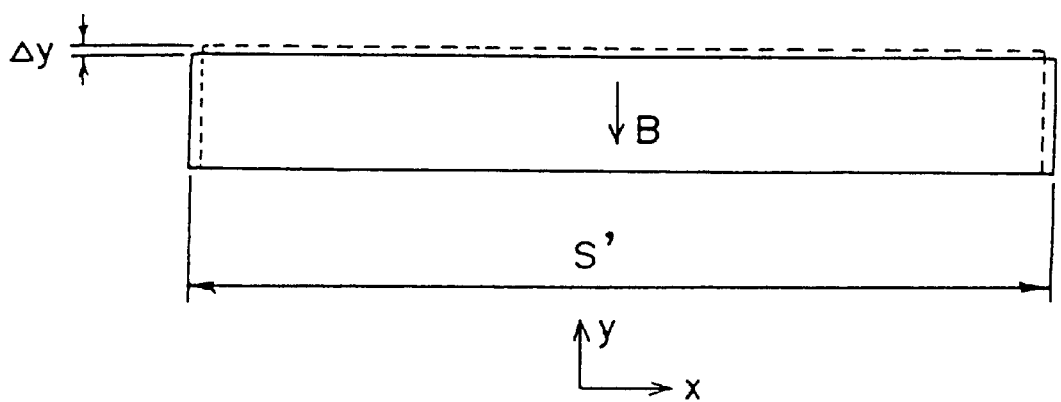
FIG. 17 shows a deformation of the piezo-electric member which is bonded at its entire longitudinal surfaces to a base plate.

Note that, as shown in FIG. 17, if a piezo-electric member is bonded to the plate in its entire longitudinal length S', upon biasing to form an electric field in the direction indicated by an arrow B, the piezo-electric member contracts in the longitudinal direction indicated by an arrow X while it expands in the transverse direction indicated by an arrow Y.

Tests were made to compare the displacements of the piezo-electric member bonded to the plate only in the region S (see FIG. 18) and the piezo-electric member bonded to the plate in the entire region S' thereof (see FIG. 17). The results showed that the displacement of the piezo-electric member of the present invention ( FIG. 18) is 100 times larger than that of piezo-electric member of FIG. 17.

This deformation of piezo-electric member pressurizes the ink in ink chamber 131 so that an ink droplet is ejected from the ink chamber 131 through the nozzle 136. This droplet deposits on the sheet moving past in front of the nozzle.

Upon turning off the biasing voltage between the individual and common electrodes 133 and 134 to eliminate the electric field, the piezo-electric member 132 moves back to its original position. At this time, a negative pressure is generated in the ink chamber 131, which permits ink to enter via manifold 140 to prepare for next ink ejection.

Figure 16A:
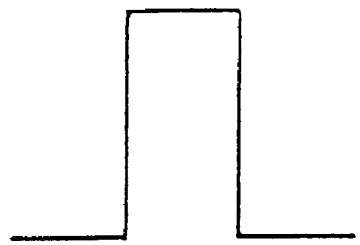
FIGS. 16A–16D illustrates pulse forms to be applied to electrodes in the electro-mechanical transducer.
Figure 16B:
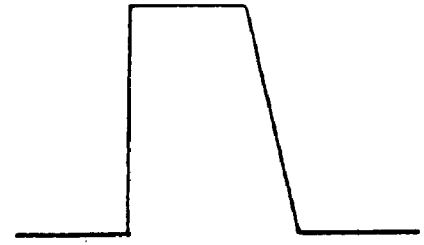

Note that a pulse form as shown in FIG. 16B is preferably used rather than that shown in FIG. 16A. The reason is, if the biasing voltage is decreased instantly, the piezo-electric member returns to its original position very quickly. This introduces a negative pressure in the ink which sucks in through the nozzle. Further, once air is aspirated, little or no ink can be subsequently ejected from the nozzle because the pressure in the ink generated by the deformation of piezo-electric member is absorbed in the aspirated air bubbles.

Therefore, to prevent aspiration of air, it is desirable to use a pulse form as shown in FIG. 16B, in which the voltage drops gradually to zero as fast as possible to the extent that no air is sucked into the chamber.

Ejection of the ink is carried out at the same time for each ink chamber 131 in response to the image signals, thereby one line of image is reproduced. This is done repeatedly in synchronism with the movement of the sheet, thereby a whole image is reproduced on the recording sheet.

In the ink jet head 125 above described, the piezo-electric member 131 is bonded to second plate 130 only along the restricted region S, not along entire length. Accordingly the vibration of biased piezo-electric member 132 is not transmitted to the neighboring piezo-electric members through plate 130. Therefore no ink is energized or ejected from the neighboring ink chamber in which the piezoelectric member is not biased. That is, no cross-talk from chamber to chamber occurs so that the ink droplet is ejected only from the ink chamber in which the piezo-electric member is biased. Consequently, a quality of the reproduced image is improved.

Furthermore, because the piezoelectric member is bonded in a restricted region, the maximum displacement of the piezo-electric member is increased in proportion to the applied bias voltage. Therefore, a lower voltage can eject the same amount of ink with the same speed as that of prior art printers, which reduces costs of the driver. Also, a size of the ink droplet can be adjusted by controlling the voltage applied to the piezo-electric member, thereby controlling the displacement thereof, which improves the reproductivity of half-tone color images.

The length of the bonded region of the piezo-electric member should be shorter to the extent that no cross-talk from chamber to chamber occurs, which increases an energy derived from the deformation of the piezo-electric member. This achieves a stable ejection of ink droplets and improves high frequency response allowing increased printing speed.

To prevent the cross-talk from chamber to chamber while maintaining stable bonding of the piezo-electric member to the plate, the length of the bonded region S should be selected as follows:

$$0.21L \leq S \leq 0.91L$$

wherein L represents the entire length of the piezo-electric member. These limits are determined as follows. If the length of the bonded region S is less than 0.21L, the piezo-electric member is so weak in strength that it is easy to be damaged during its manufacturing or construction. On the other hand, if the length of the bonded region S is more than 0.91L, much of the vibration of the piezo-electric member is transmitted to neighboring piezo-electric members so that cross-talk from chamber to chamber occurs. Most advantageously, the length is determined as follows:

$$0.31L \leq S \leq 0.71L$$

Figure 16C:
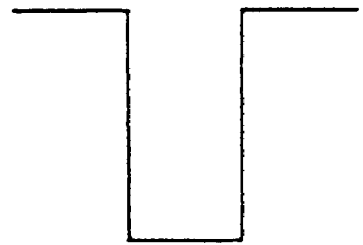
Figure 16D:
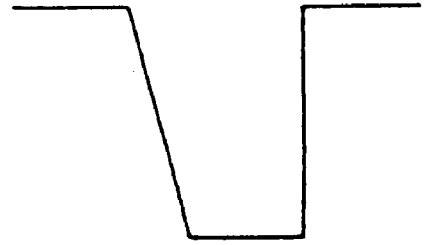

In the previous embodiment, the ink is ejected from the chamber and supplied by turning on and off the voltage. It is possible, however, that, by turning off and on the voltage, the ink could be supplied into the chamber and is ejected therefrom by using pulse forms illustrated in FIGS. 16C or 16D. When using these pulse forms, by turning off the voltage the piezo-electric member returns its original position from its deformed position so that the ink is supplied into the chamber, while by turning on the voltage the piezo-electric member moves back to the bent position so that the ink is ejected from the chamber. To carry out this, it is desirable to keep a small gap of about several microns between the piezo-electric member and the lower plate. This can be achieved by increasing the thickness of the adhesive used for bonding the piezo-electric member to the plate. The pulse form shown in FIG. 16D having a gradual voltage drop is preferably used rather than that shown in FIG. 16C for the reason described above.

Figure 20A:
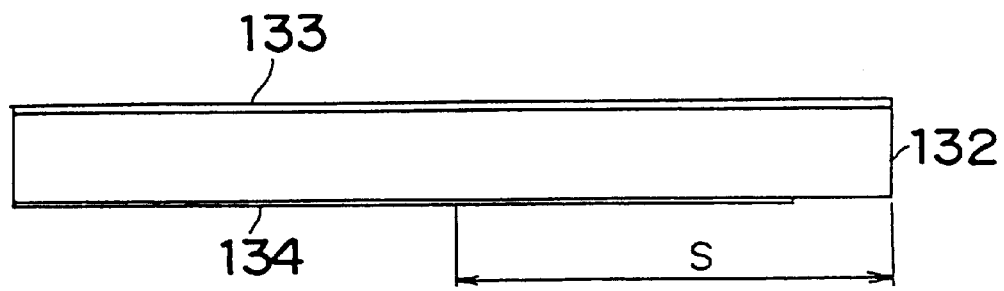
FIGS. 20A–20C show modifications of the piezo-electric members, in each of which an individual electrode has a different length from a common electrode.
Figure 20B:
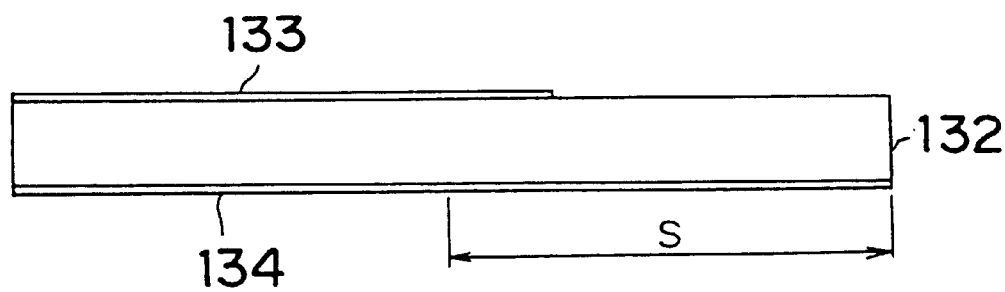
Figure 20C:
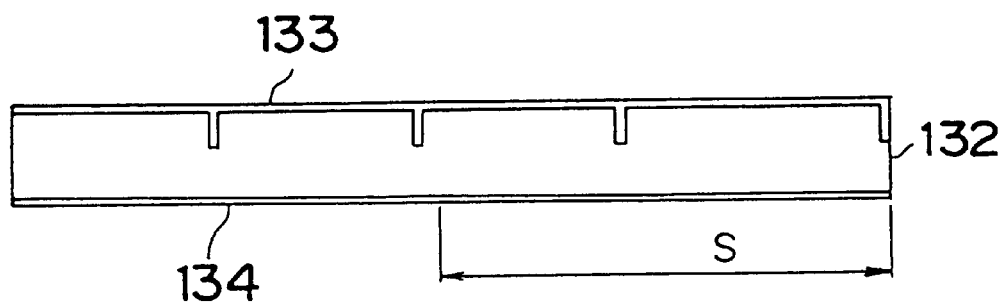

Although the piezo-electric member in the previous embodiment comprises individual and common electrodes having equal length and extending for the entire longitudinal length of the piezo-electric member, they may also have different lengths as shown in FIG. 20A and 20B. Also, as shown in FIG. 20C, the piezo-electric member may have a plurality of slits extending transverse to the length, in which the individual electrode is provided so as to make the overall length of the individual electrode longer than that of the common electrode.

Using the piezo-electric member shown in FIG. 17 and (referred to hereinafter as "type D") the piezo-electric members shown in FIGS. 20A, 20B and 20C, (referred to hereinafter as types A, B, and C, respectively), experiments were made to estimate forces generated in the piezo-electric member and displacements at the distal ends thereof. In the experiment with respect to the force, a movement of the piezo-electric member was restricted to 1 $\mu$m by a restriction member and a force applied to the restriction member was measured. In the experiment with respect to the displacement, a 50 volt bias was applied to each piezo-electric member, and the displacement of the distal end was measured. The results are shown in Table 1.

TABLE 1

| Piezo-electric MEMBER | FORCE (gf) | DISPLACEMENT ($\mu$m) |
| --- | --- | --- |
| TYPE D | 86.5 | 1.0 |
| TYPE A | 240.0 | 2.8 |
| TYPE B | 693.6 | 8.0 |
| TYPE C | 1020.0 | 11.8 |

As can be seen from the table, the piezo-electric members of types A, B, and C provided greater force and displacement than that of type D, which means that it is desirable to employ one of these types A, B, or C rather than type D in order to minimize the bias voltage and/or increase the efficiency of the ink ejection.

Figure 21:
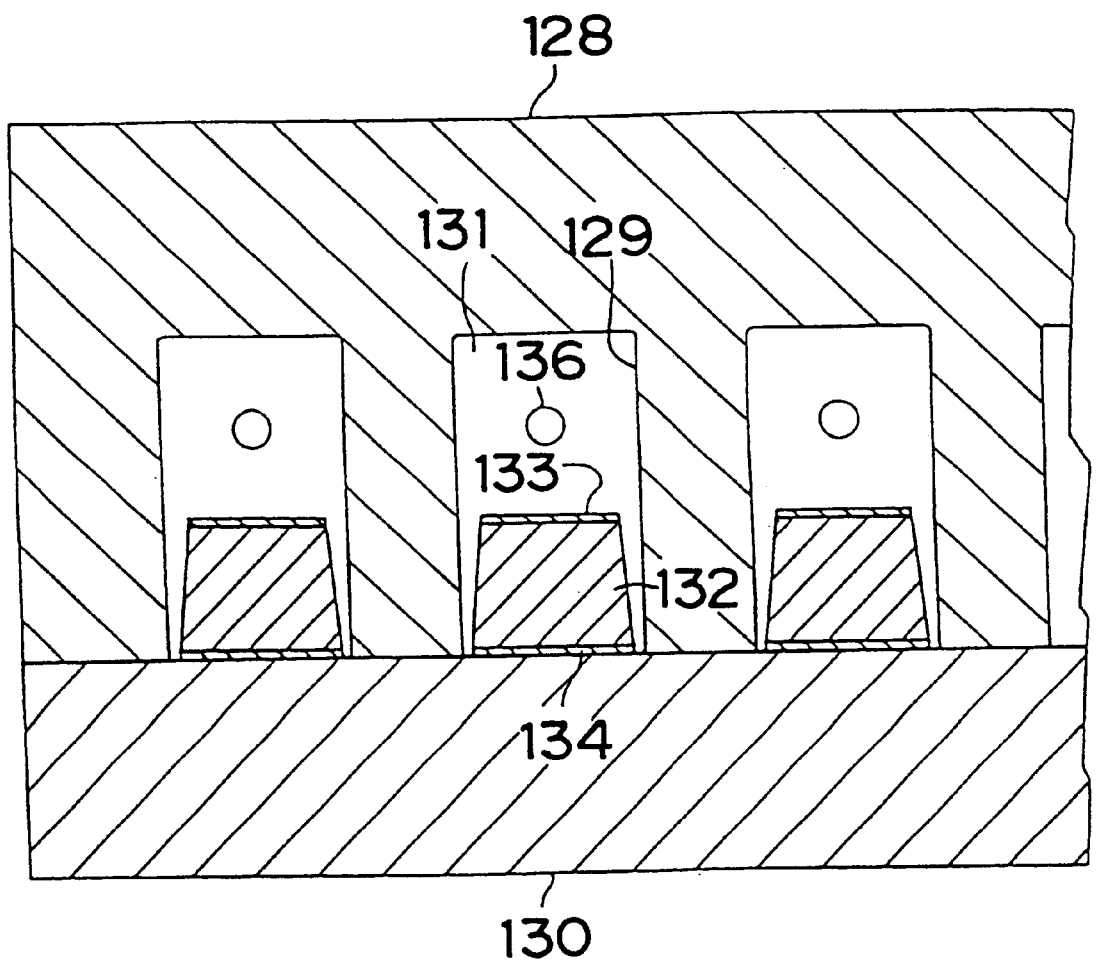
FIG. 21 shows another modification of the piezo-electric member which has a trapezoid cross-section.

It should be noted that since the dicing process piezo-electric members may also have a trapezoidal cross-section as shown in FIG. 21. The trapezoidal shape facilitates assembly of the upper plate and the lower plate.

Figure 22:
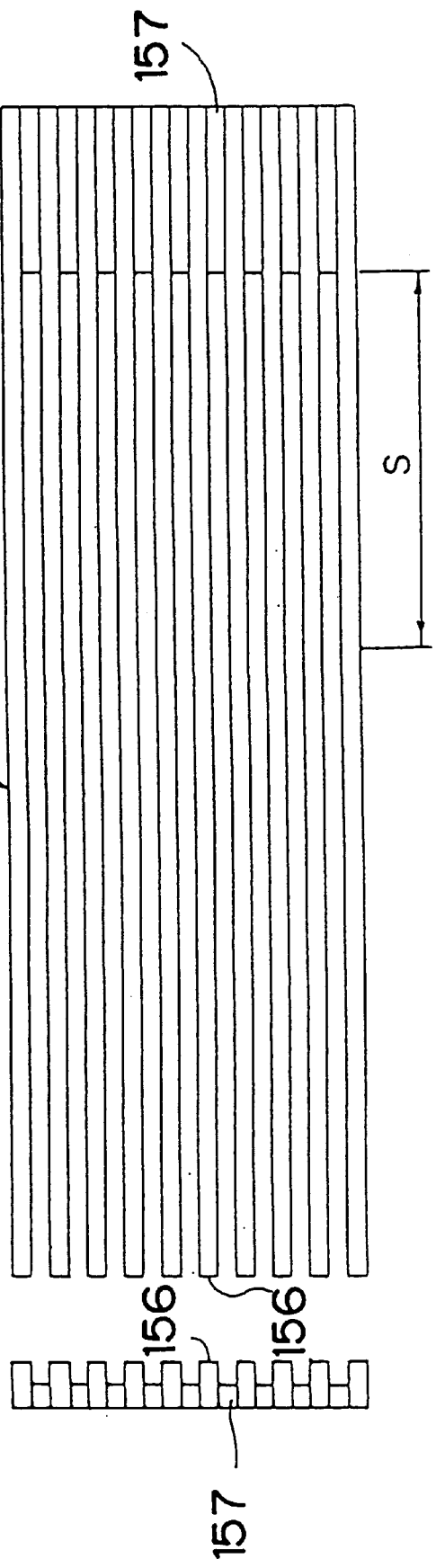
FIGS. 22A–22B show an integrated piezo-electric unit in the form of fork.

The piezo-electric members may also be integrated into a unit as shown in FIGS. 22A and 22B. This unit 155, in the form of fork, ha s a base 157 from which each piezo-electric member extend parallel. Also, the base 157 is preferably designed to be lower than piezo-electric members 156 as shown in FIG. 22B. This unit is manufactured by dicing. In dicing, the dicing saw moves from one end of the original plate for forming each piezo-electric member and, once it reaches a base region, the dicing moves up with keeping its lower end within the plate, and then continues the cut toward the other end of the original plate so that grooves on the base 157 are formed.

According to this embodiment, each piezo-electric member has greater structural strength, which increases both durability and reliability of the ink jet head. Also, since the common electrodes can be extended over the base portion, the connection between the common electrode and the conductive line on the base plate will be readily done by wire-bonding or solder. Therefore, it is not necessary to connect each common electrodes to the conductive line, which facilitates assembly of the head.

Figure 23:
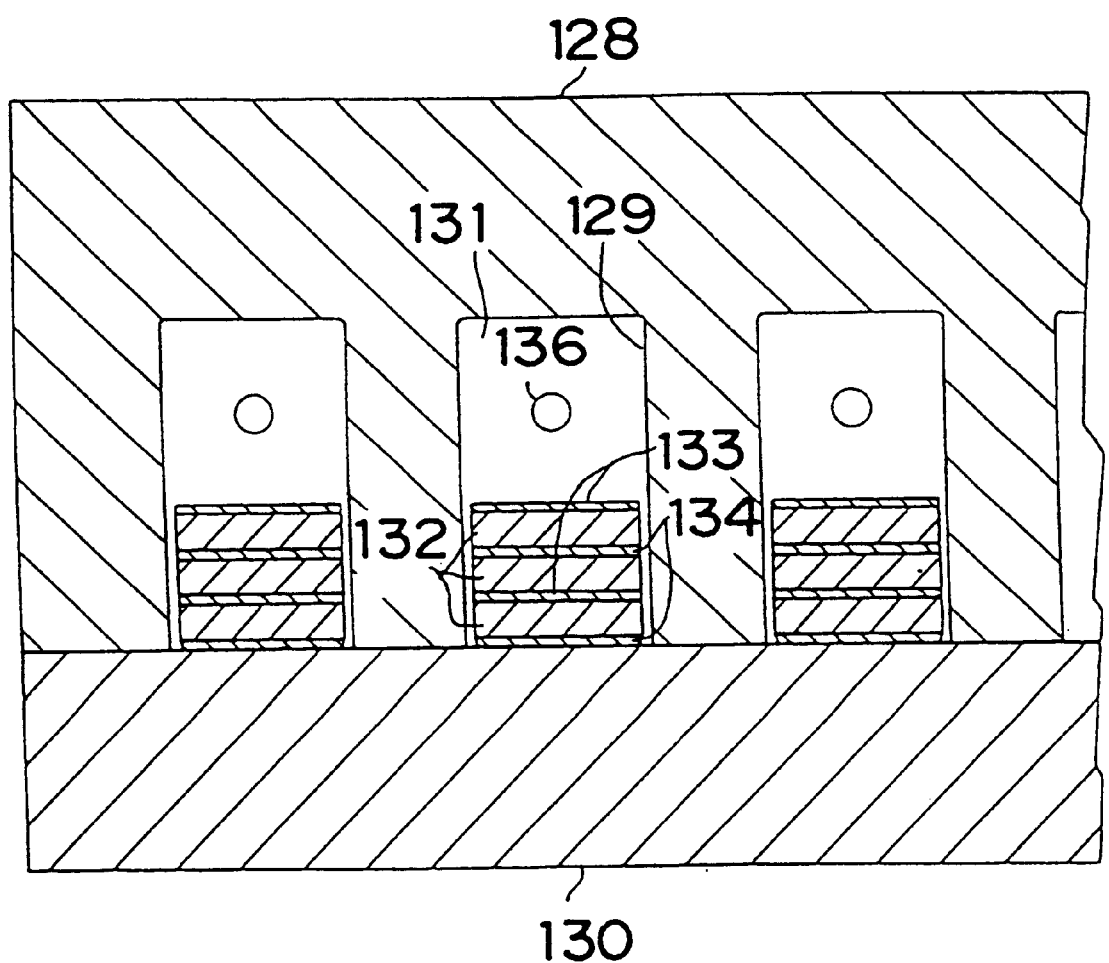
FIG. 23 shows another modification of the piezo-electric member in which a plurality of piezo-electric layers are superimposed.

The piezo-electric member may include a plurality of piezo-electric layers and electrode layers as shown in FIG. 23. In this embodiment, the piezo-electric member 132 has three, i.e., upper, middle, and lower layers. An additional individual electrode 133 is positioned between the upper and middle layers, while an additional common electrode is positioned between the middle and lower layers. With this piezo-electric structure, the displacement at the distal end of the piezo-electric member further increased depending upon the number of the layers, which thereby decreases power consumption and the cost of the driver IC.

B. SECOND EMBODIMENT

Figure 24:
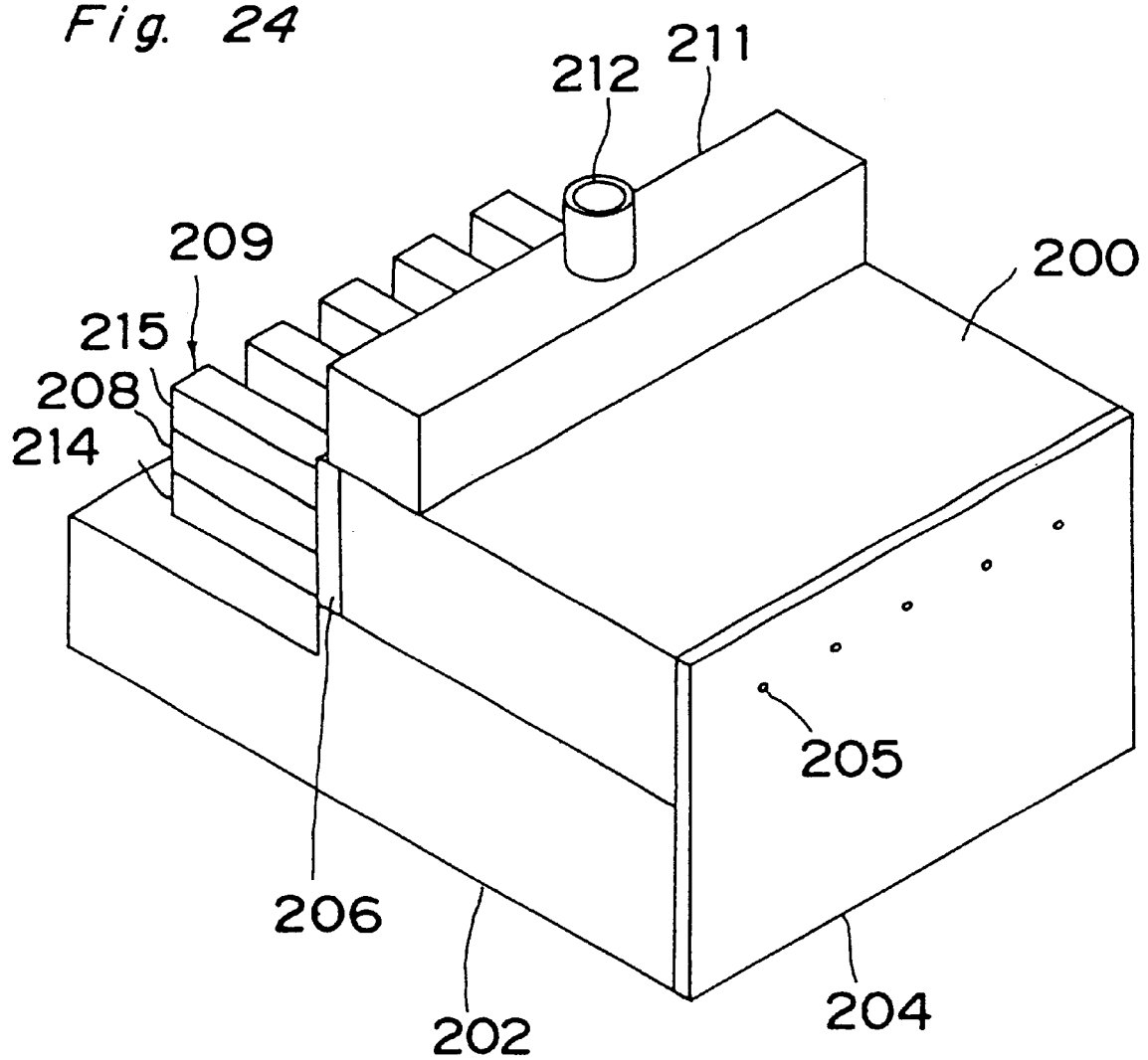
FIG. 24 is a perspective view of an electro-mechanical transducer of the second embodiment.
Figure 25:
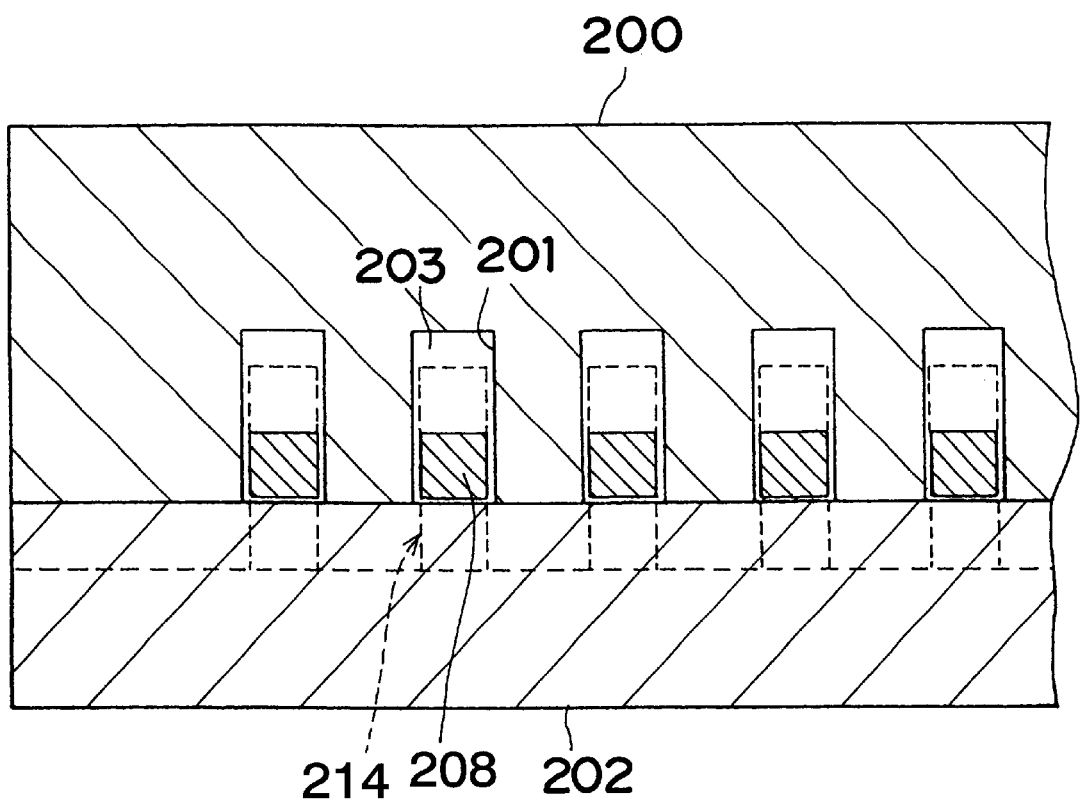
FIG. 25 is a transverse sectional view of the electro-mechanical transducer of the second embodiment.
Figure 26:
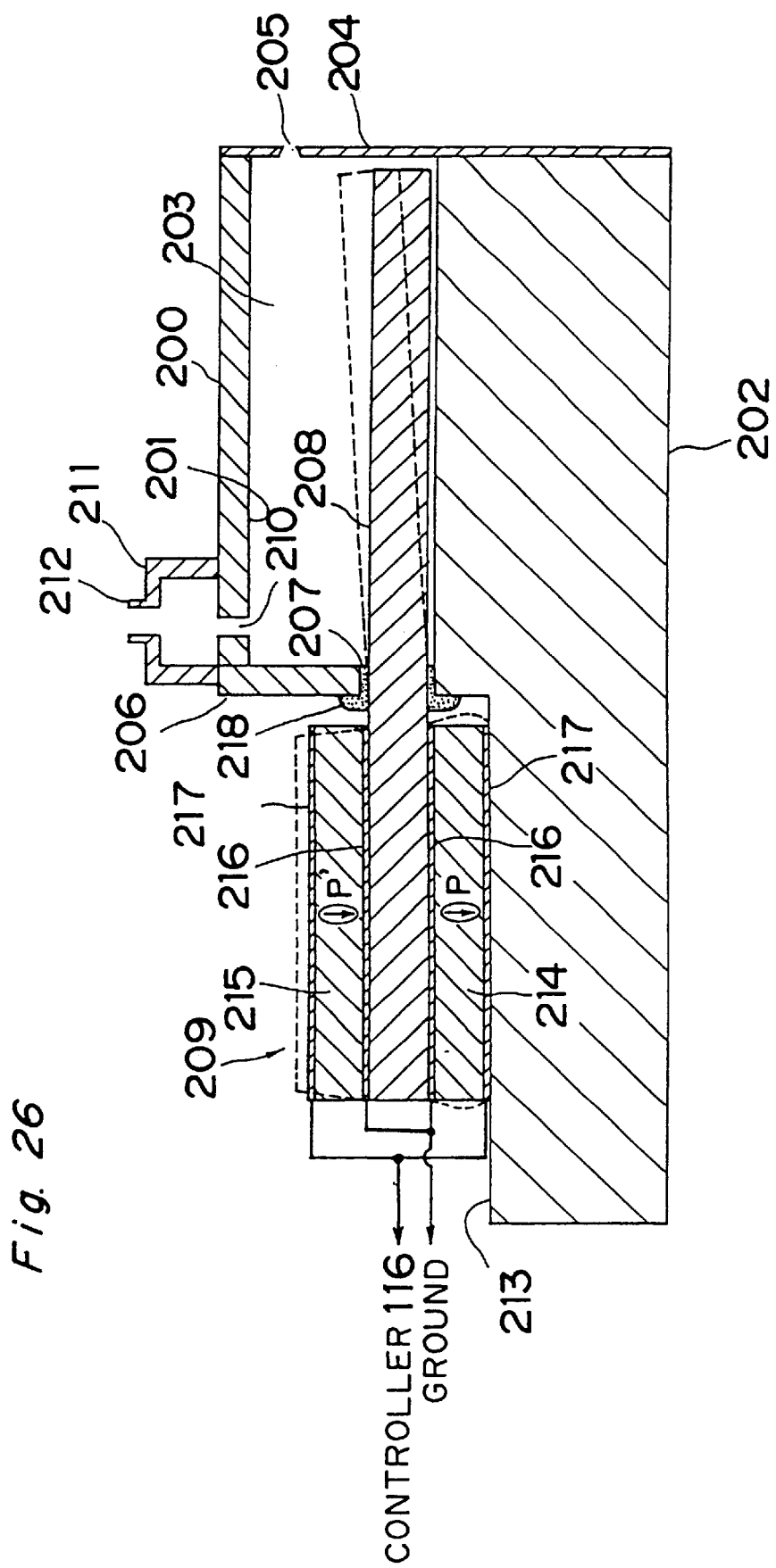
FIG. 26 is a longitudinal sectional view of the electro-mechanical transducer of the second embodiment.

A second embodiment of an ink jet head of the present invention will be described below. As shown in FIGS. 24, 25, and 26, an ink jet head of this embodiment has an first plate 200 made of non-piezo-electric material such as aluminum. The first plate 200 has a plurality of slots 201 made by, for example, dicing as previously described. Each slot 201, which has a predetermined width, extends parallel in a longitudinal direction of the plate 200 leaving specific spaces from neighboring slots. The ink jet head 200 further includes a second plate 202, which is adhered to the surface of the first plate 200 so as to cover the slots 201 to define corresponding ink chambers 203. Preferably, the adherence between the first and second plates may be accomplished by, for example, bolts and nuts or by resin molding.

Referring to FIG. 26, the front side of the integrated plates 200 and 202, i.e., right hand side in FIG. 26, has a nozzle plate 204 made of polyimide film, having a thickness of about 25–200 $\mu$m. The nozzle plate 204 has defined therein apertures, i.e., nozzles 205, each of which has the same spacing between them as the ink chamber 23. Normally this space is, for example, about 42.3–254 $\mu$m which corresponds to a pixel density of 600–100 dpi. It is preferable that the nozzles are formed using eximicer laser. The rear side of the integrated plates 200 and 202, i.e., left hand side in FIG. 26, has a back plate 206. The back plate 206 has at its lower portion a plurality of mutually spaced cut-outs 207 corresponding to the ink chambers 203. Each cut-out 207 is sized so that each actuator 208 of driver 209, described in detail below, can be arranged therethrough without difficulty. The first plate 200 also has defined therein an opening or ink inlet 210 at the opposite side remote from the ink chambers 203. This inlet 210 runs in the transverse direction of the first plate 200 so that it communicates with each of the ink chambers 203. Further, the ink inlet 210 is connected to a hollow manifold 211 having ink tube 212 through which an ink is supplied from the ink supply to the ink chambers 203.

Referring to FIGS. 24 and 26, the second plate 202 has at its one side a recess 213 which is lower than an adjacent region confronting to the ink chambers 203. On the recess 213 a plurality of drivers 209 are positioned corresponding to the ink chambers 203. Each driver 209 generally includes the actuator 208 which extends its front portion into the ink chamber 203 through the cut-out 207, and lower and upper, i.e., first and second, piezo-electric members 214 and 215 which cooperate each other to firmly hold the actuator 208.

In this embodiment, the actuator 208 always contacts the ink at its front portion, which can degrade its durability by a penetration of the ink into the actuator. Therefore, it is preferable that the actuator is made of material having ink resistance. Further, it is more preferable that the widths of the slot 201 and actuator 208 are so sized that spaces between confronting side walls of slot 201 and actuator 208 is less than 30 µm. This keeps the ink from moving into the spaces which possibly decreases efficiencies of ink ejection.

Each of the first and second piezo-electric members 214 and 215 has a common electrode 216 on the surface confronting the actuator 208 and an individual electrodes 217 on the opposite surface. The common electrodes 216 are grounded, while the individual electrodes 217 are electrically connected to the controller 116 (see FIG. 7) via a driver IC, respectively. This permits each pair of piezo-electric members 214 and 215 to be provided with voltage in response to image signals.

Further, the first piezo-electric member 214 is electrically polarized in the direction indicated by arrow P which directs from the common electrode 216 to individual electrode 217 while the second piezo-electric member 215 is electrically polarized in the direction indicated by arrow P' which directs from the individual electrode 217 to common electrode 216.

Note that it is preferable that all the common electrodes are electrically connected to each other with an electrically conductive adhesive and then to the ground. Furthermore, where the electrically conductive adhesive is used for bonding the piezo-electric members to the actuator, the adhesive can be utilized as a common electrodes.

In this embodiment, although the driver 209 is bonded to the second plate 202 by the adhesive, alternatively be fixed on the second plate 202 by any other known means instead.

The driver 209 is preferably constructed by first holding an original plate of actuators 208 between two piezo-electric original plates, for example, PZT piezo-electric plates of the first and second piezo-electric members 214 and 215 and then cutting the integrated plates using, for example, a dicing saw such that each of the actuators 208 and piezo-electric members 214 and 215 has a column-like configuration of a rectangular cross-section. The common and individual electrodes 216 and 217, preferably having a thickness of 0.1–10 µm, are pre-formed on the original piezo-electric plates by an electroless plating or sputtering. Advantageously, Au/Ni is preferably used for the electroless plating while Au/Ni or Au/Cr is used for sputtering. To prevent humidity in the air from penetrating into the piezo-electric members which decreasing deformation thereof when being biased, the piezo-electric members 214 and 215 are advantageously covered with polyimide by a spin-coat method and then cured by heating for about an hour at 180° C. This process can be eliminated if the piezo-electric member is made of material that has a great resistance to humidity.

Openings existing between the cut-outs 207 in the back plate 206 and the actuators 208 are sealed by sealing member 218, e.g., fluoro-silicon rubber, to prevent ink in the ink chambers 203 from leaking therethrough. The sealing material is selected among elastic materials such that actuator 208 is capable of deforming freely at its portion in the ink chamber.

Figure 27A:
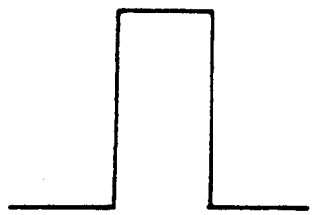
FIGS. 27A–27G illustrate pulse forms to be applied to electrodes in the electro-mechanical transducer of the second embodiment.

An ejection of ink from each ink jet head will be discussed in detail below. Ink is supplied from the ink supply 117 (See FIG. 7) to the ink tube 212, which in turn feeds the ink to each ink chamber 203 through ink inlet 210. When a positive pulse voltage, as shown in FIG. 27A, is applied between the first and second piezo-electric members 214 and 215 by the voltage biasing means, i.e., controller 116, an electric field directed from the individual electrode 217 to the common electrode 216 is formed, which causes the piezo-electric members 214 and 215 to deform and vibrate.

Note that the first piezo-electric member 214 is polarized in the direction from the common electrode 216 to the individual electrode 217 while the second piezo-electric member 215 is polarized in the direction from the individual electrode 217 to the common electrode 216. Accordingly, the piezo-electric members 214 and 215 deform in different directions. Especially, the first piezo-electric member 214, if it is not restricted to deform, expands in the longitudinal direction and contracts in the transverse direction. This member 214, however, is bonded at its sides to the base plate 202 and actuator 208, respectively, so that it deforms at the its both ends to expand as best shown in FIG. 26 by dotted lines. On the other hand, the second piezo-electric member 215, if it is not restricted to deform, contracts in the longitudinal direction and expands in the transverse direction. This member 215, however, is bonded at its one side to the actuator 208, which causes the member 215 to deform into a trapezoidal configuration shown in FIG. 26 by dotted lines.

The deformations of the first and second piezo-electric members 214 and 215 provide one surface of the actuator 208 confronting the first piezo-electric member 214 with a force which expands it and the other surface of the actuator 208 confronting the second piezo-electric member 215 with a force which contracts it. As a result, the free end portion of the actuator 208, extending in the ink chamber 203, is pivoted as shown in FIG. 26 by dotted lines in response to the pulse. As described above, since the sealing member 218 is made of elastic material, no restriction is provided with the actuator 208. The movement of the actuator 208 pressurizes the ink in the ink chamber 203, which causes an ink droplet to eject through the nozzle 205. The ink droplet is then deposited on the sheet moving past under the head.

Upon turning off the biasing voltage to the individual electrode 217, the electric field is eliminated. This permits the piezo-electric member 214 and 215 to return the original configuration. Upon returning to the original position, a negative pressure, i.e., suction, is generated in the ink chamber 203, which causes the ink to be supplied into the ink chamber 203 through the manifold 211 and ink inlet 210 in preparation for the next ink ejection.

Figure 27B:
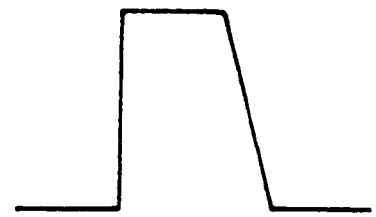

Note that a pulse form as shown in FIG. 27B is preferably used rather than that shown in FIG. 27A. The reasoning behind that is, if the biasing voltage is decreased instantly, the piezo-electric member returns to its original position very quickly. This introduces a negative pressure in the ink which sucks air into the ink chamber through the nozzle. Further, once air is aspirated, due to bubbles of the air, little or no ink can be ejected from the nozzle because the pressure in the ink generated by the deformation of piezo-electric member is absorbed by the air.

Therefore, to prevent this, it is desirable to use a pulse form as shown in FIG. 27B, in which the voltage drops gradually to zero as fast as possible to the extent that no air is aspirated into the ink.

Figure 27C:
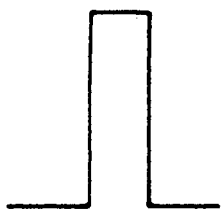

A volume or diameter of the ink droplet to be ejected can be changed by increasing or decreasing the width of the pulse which effects the resultant displacement of the actuator 208. This permits half-tone images to be reproduced. For example, using a pulse having a smaller width as shown in FIG. 27C rather than that shown in FIG. 27A causes the diameter of the ink droplet to be decreased.

Figure 27D:
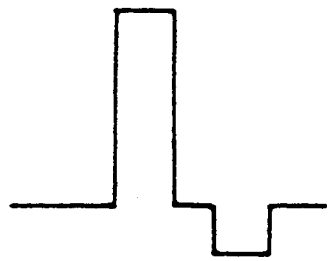

Another pulse form shown in FIG. 27D is advantageously used. This pulse form has a main pulse and a following small pulse of different polarity from the main pulse. Using this pulse form, an ink column following the ink droplet ejected by the main pulse is drawn back into the ink chamber 203 through the nozzle 205 by the small pulse, which decreases so-called satellite noise.

Figure 27E:
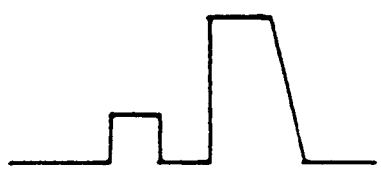

Another pulse form shown in FIG. 27E may also be used. This pulse form includes a small pulse and a following main pulse, both having the same polarity. Using this pulse form, the voltage of the main pulse may be reduced, which reduces a load of the driver IC. Therefore, this is economical to the device.

Ejection of ink is carried out for each ink chamber 203 at the same time in response to the image signals, thereby one line of image is reproduced. This is done repeatedly in synchronism with the movement of the sheet, thereby a whole image is reproduced on the sheet.

As described above, among members of the driver 25 for ejecting ink, only the actuator 208 is extended into the ink chamber 203 to contact with the ink, while the first and second piezo-electric members 214 and 215 are arranged outside the ink chamber 203 so as not to contact with the ink. Therefore, each of the piezo-electric members 214 and 215 can be applied with an effective voltage. Therefore, the piezo-electric members 214 and 215 deform to vibrate depending upon the voltages to be biased, which causes the ink to be ejected effectively.

Although the driver 209 is securely mounted on the base plate 202 via the first piezo-electric member 214, the vibration of one driver 209 is not transmitted to the neighboring ones. Further, even if the vibration could be transmitted to neighboring ones, it is so small that no cross-talk from chamber to chamber occurs. Therefore, no ink is ejected unexpectedly, and ink flows in the chamber without being disturbed. Consequently, ink drops having a constant diameter will be ejected, which increases the quality of the reproduced image.

It should be noted that since the dicing process permits the ink chamber 203 and the drivers 209 to be formed readily and in high density, the number of the ink chambers and the associated nozzles can be increased, which accelerates the printing speed of the device.

With the present embodiment, the driver has a bimorph structure, i.e., the actuator 208 is held between the first and second piezo-electric members 214 and 215, so that displacement of the piezo-electric member is amplified in the actuator 208. Accordingly, an inexpensive driver IC for lower voltages can be employed, which decreases costs of driver IC.

Figure 27F:
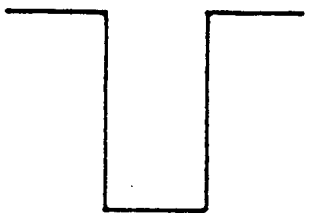
Figure 27G:
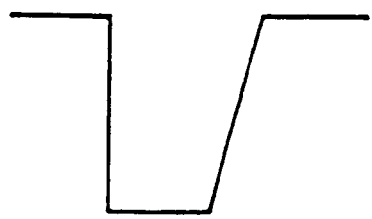

Although, in the previous embodiment, the actuator 208 is deformed to bend by pulse voltage as shown in FIGS. 27A–27E, they may alternatively be deformed by polarizing the piezo-electric members in the opposite direction and arranging individual electrode 217 between the actuators 208 and the first and second piezo-electric members while arranging the common electrodes 216 on the opposite side of the first and second piezo-electric members, and applying biasing pulse voltages as shown in FIGS. 27F or 27G.

Several modifications of the second embodiment will be described below. Note that only specific structure in the modifications and effects derived therefrom will be discussed below.

Figure 28A:
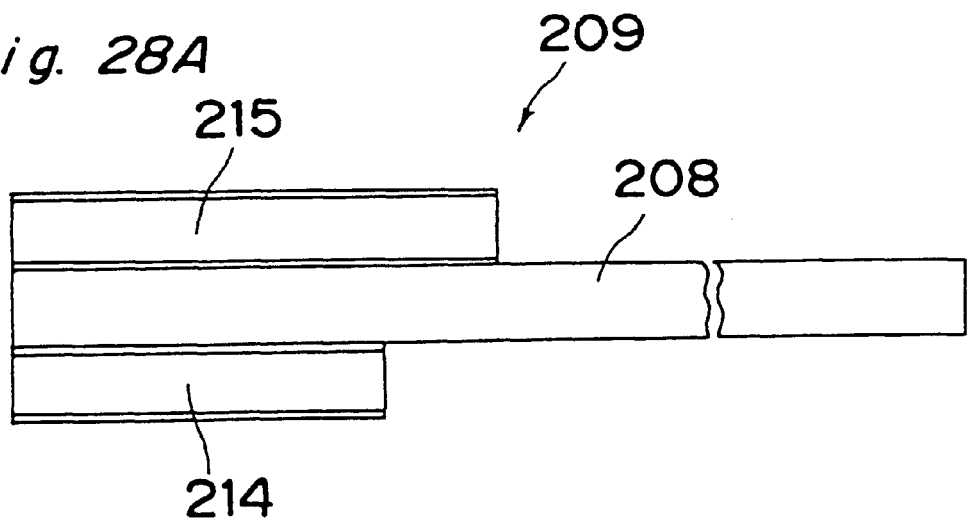
FIGS. 28A–28B show modifications of drivers to be used in the electro-mechanical transducer of the second embodiment.
Figure 28B:
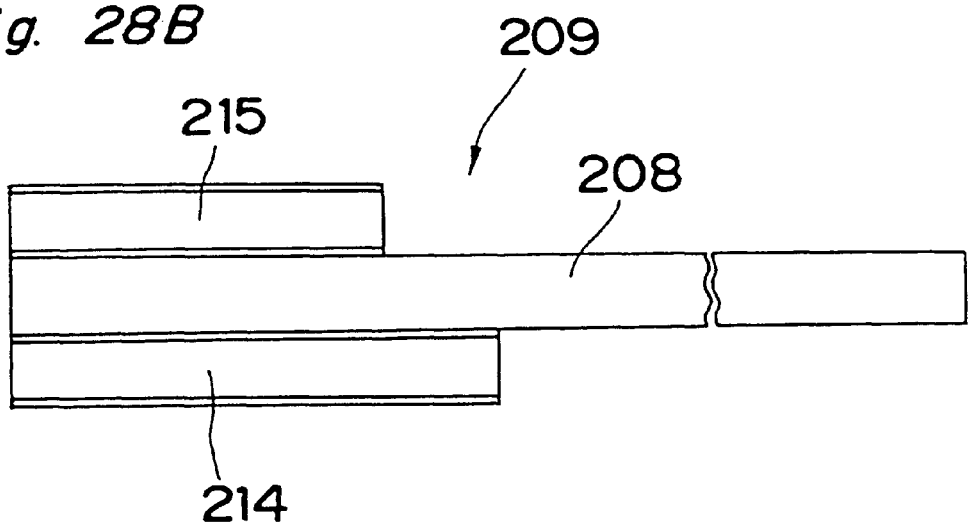

Referring to FIGS. 28A–28B, although the piezo-electric members 214 and 215 have the same length, the first member 214 may be shorter or longer than the other member 215. This provides the actuator 208 with a larger displacement, which permits the driver to activate at lower voltage and further decreases the cost of the driver IC.

Figure 29A:
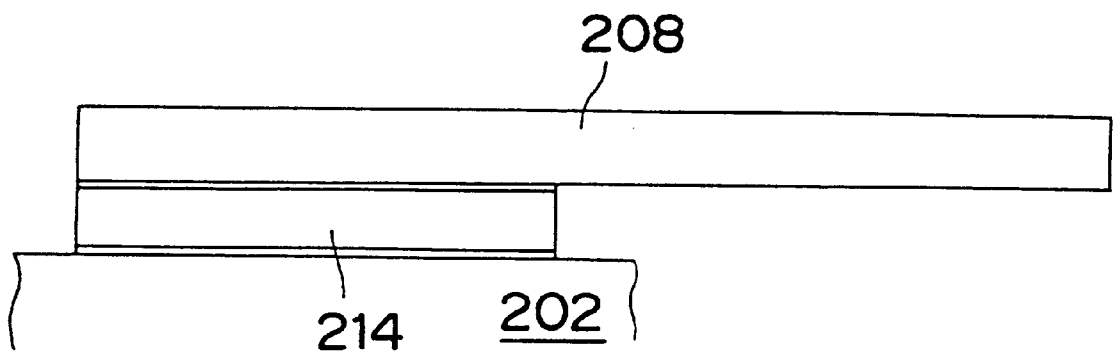
FIGS. 29A–29B show other modifications of the electro-mechanical transducer of the second embodiment.
Figure 29B:
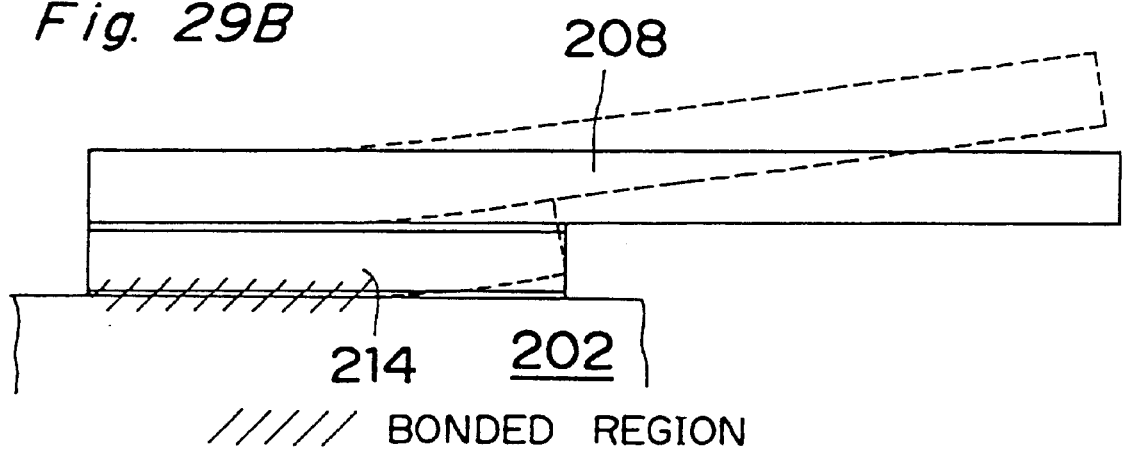

Although the second embodiment employs the first and second piezo-electric members 214 and 215, the second piezo-electric member 215 can be eliminated as shown in FIG. 29A. This modification also works as the second embodiment. In this modified embodiment, as shown in FIG. 29B, it is not necessary to bond the overall region that the piezo-electric member 214 contacts the actuator 208, which causes the piezo-electric member 214 to deform to bend in its un-bonded region and further permits the actuator 208 to displace.

The piezo-electric member 214 or 215 may be multi-layered as shown in FIGS. 30A–30B This multi-layered piezo-electric member, which is made by superimposing individual electrode, piezo-electric member, and common electrode in order, may be used. According to this modified embodiment, larger displacement of the actuator 208 can be obtained as the number of the layers increase, which means that a lower biasing voltage is required which allows the driver IC cost to be reduced. Further, the ink droplets can be stably ejected.

Figure 31:
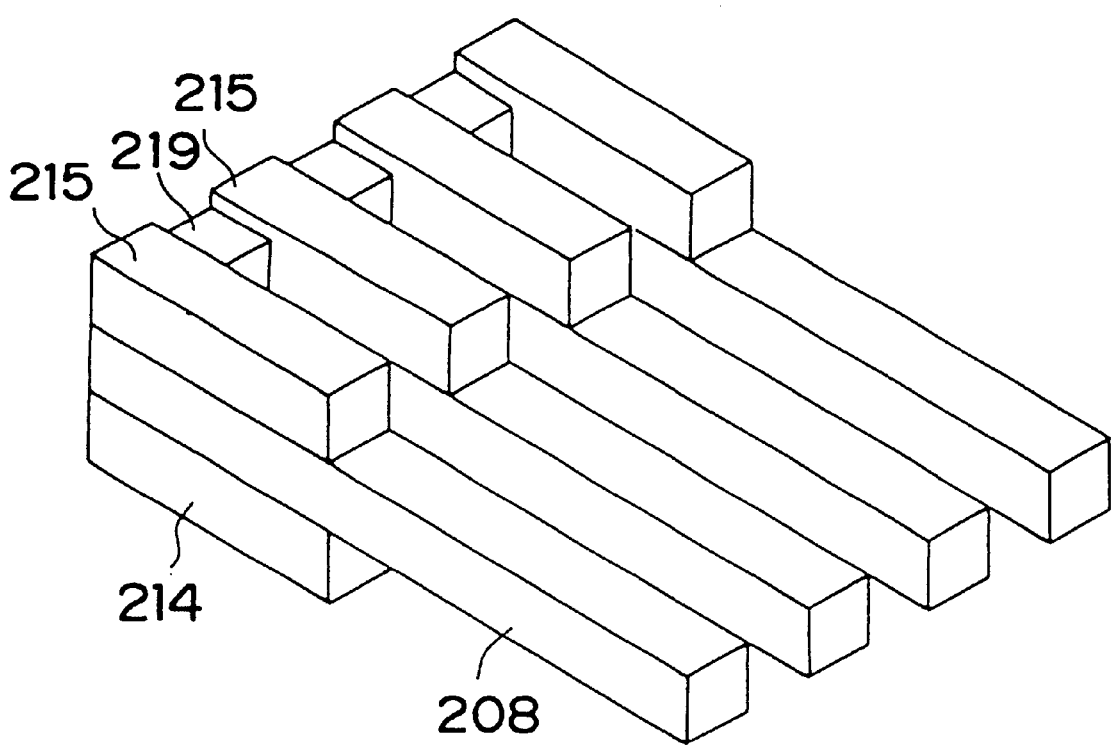
FIG. 31 shows a close-up of the plurality of layers of the piezo-electric member.

Although, in the second embodiment, drivers 209 are separated from the other, as shown in FIG. 31, they may be integrated at the rear ends thereof with suitable connecters 219 into a fork-like configuration. The connecter 219 is formed together with piezo-electric members as an unit by cutting a large piezo-electric plate. In this cutting, the connecter is formed by moving the dicing saw up and down along a contour of the connecter 219 to define a shallow slot thereon. The individual electrodes 217 on the rear portion of the piezo-electric members 214 and 215 adjacent the connecters 219 are eliminated therefrom, which prevents the piezo-electric members 214 and 215 from deforming and vibrations of the piezo-electric members from being transmitted to the neighboring ones.

This fork-like configuration increases a structural strength of the driver, which increases the durability and responsibility of the device and handling in the forming and assembling. Further, this increases precision of the assembly, causing the detect rate to be reduced and decreases the cost of production. Due to the existence of the connecter 219, common electrodes can be arranged between the actuator 209 and the first and second piezo-electric members 214 and 215, which permits each of the common electrodes for the piezo-electric members 214 and 215 to be grounded by single electrical connection.

C. THIRD EMBODIMENT

Figure 32:
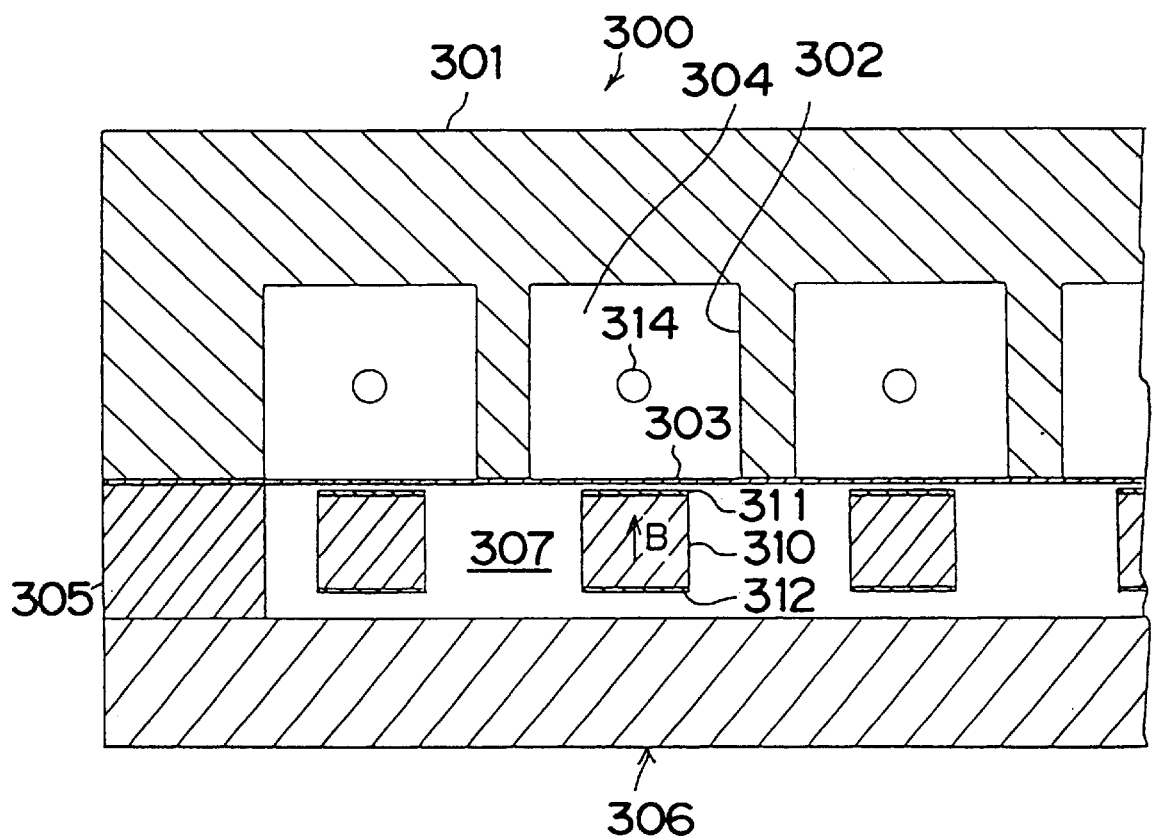
FIG. 32 is a transverse sectional view of the ink jet head of the third embodiment.
Figure 33:
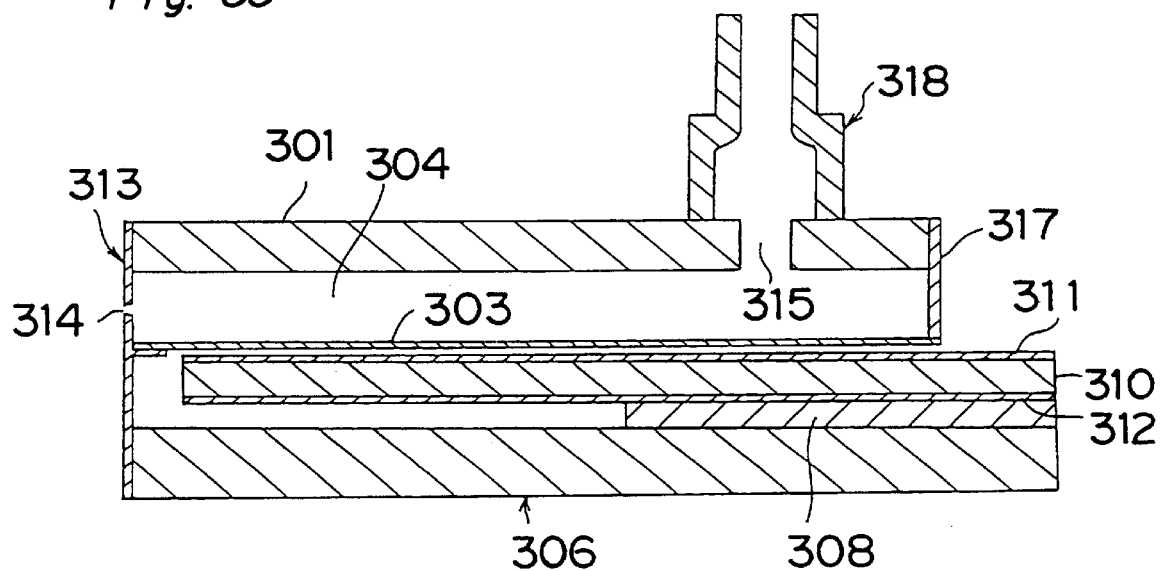
FIG. 33 is a longitudinal sectional view of the ink jet head of the third embodiment.
Figure 34A:
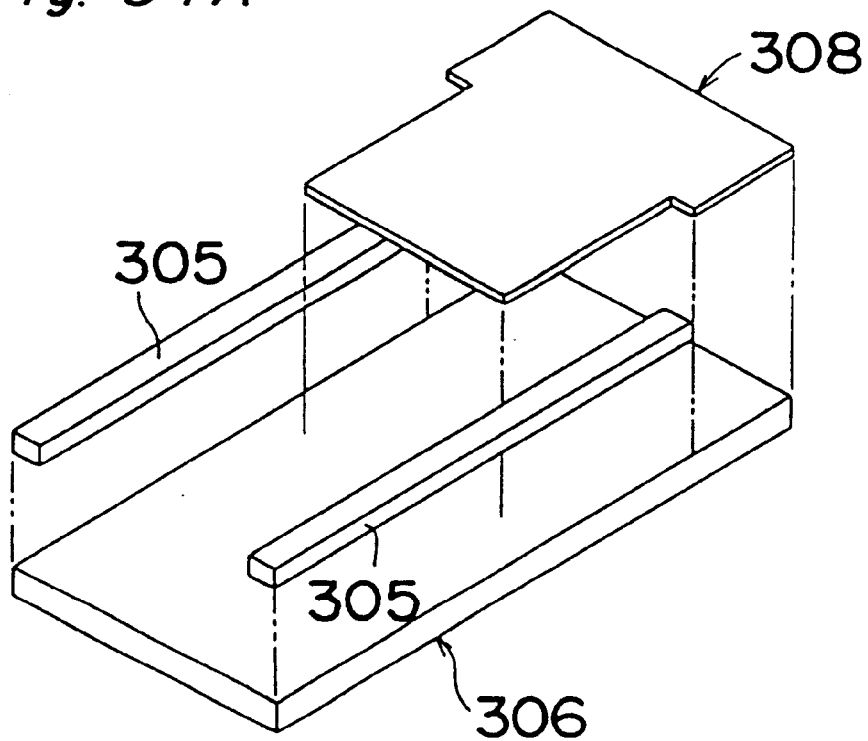
FIGS. 34A–34B illustrate a process of assembling a second plate and other elements arranged thereon.
Figure 34B:
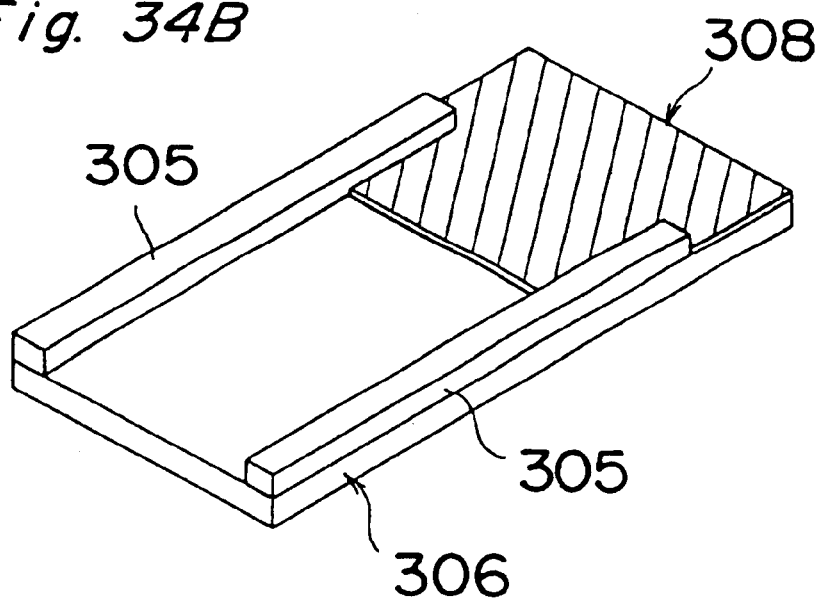

Referring to the drawings, a third embodiment of the ink jet head will be described. As shown in FIGS. 32 and 33, the ink jet head 300 has a first plate 301 made from non-piezo-electric plate of, for example, aluminum. The plate 301 has its one surface a plurality of mutually spaced slots 302 extending longitudinal direction thereof. Bonded on the lower surface of the first plate 301 is a compliant partition wall 303 made of, for example, epoxy-resin to cover slots 302 so that a plurality of ink chambers 304 are formed. As best shown in FIGS. 34A and 34B, a pair of spacers 305 are secured by bonding at both sides of the lower surface of the first plate 301 via partition wall 303. Referring back to FIGS. 32 and 33, a second plate 306 is secured by bonding under spacers 305. As shown in FIG. 32, the second plate 306 has a recess 307 extending parallel along the slots 302. the recess 307 has a width that covers all slots 302. Note that spacers 305 and the second plate 306 are made of non-piezo-electric material like the first plate 301. The second plate 306 has at its rear end, i.e., right hand side in FIG. 33, a support 308 for a plurality of piezo-electric members. This support 308 may be made of the same material as that of the second plate 306 or different materials.

Mounted on support 308 are a plurality of elongated piezo-electric members 310, made of, for example, preferably PZT piezo-electric ceramic. The number of piezo-electric member corresponds to that of slots 302 and each piezo-electric member 310 is so arranged as to face each associated slot 302. The piezo-electric member 310 has an individual electrode 311 on its one surface with leaving a small gap from the partition wall 303 and a common electrode 312 on the other surface. The piezo-electric member 310 is polarized in a direction indicated by an arrow B which corresponds to a direction of an electric field generated by biasing a voltage between the individual and common electrodes 311 and 312.

Referring to FIG. 33, as previously discussed, piezo-electric member 310 is bonded to support 308 at its rear side of the head, i.e., right hand side thereof, and is extended freely therefrom toward the opposite side of the head while leaving a gap, corresponding to the thickness of the support 308, from the second plate 306. This is because, in the present embodiment, piezo-electric member 310 is so designed that, upon biasing a voltage between electrodes 311 and 312 to form an electronic field in piezo-electric member 310, it first bends towards the second plate 308, and then upon turning off the voltage to eliminate the electronic field, it returns toward its original position and further moves past the original position due to its inertia force to hit and move partition wall 303 into the ink chamber 304, which pressurizes the ink in ink chamber 304. Therefore, the gap between partition wall 303 and the piezo-electric member 310 should be smaller than the displacement towards the partition wall 303 of the piezo-electric member 310.

Although the gap between the piezo-electric member and the second plate 306 is formed by using the support 308, this gap may be provided by forming a wide recess or a plurality of recesses confronting piezo-electric members 310, respectively. Further, the support 308 may be formed by adhesive for bonding the piezo-electric member 310 to the second plate 306.

An integrated unit of the upper and lower plates 301 and 306 has at its front end a nozzle plate 313 made of, for example, polyimide film of approximately 25–200 μm in thickness. This nozzle plate 313 has a plurality of nozzles 314 positioned in a line, each axis of the nozzles 314 being spaced the same distance as that of ink chambers from each other. Suitably the distance is, for example, about 42.3–254 μm if a pixel density is from 600–100 dpi.

The first plate 301 has at its rear portion an opening 315, extending in the transverse direction, which crosses ink chambers 304. Both sides of this opening are closed by side plates 316 as best shown in FIG. 38. Further, rear end openings of the ink chamber are closed by back plate 317. Furthermore, the first plate 301 has thereon a manifold 318 which communicates with opening 315 to feed ink into ink chambers 304.

As shown in FIG. 33, the piezo-electric member 310 is extended out beyond back plate 317. Like the first embodiment, each individual electrode 311, at its rear end, is connected through a wire bonding to a conductive member, the drive IC, a conductive member, and a connector to controller, while the common electrodes 312 are connected to each other through conductive adhesive which bonds piezo-electric member 310 to the second plate 306. This conductive adhesive is further connected to the controller through the wire bonding and connecter.

Referring to FIGS. 34 through 38, a process for manufacturing ink jet head 30 of the present embodiment will be described hereinafter. As shown in FIGS. 34A and 34B, a plate made from non-piezo-electric material is prepared for the second plate 306. On the second plate 306, a pair of spacers 305 are mounted on both sides thereof and the support 308 is arranged between spacers 305. The spacers 305 and support 308 are bonded to the second plate 306. Also, an electrically conductive adhesive is applied on the support 308.

Figure 35A:
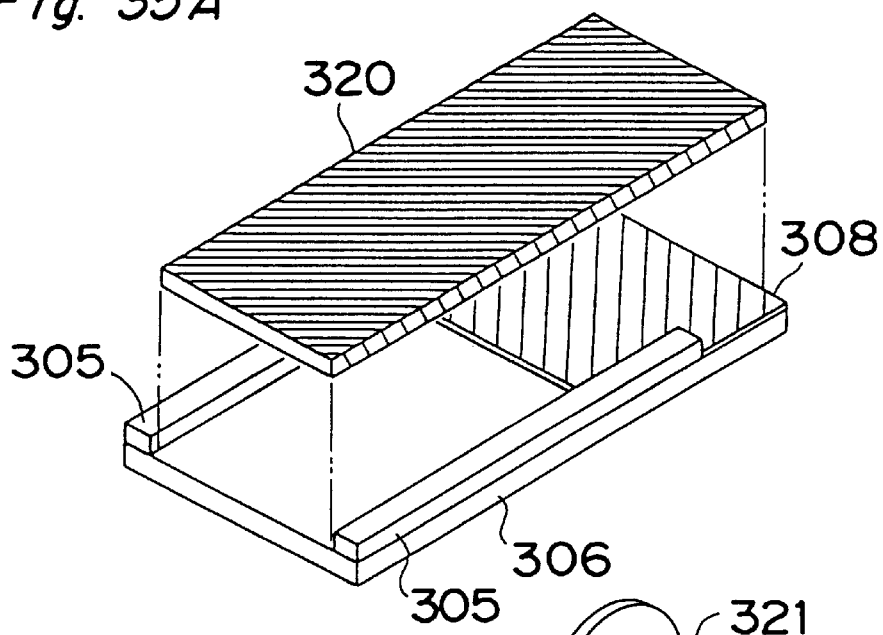
FIGS. 35A–35C illustrate a process of manufacturing the piezo-electric members of the third embodiment.
Figure 35B:
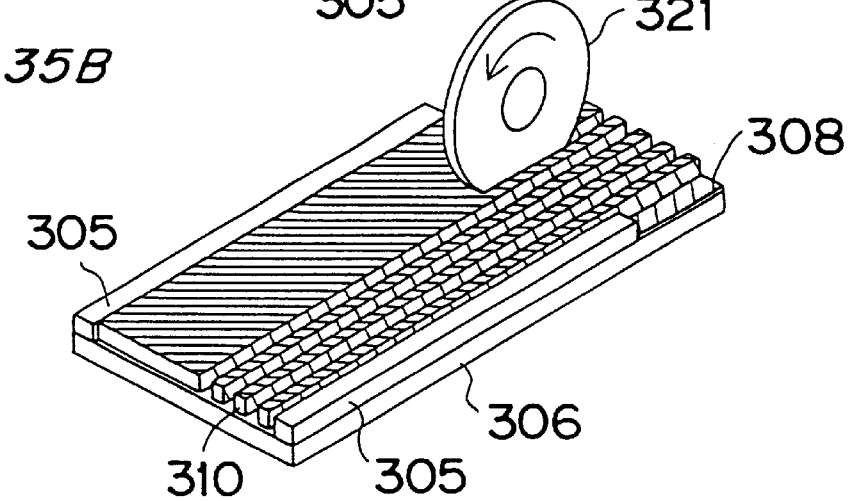
Figure 35C:
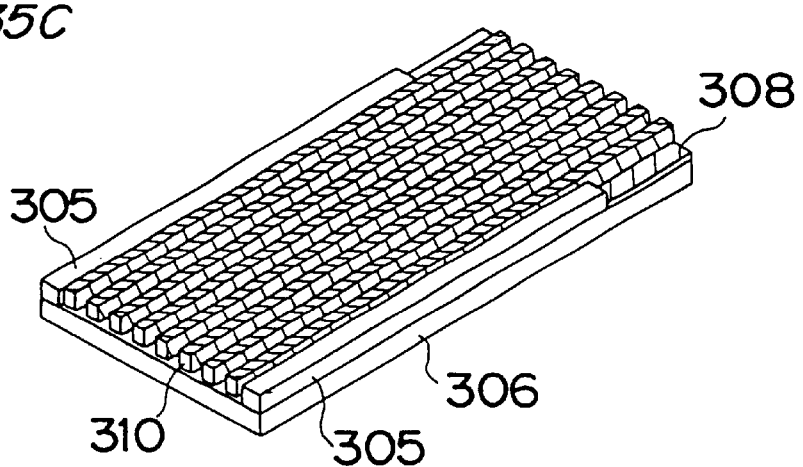

Then, as shown in FIGS. 35A–35C, a rectangular plate 320 is arranged between the spacers 305 and bonded on the support 308. This plate 320 is made from PZT having electrode layers of about 10–0.1 μm in thickness, on both upper and lower sides thereof. This electrode layer may be Au/Ni produced by electroless plating or Au/Ni or Au/Cr deposited by sputtering.

After that, PZT plate is cut at equal intervals using a dicing saw 321 so that a plurality of mutually spaced piezo-electric members 310 and slots therebetween are formed. Next, an entire surface of the piezo-electric member 310 is coated with a specific resin such as polyimide and then is heated at 180° C. for about an hour to form a protection layer. This protection layer prevents moisture in the atmosphere from penetrating into the piezo-electric member so that the piezo-electric member keeps its original deformation rate even though it is exposed to moisture. Note that this process can be eliminated if the piezo-electric member is made of another piezo-electric material having greater resistance to the humidity invasion.

Figure 36A:
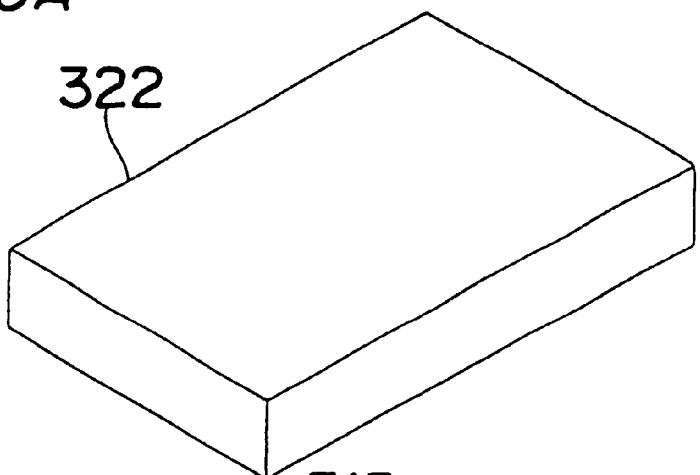
FIGS. 36A–36C illustrate a process of manufacturing a first plate of the third embodiment.
Figure 36B:
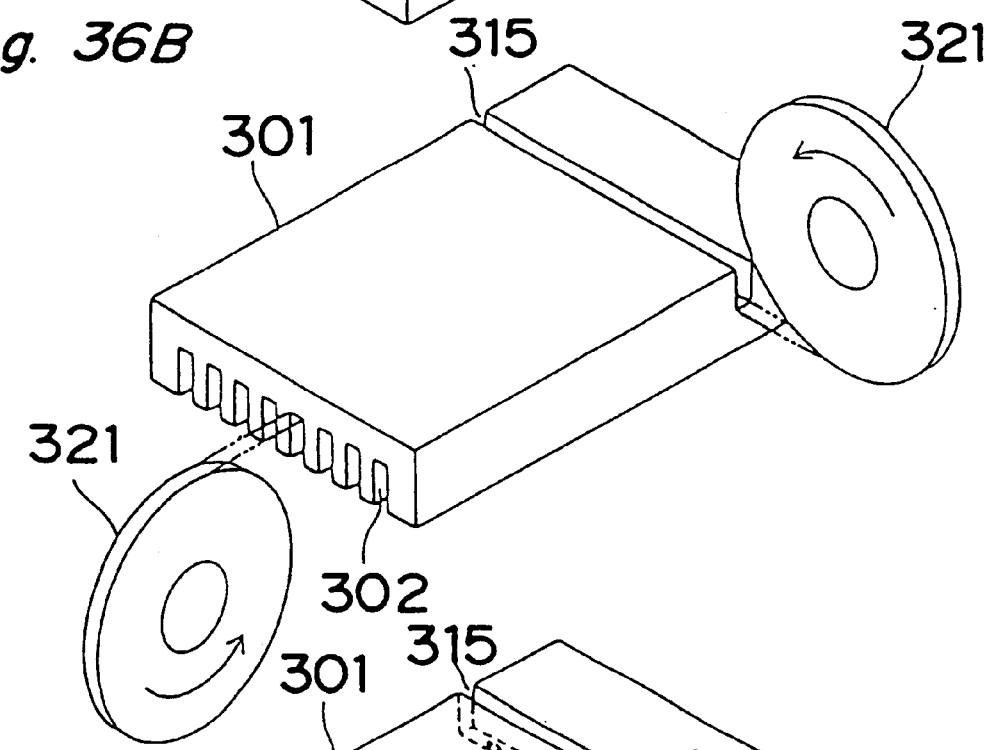
Figure 36C:
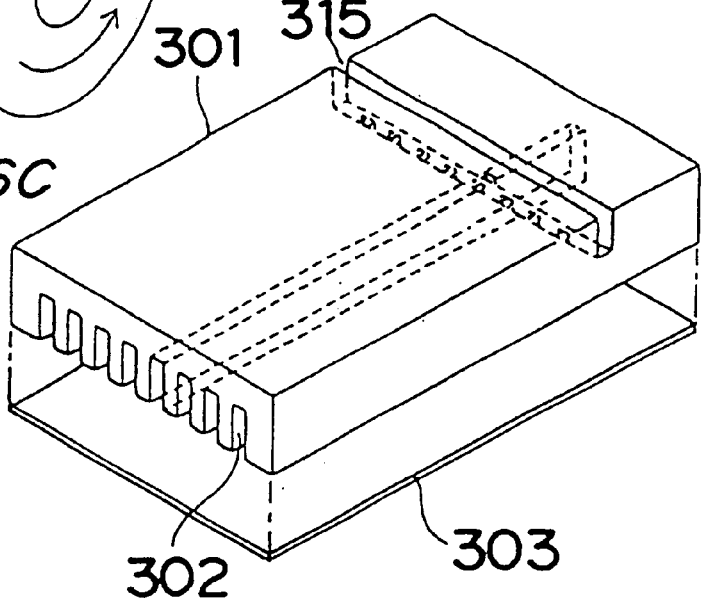

The first plate 301, on the other hand, is manufactured as follows. This plate 301 is manufactured from a rectangular plate of non-piezo-electric material, for example, aluminum, or ceramic. As shown in FIGS. 36A–36C, the rectangular plate 322 is cut by dicing saws so that a plurality of parallel slots 302 are formed on its one side at the same interval as that of piezo-electric members 310 on the second plate 306. Each slot 302 has a width greater than that of piezo-electric member 310 so that the piezo-electric member 310 can be inserted therein. Formed in the opposite side of the plate 322 is another slot or opening 315 which runs in the transverse direction so that this opening communicates with the slots 302.

Figure 37A:
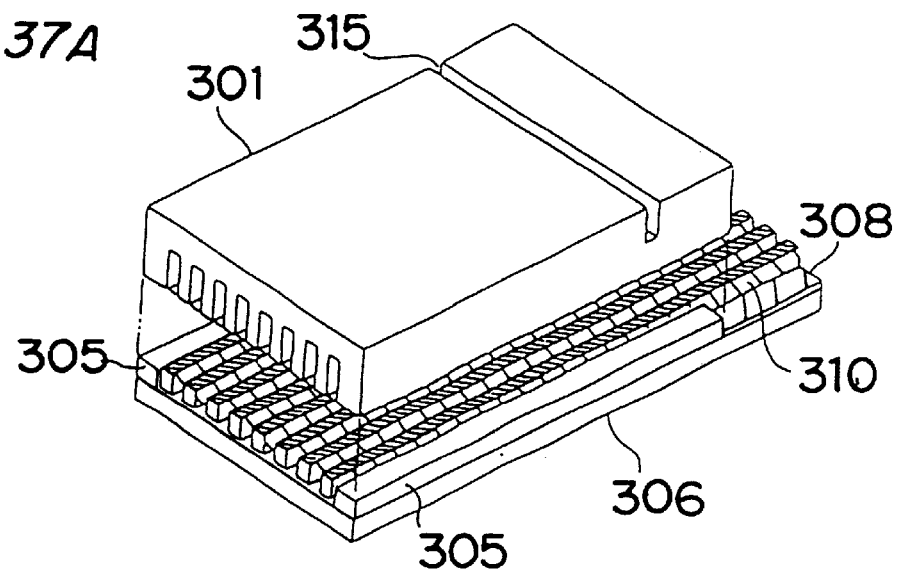
FIGS. 37A–37C illustrate a process of assembling the first and second plates of the third embodiment.
Figure 37B:
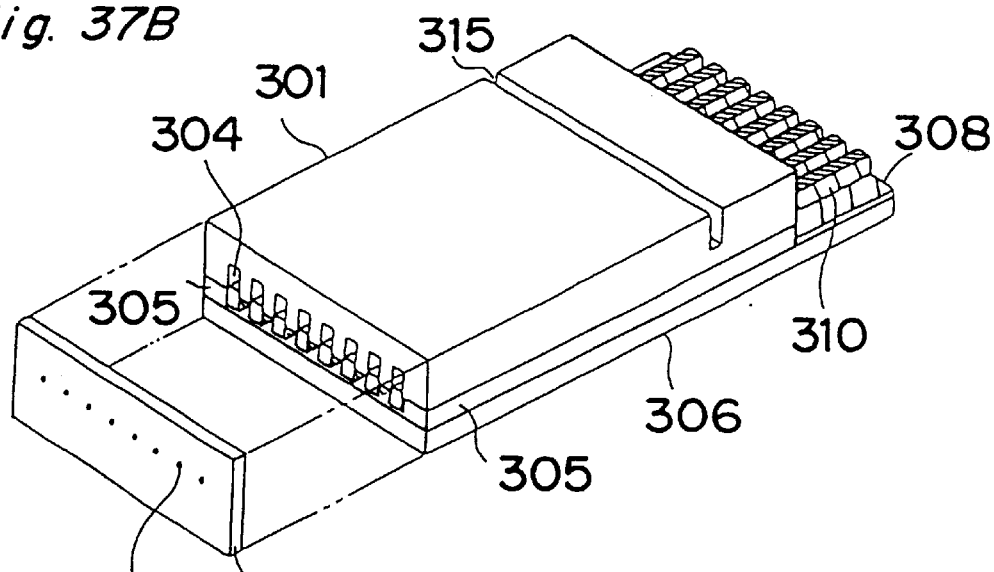
Figure 37C:
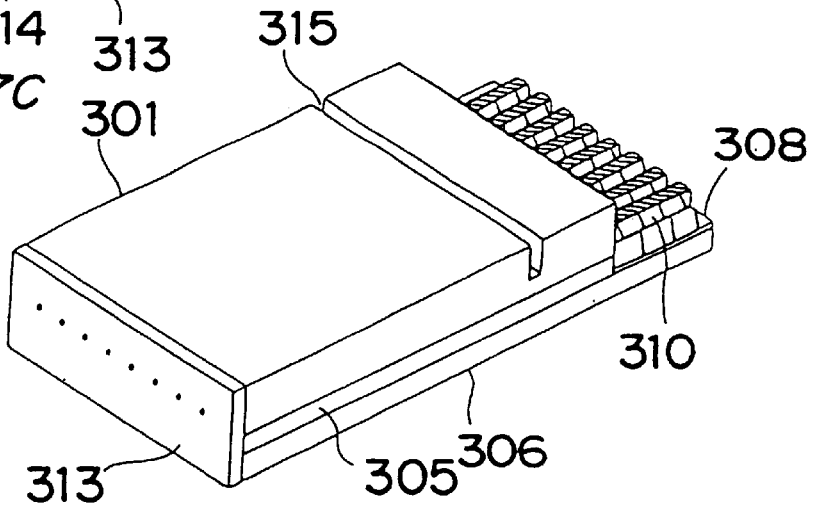

As shown in FIGS. 37A–37C, these plates 301 and 306 thus manufactured are assembled and bonded to each other with each piezo-electric member 310 being positioned in the associated slot 302. Further the nozzle plate 313 is bonded to the front end of the integrated plates with each of nozzles 314 being positioned at the center of the associated ink chamber 304.

Figure 38A:
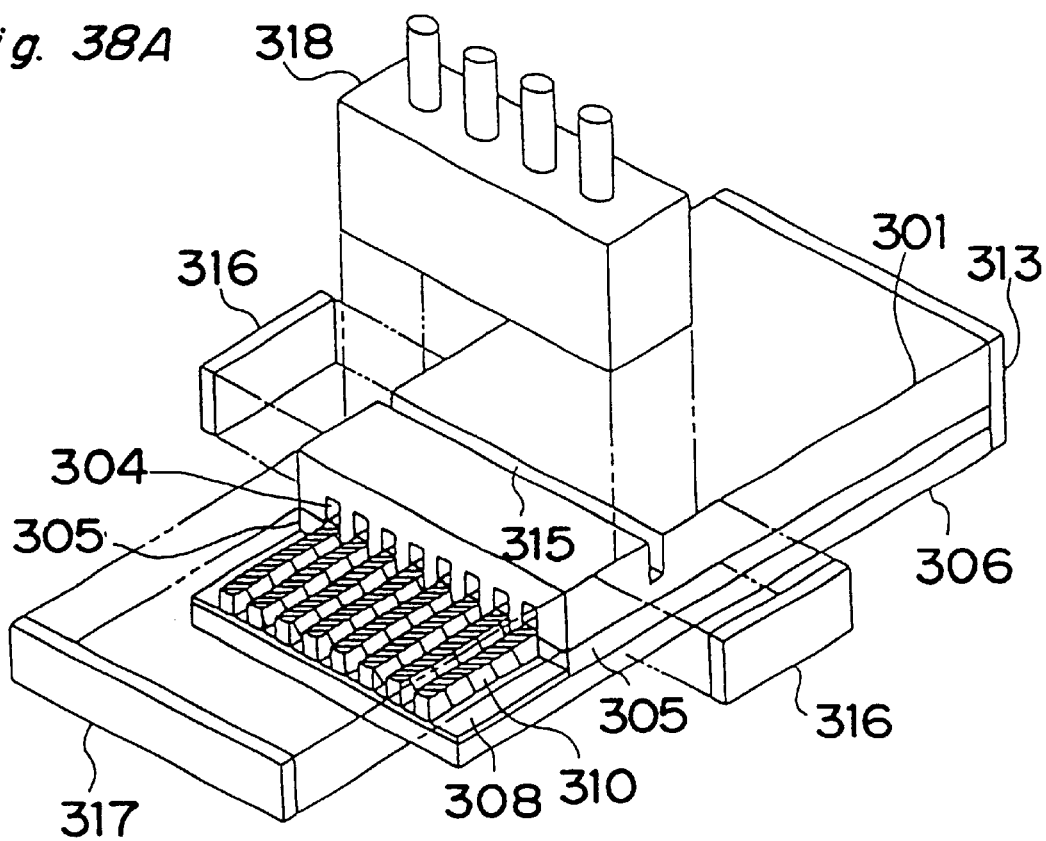
FIGS. 38A–38B illustrate a process of assembling the electro-mechanical transducer of the third embodiment.
Figure 38B:
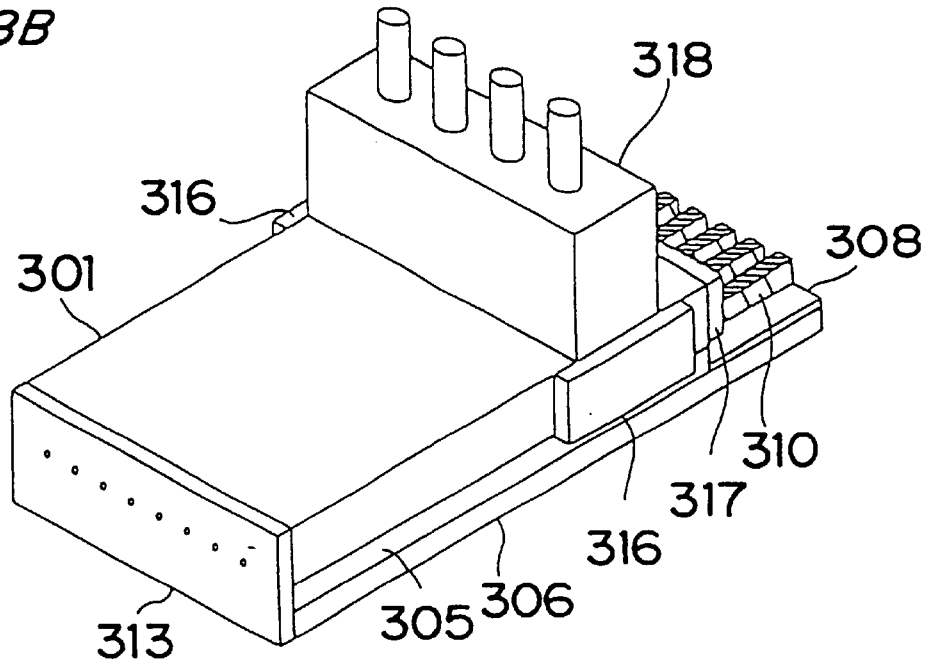

Further, as best shown in FIGS. 38A and 38B, the manifold 318 is attached on the first plate 301 to cover the opening 315, and then the side plates 316 are mounted on both sides of the first plate 301 to enclose the opening 315. The back plate 317 is bonded to the rear end of the integrated plates to enclose ink chambers 304.

Furthermore, like first embodiment of the invention, as shown in FIG. 39, head 300 thus constructed is mounted on the base plate and each element is connected to the associated element on the base plate. Further, the elements of the head are preferably over molded by the suitable resin.

Figure 40A:
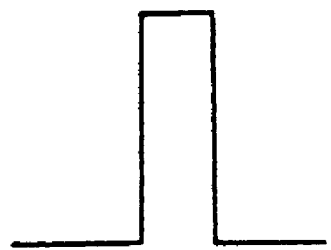
FIGS. 40A–40C illustrate pulse forms to be applied to electrodes in the electro-mechanical transducer.
Figure 41:
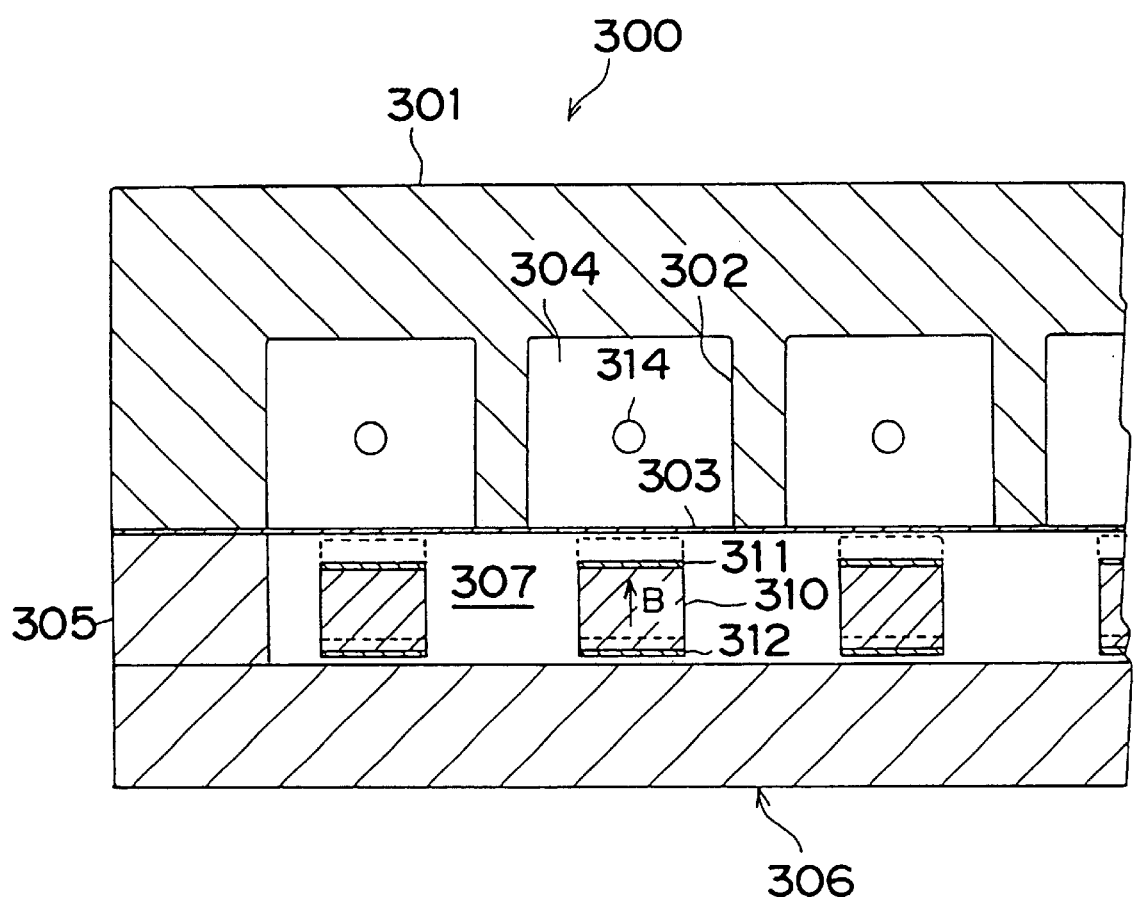
FIG. 41 shows a deformation of the piezo-electric members of the electro-mechanical transducer of the third embodiment.
Figure 42:
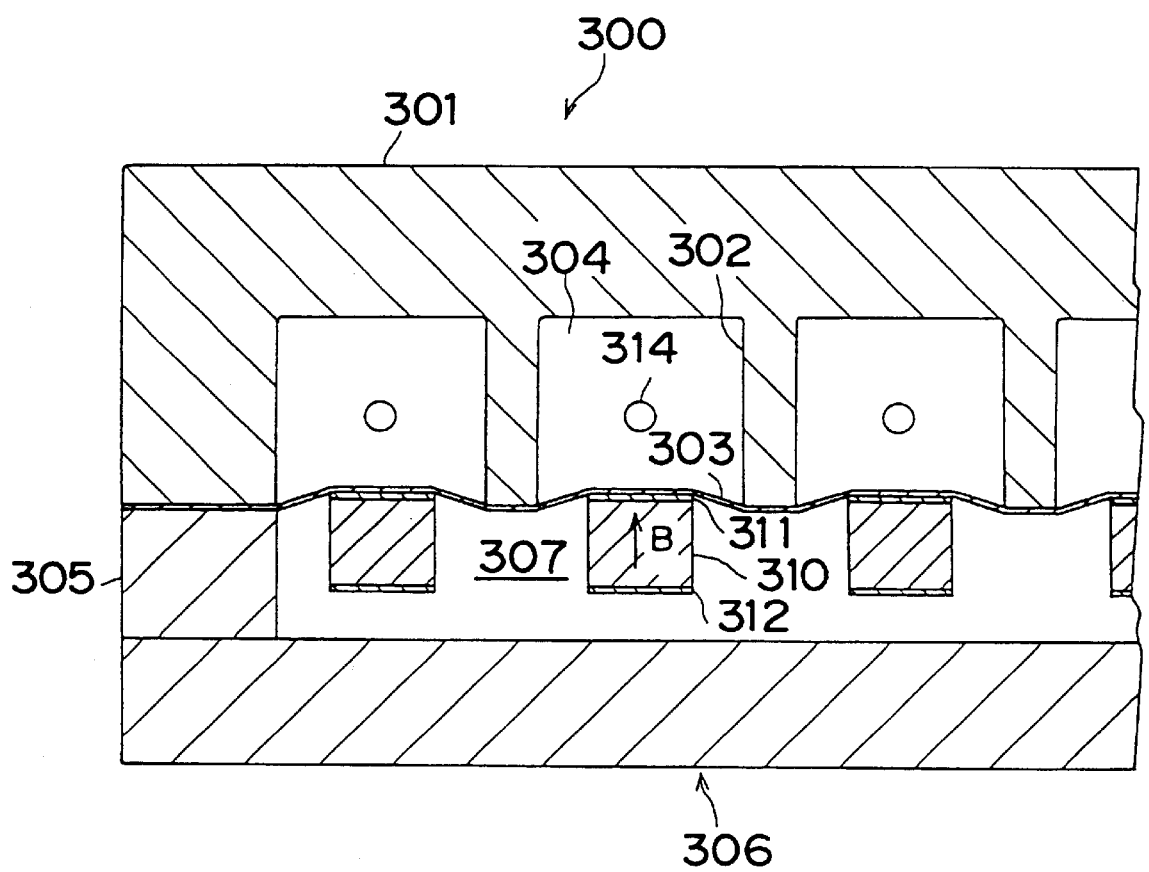
FIG. 42 shows a deformation of a partition wall in the electro-mechanical transducer of the third embodiment.

A discussion will be made next to ink ejection. Ink is supplied from the ink supply through the manifold 318 and filled in the ink chambers 304. Upon applying a pulse voltage (see FIG. 40A) between the individual electrode 311 and common electrode 312 according to an image signal, an electric field is generated in the direction parallel to the polarization direction indicated by the arrow B, from the common electrode 312 to individual electrode 311. As a result, as shown in FIG. 41, the piezo-electric member 310 bends towards the second plate 306 from an original position shown by dotted lines. Next, upon turning off the voltage, the piezo-electric member 310 returns toward the original position due to its elasticity, and after moving past the original position, the piezo-electric member 310 keeps moving to hit and force the partition wall 303, which results in a reduction of the volume of the ink chamber 304 as shown in FIG. 42. As a result, an ink droplet is ejected through nozzle 314 from the ink chamber 304 and then is deposited on a recording sheet not shown.

After that, the piezo-electric member 310 moves to the original position while the partition wall 310 returns to its original position shown in FIG. 32, which reduces pressure in the ink chamber 304 so that the ink is supplied through the manifold 318 to the ink chamber 304 in order to prepare for a next ink ejection.

Figure 40B:
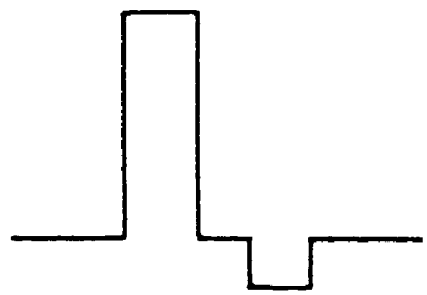

Because no means are provided to restrict the free end portion of the piezo-electric member 310, after moving back to its original position, it continues to move from upward to downward and vice versa, repeatedly. Also, at the very moment the bias voltage is applied to the electrodes, the piezo-electric member should be in its original position. Otherwise, the piezo-electric member fails to start deformation in a predetermined direction at the same time that the voltage is applied thereto, which results in a variation of diameters of ink droplets, a delay of ink ejection, or a reduction of image quality. Further, to wait until the piezo-electric member comes to a standstill will decreases the speed of printing. Therefore, according to this embodiment, it is desirable to apply a supplemental pulse voltage having opposite polarity as shown FIGS. 40B or 40C, which causes the piezo-electric member to come to a stop in its original position in a short time.

According to the present embodiment, after bending the free end portion of the piezo-electric member 310 towards the second plate 306, by turning off the voltage which has been applied to the electrodes, the piezo-electric member is released to hit the partition wall 303 due to its elasticity so that the ink chamber 304 is pressurized to eject ink therefrom. Further, the present embodiment receives less resistance and thus needs less voltage than to bias the piezo-electric member towards the partition wall. Furthermore, normally the piezo-electric member having a greater rigidity will provide the partition wall with a greater force, which generates a powerful energy for ejecting the ink. Consequently, according to the embodiment, the ink is efficiently ejected with a low voltage to be applied to the electrodes. Moreover, because the piezo-electric member 310 is positioned outside the ink chamber 304, it keeps its electrical resistance, which ensures the stability and reliability of the ink jet head.

Figure 43:
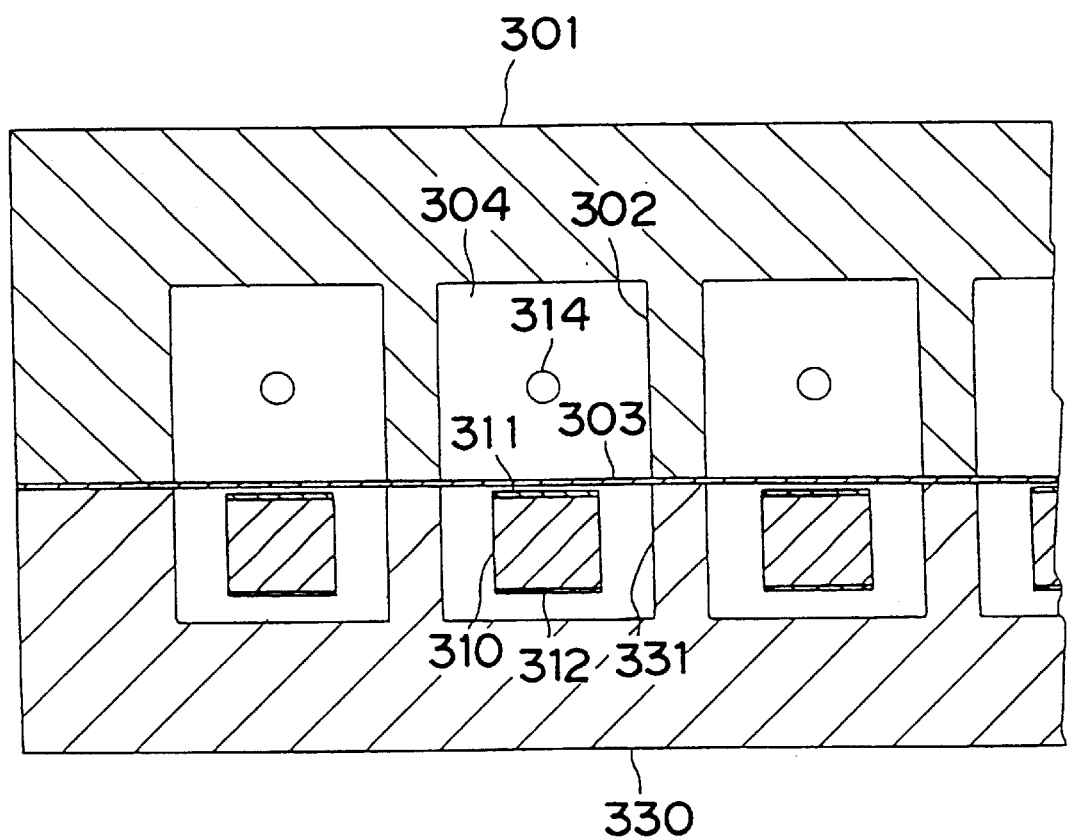
FIG. 43 shows a modification of the electro-mechanical transducer of the third embodiment.

FIG. 43 shows a modification of the present embodiment, in which a second plate 330 has a plurality of mutually spaced slots 331 extending in a longitudinal direction thereof, each slot 331 confronting the ink chamber 304 via partition wall 303. In this modification, the support 308 may be in the form of a fork, and the gap between the piezo-electric member 310 and the second plate 306 may be formed by providing steps in the respective slots 331.

According to this modification, because the slot 331 serves as a guide for the piezo-electric member 310 housed therein, even when the piezo-electric member 310 includes a permanent deformation therein, the piezo-electric member will be correctly guided toward the partition wall 303. Also, the partition wall 303 is held by the first and second plates 301 and 330 at an equal interval; therefore, no vibration of the partition wall 303 is transmitted to the neighboring ink chambers 304. Further, a mechanical strength of partition wall is increased, which increases the durability of ink jet head.

Although, in the third embodiment, a small gap is provided between the partition wall 303 and the piezo-electric member 310, the piezo-electric member 310 may be bonded directly to the partition wall 303 without leaving any gap therebetween. This allows the partition wall 303 to follow the movement of the piezo-electric member 310 even when pulse voltages of high frequency are applied to the piezo-electric member 310, which improves an ability to response against high frequency image signals and a print speed.

If the piezo-electric member 310 is bonded to the partition wall 303, moving the piezo-electric member 310 opposite to the ink chamber increases the volume of ink chamber 304, which reduces the pressure in the ink chamber 304 to draw ink into the chamber. However, a very rapid increase of the volume of the ink chamber can suck air through nozzle into the ink chamber. Further, once air is aspirated, due to bubbles in the ink, little or no ink can be ejected from nozzle 314 because pressure in the ink generated by the deformation of piezo-electric member 310 is absorbed by the air.

Figure 40C:
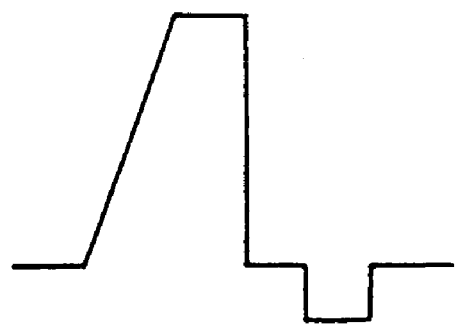

Therefore, to prevent air from being aspirated into the ink chamber, it is desirable to determine the pulse form where the voltage drops gradually to zero as fast as possible to the extent that no air is aspirated into the ink, as shown in FIG. 40C. Advantageously, a supplemental pulse having a different polarity with respect to that of a main pulse is applied after the main pulse.

Figure 44:
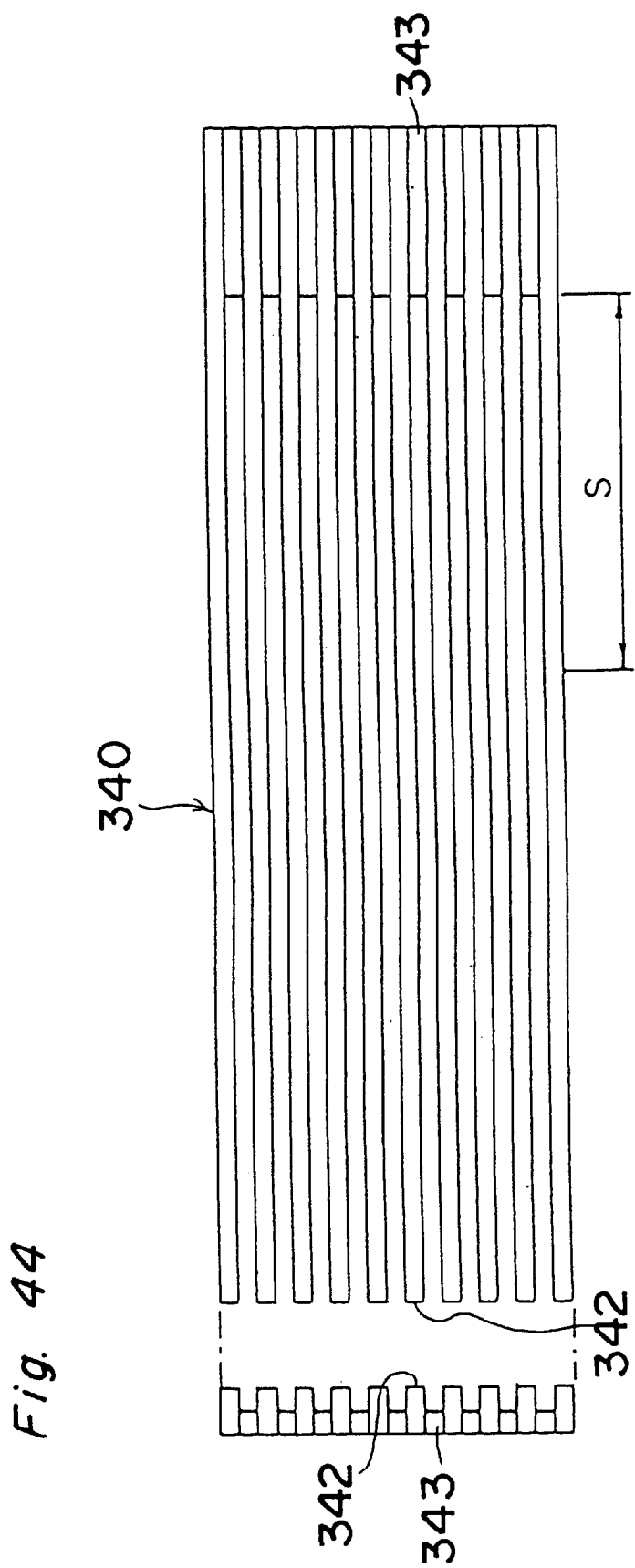
FIG. 44 shows an integrated unit of the drivers of the third embodiment.

The piezo-electric members may be integrated into a unit as shown in FIG. 44. This unit 340, in the form of fork, has a base 343 from which each piezo-electric member extended parallel to each other. Also, the base 343 is preferably designed to be lower than piezo-electric members 342. This unit is manufactured by a dicing saw. In dicing, the dicing saw moves from one end of the original plate to form each piezo-electric member and, once it reaches a base region, the dicing moves up while keeping its lower end within the plate, and then continues to the other end of the original plate so that grooves on the base 343 are formed.

According to this embodiment, each piezo-electric member has a greater structural strength, which increases both durability and reliability of the ink jet head. Also, since the common electrodes can be extended over the base portion, the connection between the common electrode and the conductive line on the base plate may be readily done by wire-bonding or solder. Therefore, it is not necessary to connect each common electrode to the conductive line, which facilitates assembly of the head.

The piezo-electric member may include a plurality of piezo-electric layers and electrode layers. With this piezo-electric member, the displacement at the distal end of the piezo-electric member will be increased depending upon the number of the layers, which decreases power consumption and the cost of the driver IC.

D. FOURTH EMBODIMENT

Figure 45:
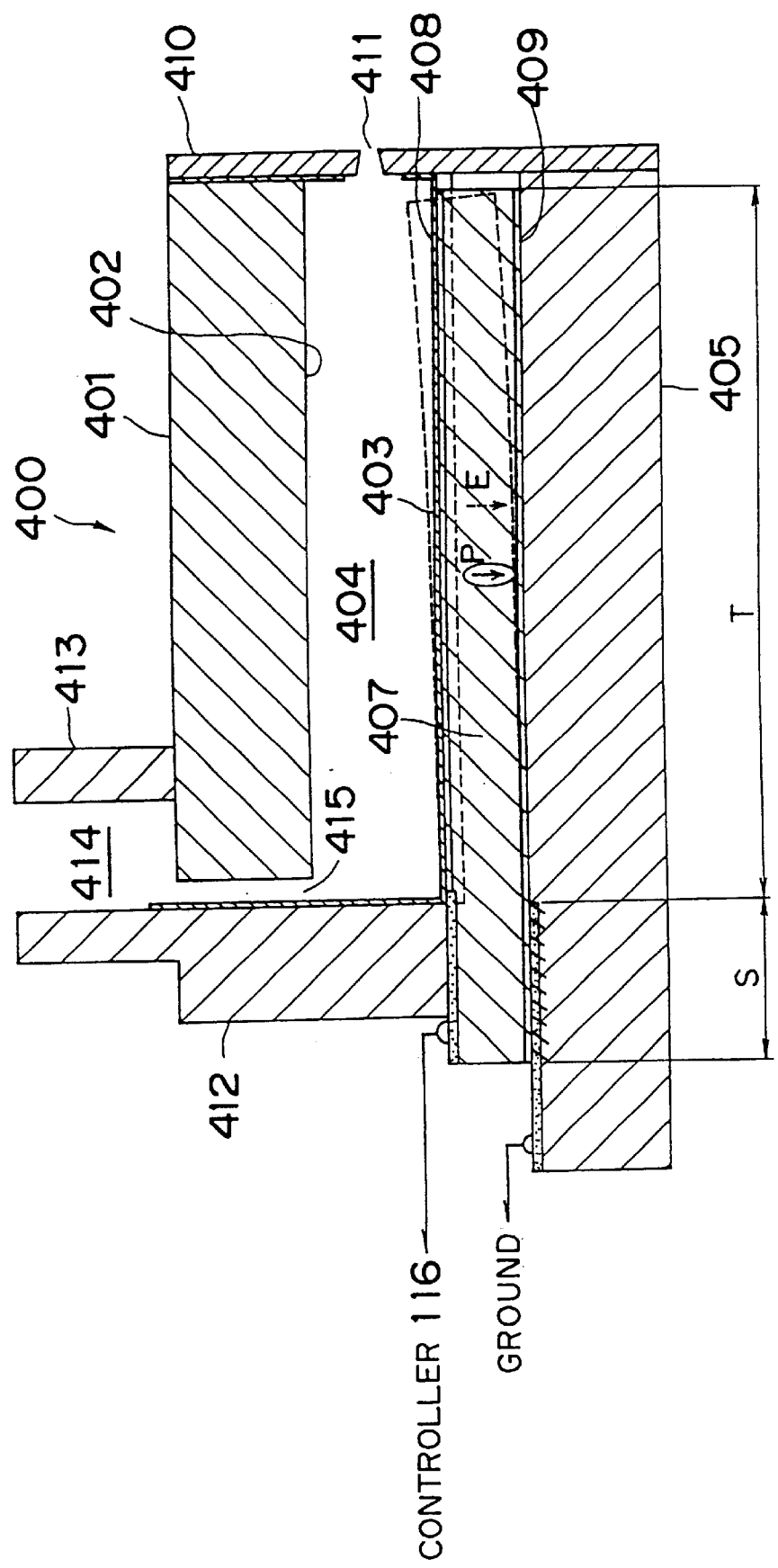
FIG. 45 is a longitudinal sectional view of an electro-mechanical transducer of the fourth embodiment.
Figure 46:
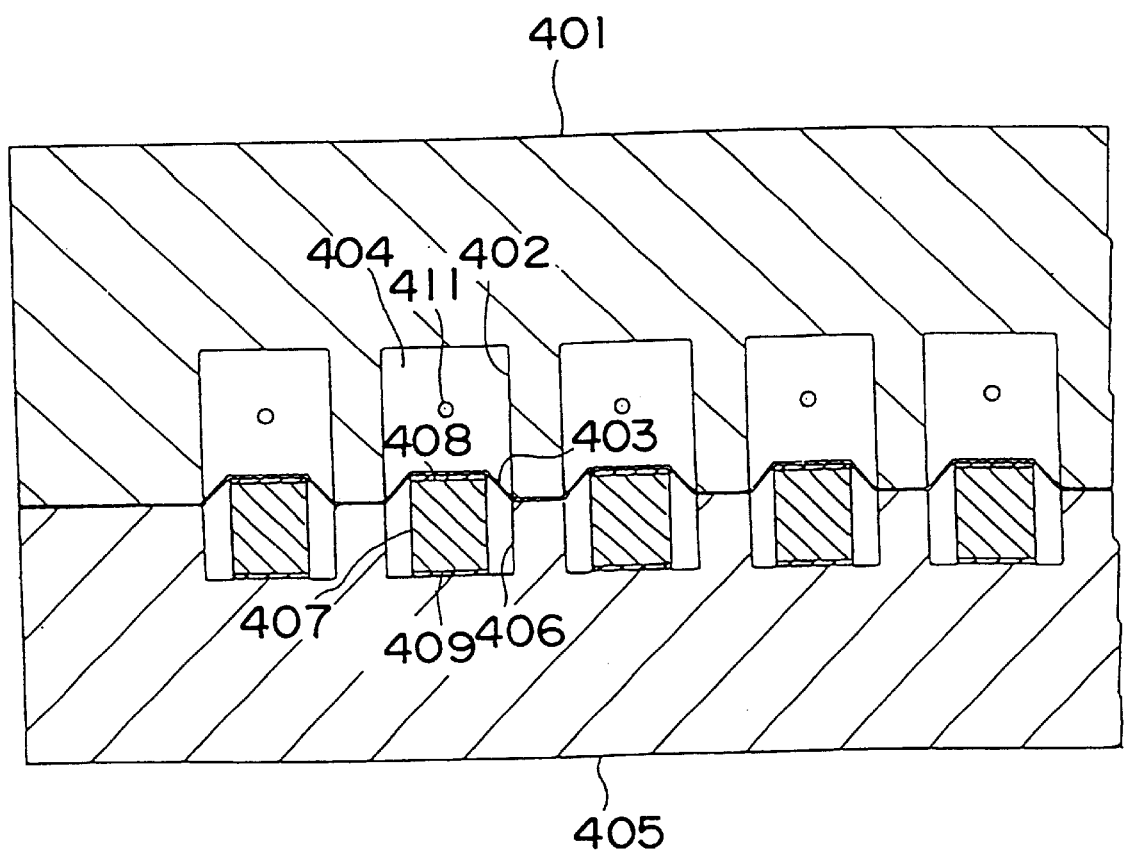
FIG. 46 is a transverse sectional view of the electro-mechanical transducer of the fourth embodiment.

Referring to the drawings, a fourth embodiment of the ink jet head will be described next. FIGS. 45 and 46 illustrate the ink jet head 400. This ink jet head 400 includes a first plate 401 made of non-piezo-electric material such as aluminum. This plate 401 has therein a plurality of parallel slots 402 formed by a dicing operation. Each slot is spaced a predetermined distance from neighboring ones and extends in a longitudinal direction of the plate 401. Arranged and bonded over the slots 402 is a partition wall 403, made of resin such as aramid, thereby enclosing the slots 402 to define corresponding ink chambers 404.

Mounted on the other side of the partition wall 403 is a second plate 405 which is made from a non-piezo-electric plate like first plate 401. The second plate 405 has an its portion confronting the partition wall 403 a plurality of mutually spaced longitudial slots 406, in the same interval as the slots 402 in the first plate 401. These slots are preferably made by a dicing operation. The second plate 405 is secured to the first plate 402 so that the slots 406 confront the slots 402, respectively on opposite sides of the partition wall 403. A variety of means may be employed for securing plates 401 and 405 together, including such items as adhesive, screws, or resin molding.

Arranged in and along each slot 406 in the second plate 405 is an elongated piezo-electric member 407. This piezo-electric member 407, which has a rectangular cross-section, is made by cutting a plate of, for example, PZT piezo-electric ceramic by using a dicing saw. Preferably the piezo-electric member 407 has a height which is greater than that of the depth of the slot 406, such that once the upper and lower plates 401 and 405 are integrated, the piezo-electric member 407 is held firmly between the bottom of the slot 406 and the partition wall 403 while in contact with the partition wall 403. It is not necessary, however, to make the piezo-electric member higher than the slot, member 407 may be as high as the slot 406. The piezo-electric member 407 is preferably bonded to the partition wall 403, which causes the partition wall 403 to follow the vibration of the piezo-electric member 407. This ensures a higher response to high frequency signals. A portion of the piezo-electric member 407 at least in the ink chamber 404, however, is not bonded to the bottom of the slot 406.

Preferably the piezo-electric member 407 is spaced 50 μm or less from either side of the walls of the slot 406, more advantageously 20 μm or less. This prevents the ink in the chamber 404 from moving into slits defined between the piezo-electric member 407 and the walls when the piezo-electric member 407 deforms to pressurize the ink, which causes a pressure loss.

As shown in FIGS. 45 and 46, an individual electrode 408 is arranged between piezo-electric member 407 and partition wall 403 only in a region T where ink chamber 404 faces to the member 407. Further, a common electrode 409 is arranged on the opposite entire surface of piezo-electric member 407. These electrodes 408 and 409 are preferably films of Au/Ni made by an electroless plating or of Au/Ni or Au/Cr deposited by sputtering. The electrodes preferably have a thickness of 0.1–10 μm. Further, the piezo-electric member 407 is polarized in a direction from the individual electrode 408 to the common electrode 409 as shown in FIG. 45 by arrow P. The overall surface of piezo-electric member 407 is preferably protected by first applying polyimide resin by a spin-coat method, and second heating it over 180° C. for about an hour to cure polyimide prevents the piezo-electric member from absorbing moisture from the air, which results in a reduction of the deformation of the piezo-electric member when it is biased. This coating may be eliminated if the piezo-electric member is made of a material having great resistance to humidity invasion.

Attached to the front end, i.e., right hand side in FIG. 45, of an integrated unit is a nozzle plate 410 made of polyimide film having a thickness of, for example, about 25–200 μm. This nozzle plate 410 has a plurality of nozzles 411 formed at equal spacing intervals by, for example, an excimer laser. This spacing interval is about 42.3–254 μm corresponding to pixel density of 600–100 dpi.

The first plate 401 has a back plate 412 at its rear end. Further, the first plate 401 has a front plate 413 confronting the back plate 412. Provided between back and front plates 412 and 413 is a channel 414 for supplying ink into the ink chamber 404. This channel 414 communicates with ink chamber 404 through an ink inlet 415.

Referring to FIG. 45, the piezo-electric member 407 is bonded to the bottom of the slot 406 only over a region S outside the ink chamber 404. However, the piezo-electric member 407 is not bonded to the second plate 405 in a free end region T where ink chamber 404 confronts thereto.

The piezo-electric member 407 is extends out beyond the back plate 412. Each individual electrode 408 is electrically connected to an electrically conductive adhesive which extends along the member and under back plate 412. This adhesive is further connected through a driver IC and the controller 116 (see FIG. 8) to which the image signals are input. Therefore, voltages in response to image signals are applied through the controller 116 to piezo-electric member 407. The common electrode 409, on the other hand, is connected to the ground through a electrically conductive adhesive.

Ejection of ink droplets from the ink jet head 404 will be described below. The ink is supplied from the ink supply through the ink supply channel 414 and then ink inlet 415 to ink chamber 404. When a positive pulse voltage is applied to the individual electrode 408 on the piezo-electric member 407 from the power supply means or controller 116, an electric field is developed from the individual electrode 408 to the common electrode 409, as illustrated by arrow E, which is parallel to the polarization direction as indicated by arrow P. As a result, the portion of piezo-electric member in the un-bonded free region T deforms as shown by dotted lines. Repetition of the pulses causes the piezo-electric member to vibrate. Further, when the piezo-electric member moves toward partition wall 403, it forces the partition into the ink chamber 404. This reduces the volume in the ink chamber 404, which pressurizes the ink causing it to eject through nozzle 411 toward a sheet moving past under the nozzle 411.

Upon turning off the voltage, the piezo-electric member 407 returns to its original position, while the partition wall 403 follows the piezo-electric member 407 maintaining contact therewith due to its elasticity. Consequently, the ink chamber 404 recovers to its original volume, thereby causing ink to be supplied through the ink inlet 415 to ink chamber 404 preparation for the next ink ejection.

Each nozzle 411 ejects ink droplets independently in response to image signals to produce an image line image. This could be repeated for each nozzle 411, an image corresponding to the image signal is reproduced on the recording sheet.

According to the ink jet head 400 of this embodiment, as described because the portions of the piezo-electric member in the free region T as not bonded to the second plate 405, but simply retained between the bottom of the slot 406 and partition wall 403, no vibration of the piezo-electric member is transmitted to the neighboring piezo-electric members via plate 405, which minimizes cross-talk from chamber to chamber. Also, no ink is ejected unintentionally, or no disturbance in the ink could occur, and thereby the ink is ejected stably. Consequently, no variation in size of ink dots occurs, which increases the quality of the printed images.

Further, the partition wall 403 keeps the piezo-electric member 407 from being in contact with the ink. Therefore, no ink is absorbed in the piezo-electric member, which keeps its original electronic resistance. Consequently, an ejection efficiency of the ink is improved so that a stability and reliability of ink jet head 400 is increased.

Although, in the previous embodiment, to prevent the piezo-electric member from deforming in the fixed regions, no common electrode is provided in that region, this can also be achieved by eliminating the polarization in that region or by bonding the piezo-electric member in the region using an adhesive which keeps its elasticity even after hardening to absorb the deformation of the member.

Figure 47:
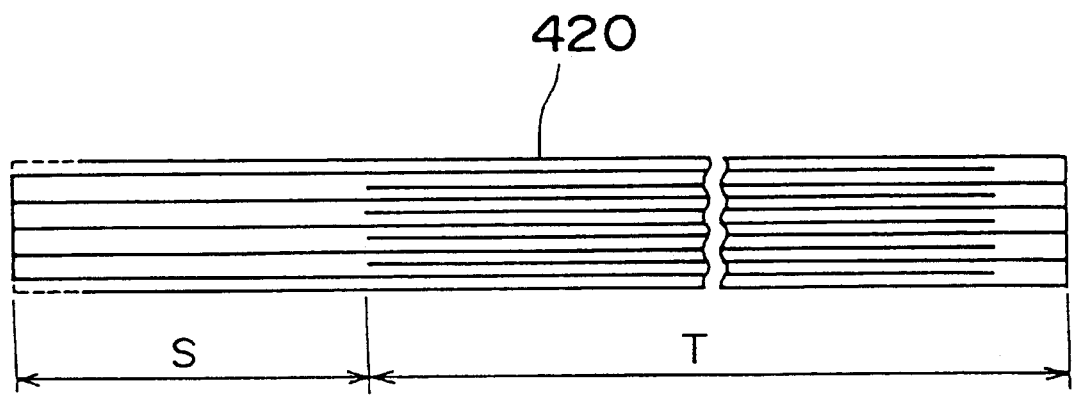
FIG. 47 illustrates a modification of piezo-electric member.

The piezo-electric member may have a single-layer or multi-layer structure as shown in FIG. 47. It is well known that the multi-layered piezo-electric member 420 can be manufactured by a green-sheet method, in which the individual and common electrode layers can be arranged therein. This multi-layered piezo-electric member provides a greater deformation as the number of the layers increases and therefore the same amount of deformation can be obtained with less voltage than the single-layered piezo-electric member, which results in a cost reduction of the driver.

Figure 48:
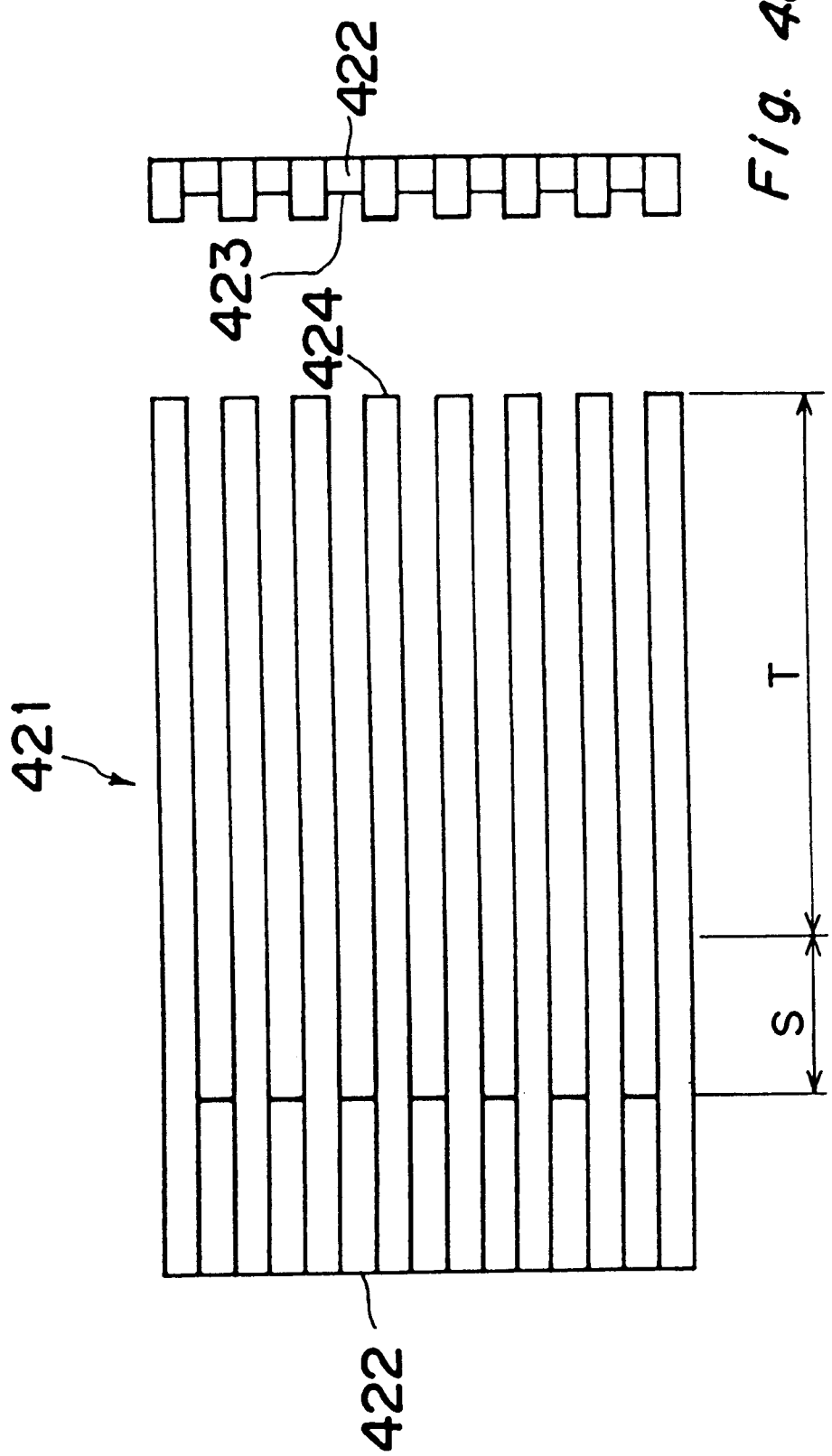
FIGS. 48A–48B show an integrated driver used in the electro-mechanical transducer of the fourth embodiment.

Although in this embodiment, each piezo-electric member is separated from others, the piezo-electric members may be manufactured as a single unit as shown in FIGS. 48A–48B. FIGS. 48A–48B show the piezo-electric unit 421 in the form of a fork, in which a number of parallel, mutually-spaced piezo-electric members are connected at one ends to a connecting portion 422. The unit 421 is made from a single plate of piezo-electric material produced by a dicing process. In this dicing process, a cutter (not shown) is moved from one end to form a groove 423 toward the other end, and after moving past the connecting portion 422, the cutter moves downward to separate each piezo-electric member 424 from others and then continues to the other end. This unit is placed on the lower plate with each piezo-electric member being positioned in a respective slot while the connecting portion occupies the fixing region.

E. APPLICATIONS OF ELECTRO-MECHANICAL TRANSDUCER

The electro-mechanical transducer of the present invention may be used not only for the ink jet recording apparatus as described above, but also for a piezo-electric vibrator to be used in another piezo-electric ink jet recording apparatus. Referring to the drawings, several embodiments of the piezo-type ink jet recording device will be described below. It should be noted that, in each embodiment described below, assume that arrangement of individual and common electrodes and polarizing direction of piezo-electric members are the same as the first embodiment shown in FIG. 5, except directions of the voltages to be applied to the electrodes.

Figure 49:
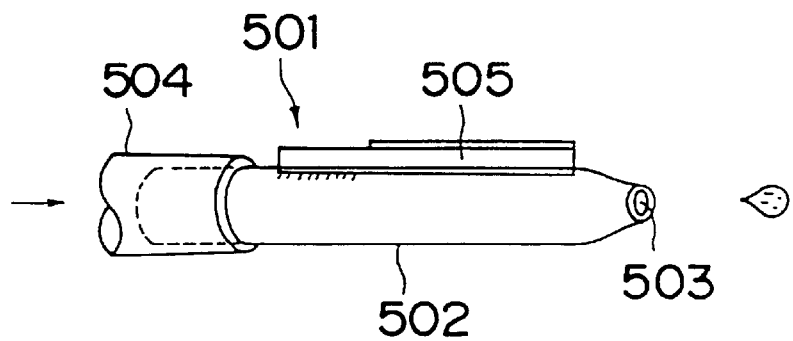
FIG. 49 is a perspective view of a semi-gould type ink jet head in which the electro-mechanical transducer of the present invention is used.

FIG. 49 shows a Zoltan-type ink jet head 501, in which the transducer is used as a piezo-electric vibrator. The ink jet head 501 includes a cylindrical nozzle 502 preferably made of glass. This nozzle 502 has defined an orifice 503 at its front portion. Also, the nozzle 502 is connected at its rear portion to a tube 504 for supplying ink into the nozzle. Mounted on and along an outer surface of the nozzle 502 is a piezo-electric vibrator 505 which is in the form of a column, having a rectangular in cross-section. This vibrator 505 is bonded on the nozzle at its rear end portion, which permits the other front end of the vibrator 505 to deform.

In operation, ink is supplied through tube 504 into the nozzle 502. Upon applying a voltage to the piezo-electric vibrator 505 in response to an image signal, the piezo-electric vibrator 505 contracts and bends in its front portion to force the nozzle 505, which causes the ink in the nozzle 505 to ejected from the orifice 502. This ejected ink is then deposited on a recording medium (not shown).

Figure 50:
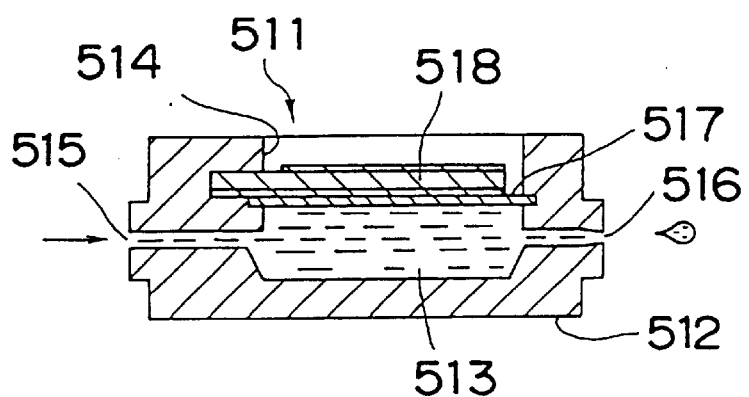
FIG. 50 is a cross-sectional view of a cyronics type ink jet head in which the electro-mechanical transducer of the present invention is used.

FIG. 50 shows a Kyser-type ink jet head 511, in which the transducer is used as a piezo-electric vibrator. The ink jet head 511 has a nozzle 512 in which an ink chamber 513 is defined. The ink chamber 513 has an opening 514, an ink inlet 515, and an ink outlet 516. Further, the opening 514 is closed with a cover 517 preferably made of metal. Arranged outside and on the cover 517 is a piezo-electric vibrator 518 which is firmly supported by the ink chamber 512 at its one end. With this ink jet head 511, ink is supplied through the ink inlet 515 into the ink chamber 513. When a voltage is applied to the piezo-electric vibrator 518, according to an image signal, the piezo-electric member 518 deforms and bends to force the metal cover 517, which reduces the volume of the ink chamber 513 to eject the ink from the ink outlet 516. This ejected ink is then deposited on the sheet (not shown).

Figure 51:
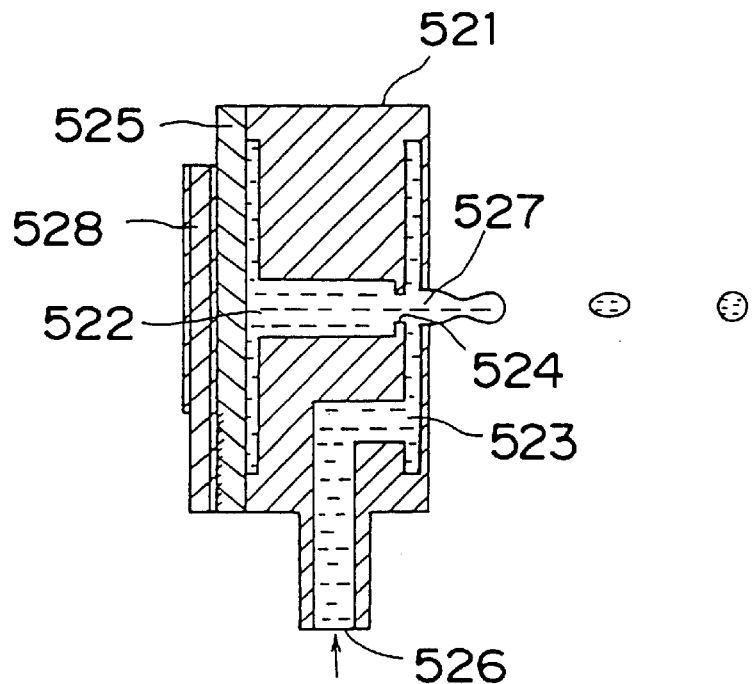
FIG. 51 is a cross-sectional view of a stemme type ink jet head in which the electro-mechanical transducer of the present invention is used.

FIG. 51 shows a stemme-type ink jet head 521, in which the transducer is used as a piezo-electric vibrator. The ink jet head 521 has therein a pressure chamber 522 and an ink supply chamber 523. These chambers 522 and 523 are connected to each other through a passage 524. The pressure chamber 522 is closed by a cover 525, while the ink supply chamber 523 has an ink inlet 526 and an ink outlet 527. Further, arranged outside and on the cover 525 is a piezo-electric member 528 which is bonded -to the cover 525 at its one end portion.

In operation, ink is supplied through the ink inlet 526 into the ink chamber 523. When a signal of an image is applied to the piezo-electric vibrator 528, the piezo-electric vibrator 528 bends and presses the cover 525, which pressurizes the ink in the pressure chamber 522. This pressure is transmitted through the passage 524 to the ink supply chamber 523, which causes the ink to move through the nozzle 527 to be ejected therefrom and then to be deposited on a sheet (not shown).

The following descriptions are embodiments of other recording apparatus other than inkjet printers in which the electro-mechanical transducers are employed therein. It should be noted that, in each embodiment described below, assume that the arrangement of individual and common electrodes and polarizing direction of piezo-electric members are the same as the first embodiment shown in FIG. 5.

Figure 52:
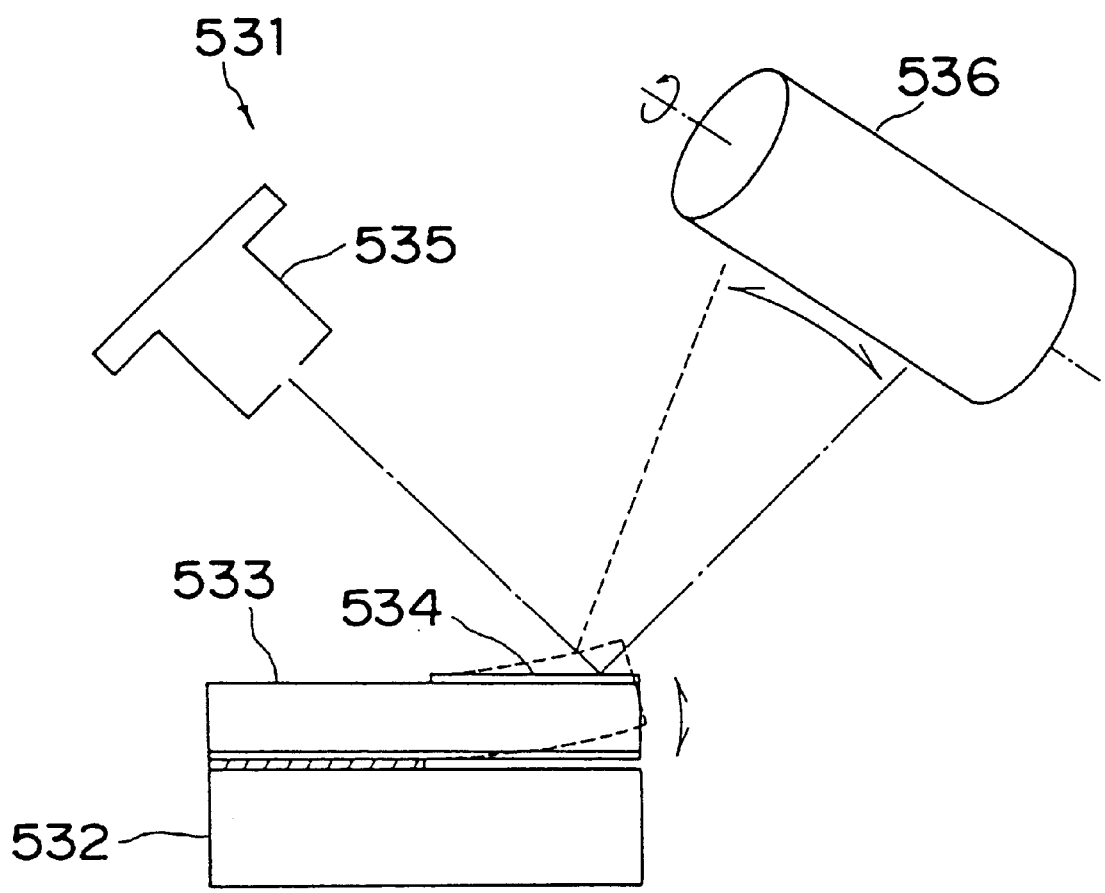
FIG. 52 shows a beam scanner in which the electro-mechanical transducer of the present invention is used.

FIG. 52 illustrates a beam scanner 531 used in a surveying instrument. The scanner 531 includes a base plate 532 and a piezo-electric member 533. This member 533 is secured at one end portion thereof and has an electrode-mirror 534 at the other end thereof. This electrode-mirror 534 is made on the surface of one electrode by polishing the surface by a diamond polisher and then depositing aluminum by sputtering. The beam scanner 531 further includes a laser device 535 which emits a laser beam therefrom toward the electrode-mirror 534 and an object, e.g., a cylindrical photoreceptor 536 to which the reflected laser beam from the electrode-mirror 534 is illuminated thereon.

With this beam scanner 531, if a voltage is applied to the piezo-electric member 533, the piezo-electric member 533 bends. As a result, the laser beam emitted from the laser device 535 which is polarized, is reflected from the electrode-mirror 534 and is scanned on the photoreceptor 536 to form an image such as electrostatic latent image.

Figure 53:
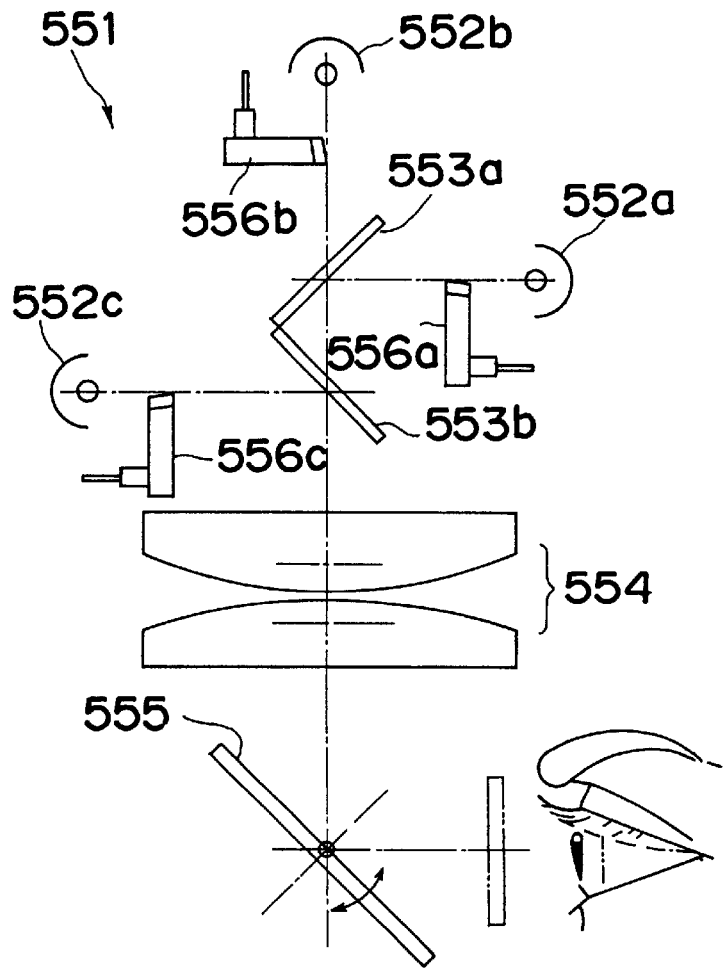
FIG. 53 shows a display device in which the electro-mechanical transducer of the present invention is used.

FIG. 53 illustrates a display device 551 which is mounted on a head mount for virtual-reality. The device 551 includes three light sources 552a, 552b, and 552c, a first reflection mirror 553a, a second mirror 553b, a lens assembly 554, and a galvanomirror or resonance mirror 555. The light sources emit strip-like lights of red (R), green (G), and blue (B), respectively. The first mirror 553a reflects the R light from the light source 552a and permits the G light to move past, so that the R light and the G light are combined in the same plane. The second mirror 553b reflects the B light from the light source 552c and permits the combined R-G light to move past therethrough so that the B light and the combined R-G light are further combined in the same plane. The lens assembly concentrates the combined RGB light. The resonance mirror 555 reflects the concentrated RGB light toward an operator.

Figure 54:
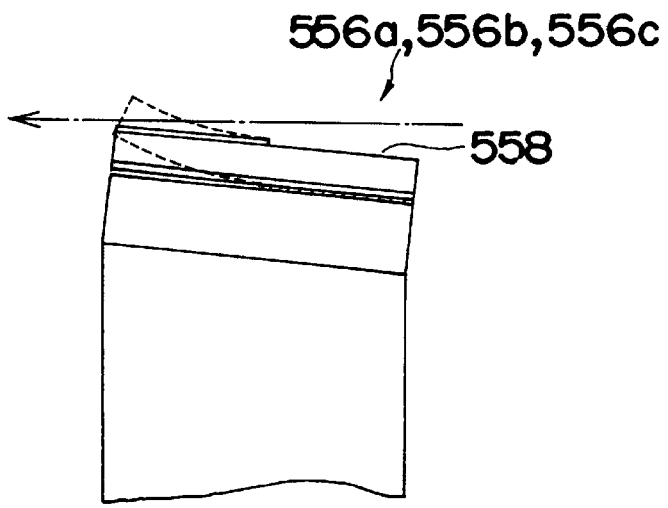
FIG. 54 shows a deformation of an electro-mechanical transducer in the display device FIG. 53.

Arranged between the first mirror 553*a* and the light source 552*a*, between the first mirror 553*a* and the light source 552*b*, and between the second mirror 553*b* and the light source 552*c* are shutters 556*a*, 556*b*, and 556*c*. As shown in FIG. 54, each shutter 556*a*, 556*b*, or 556*c* includes a number of piezo-electric members 558. These members 558 may be arranged independently side by side or be integrated into a fork-like unit. Each electrode 558 is extended to an associated light passage and is inclined with respect to the light passage, such that, once a voltage is applied thereto, it deforms to block the associated light passage as shown by dotted lines.

The display device 551 analyzes the strip-like horizontal image light into a plurality of line image lights, i.e., pixels, the number of which corresponding to that of members 558. Further, each of the piezo-electric members is biased so as to generate a specific color image corresponding to the pixel. Especially, if the pixel is to be reproduced in red color, the piezo-electric member 558 of the associated R shutter is not biased while the piezo-electric members 558 of the associated G and B shutters are biased. As a result, the R light from the light source 552*a* advances without being shut by the shutter 556*a* while the G and B lights from respective light sources 556*b* and 556*c* are shut. Therefore, only the R light is reflected by the second mirror 553*a*, moves past the lens assembly 554, again reflected by the galvanomirror 555, and finally concentrated in front of the eyes of the operator. Further, other pixels are concentrated in front of the operator's eyes, which forms a line color image to be reproduced. Like this, different color line images are reproduced one by one. These line images are reproduced in different positions in space based upon a rotation of the galvanomirror 555, thereby a plane image is reproduced on the eyes of the operator.

Figure 55:
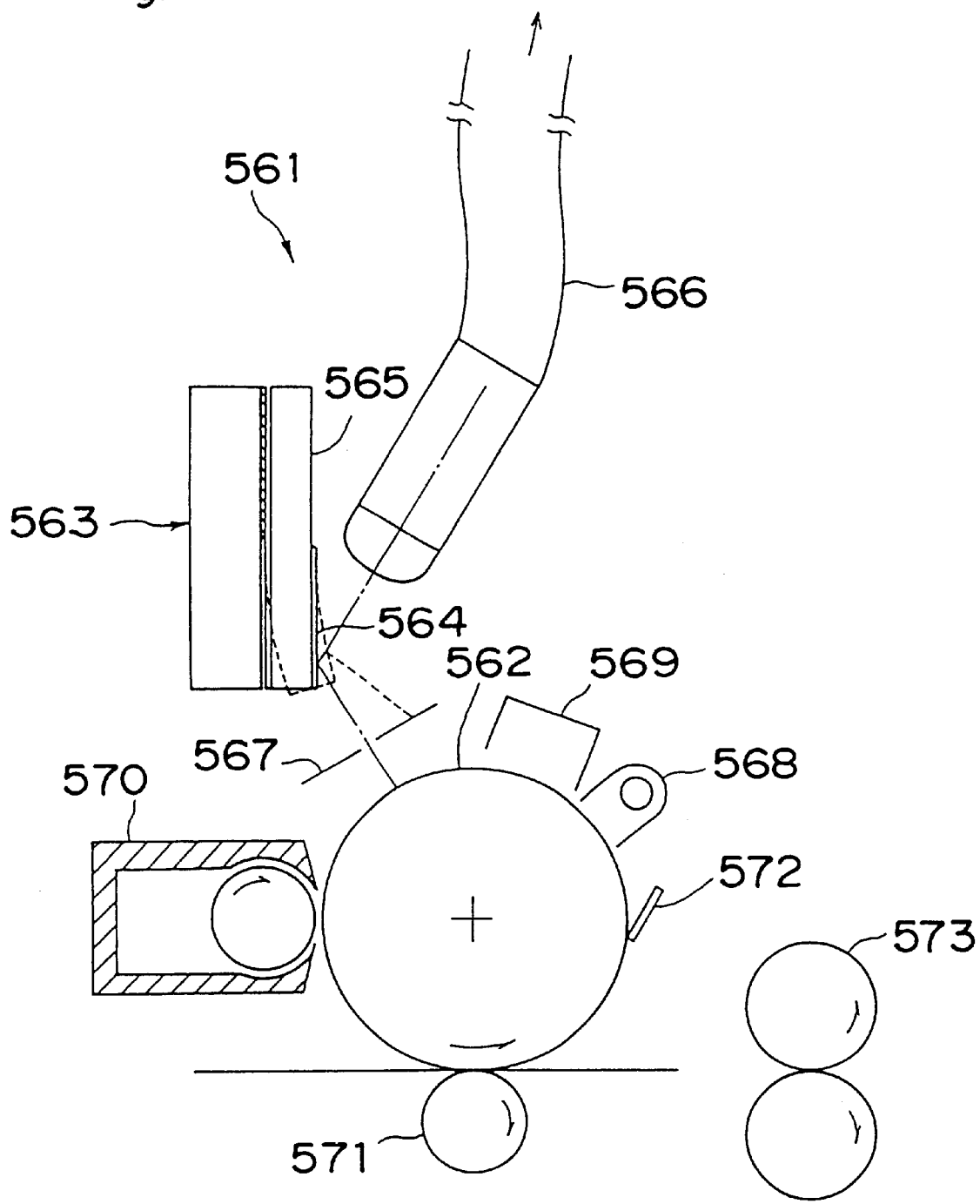
FIG. 55 shows an electro-photographic printer in which the electro-mechanical transducer of the present invention is used.

FIG. 55 shows an electrophotographic printer 561. This printer 561 includes the electro-mechanical transducer as an image writing head 563 which illuminates a line image extending in a longitudinal direction to a photoreceptor 562 and which forms an electrostatic latent image thereon. The head 563 has a plurality of piezo-electric members 565. 565 which are preferably integrated into a fork-like unit as described in the previous embodiment. Each free end portion thereof, i.e., electrode-mirror 564, is directed toward the photoreceptor 562. Illuminated on the electro-mirrors 564 is a strip-like light from a halogen light source (not shown) which is directed through a bundle of optical fibers 566. The illuminated light from the optical fibers 566 is reflected by the electrode-mirror 564. Then, if no voltage is applied to the piezo-electric member 565, the reflected. light moves past a slit 567 and then illuminates the photoreceptor 562 at an exposing station. If a voltage is applied to the member 565, the member 565 bends so that the reflected light is blocked by the slit 567 as shown by dotted lines.

With respect to a rotational direction of the photoreceptor, arranged on the upstream side from the exposing station are an eraser 568 and a charger 569 while arranged on the downstream side from the exposing station are a developer 570, a transfer roller 571, and a cleaner 572. Further, a fixing roller 573 is arranged in the downstream region of the transfer roller 571 with respect to a traveling direction of the sheet.

With this printer 561, during the rotation of the photoreceptor 562, the eraser 568 eliminates residual electrical charge on the photoreceptor 562. Then the charger 569 provides electrical charge on the photoreceptor 562. Each piezo-electric member 565 is biased according to image signals, thereby an electrostatic latent image corresponding to the image signals is reproduced on the photoreceptor 562. The electrostatic latent image is then developed into a toner image, which is transferred onto a recording sheet. The toner images on the sheet is fixed by the fixing roller 573. The sheet is then fed out from the printer. The residual toner on the photoreceptor 562 is removed therefrom by the cleaner 572.

Figure 56:
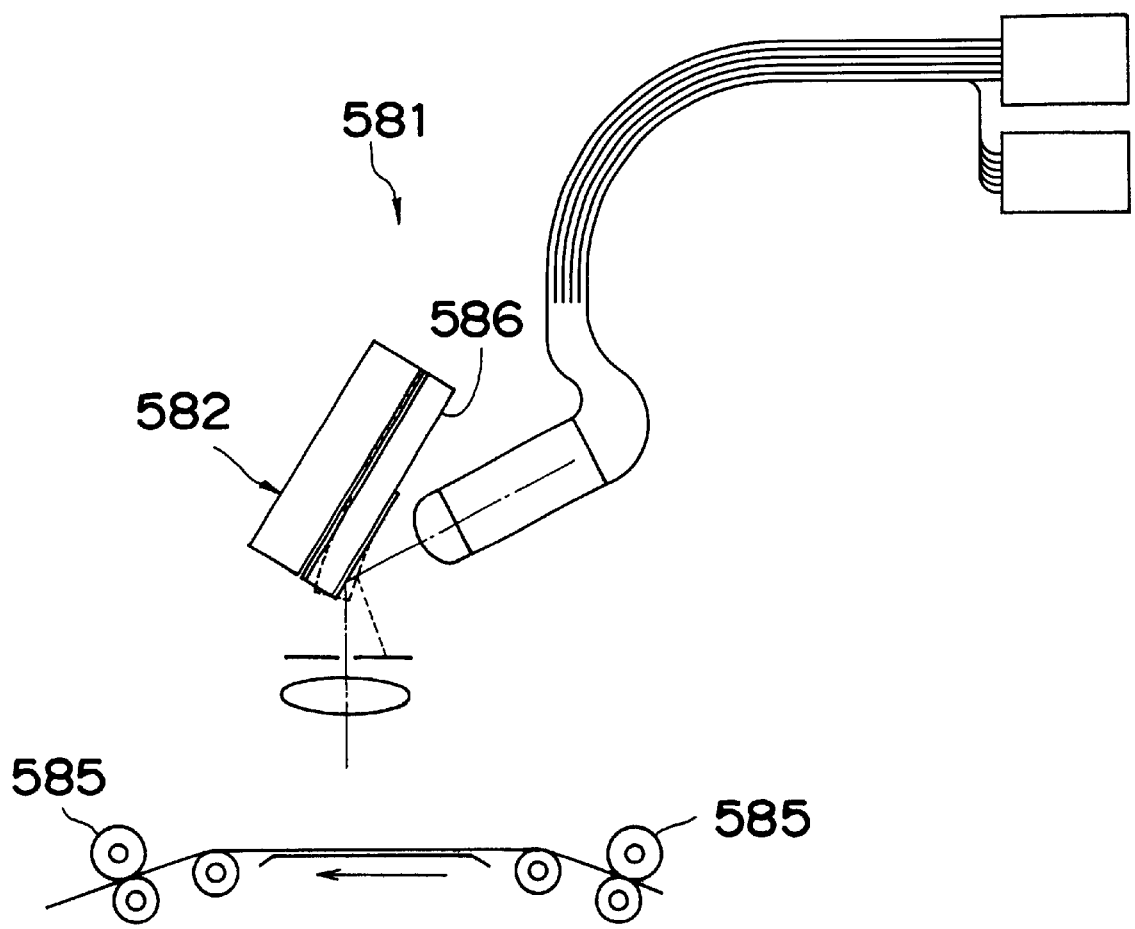
FIG. 56 shows an photographic colort printer in which the electro-mechanical transducer of the present invention is used.

FIG. 56 shows a photographic color printer 581. The printer 581 includes a light writing head 582 which illuminates a strip-like writing light onto a printing paper to form an electrostatic latent image thereon, which is similar to the head 563 of the printer 561 shown in FIG. 55. This head 582 has a light source in which a RGB filter (not shown) that is changeable by a controller 584 is mounted.

With this printer 581, first the R filter is set by the controller 584 and the printing paper is transported by transfer rollers 585 in the direction shown by an arrow. Then, upon biasing a specific voltage to each piezo-electric member 586, a R-image is reproduced on the paper. Next, the printing paper on which the image is reproduced is transported in the arrow direction, and then is developed, fixed, and finally dried.

F. MATERIALS

Next described are materials and the like that may be applied to the ink-jet heads of the above-described embodiments.

Materials for Piezo-electric Member

The following piezo-electric materials are applicable for the piezo-electric members:

(1) Piezo-electric Crystals

Crystals such as quarts ($SiO_2$), Rochelle salt (RS: $NaKC_4H_4O_6 \cdot 4H_2O$), ethylenediamine tartrate (EDT: $C_6H_{14}N_2O_6$), potassium tartrate (DKT: $K_2C_4H_4O_6 \cdot 1/2H_2O$), dibasic ammonium phosphate (ADP: $NH_4H_2PO_4$), perovskite type crystals (e.g., $CaTiO_3$, $BaTiO_3$, PLZT), tungsten bronze type crystals (e.g., $Na_xWO_3$ ($0.1<X<0.28$)), sodium barium niobate ($Ba_2NaNb_5O_{15}$), lead potassium niobate ($Pb_2KNb_5O_{15}$), lithium niobate ($LiNbO_3$), lithium tantarate ($LiTaO_3$), and sodium chlorate ($NaClO_3$), tourmaline, zincblende. (ZnS), lithium sulfate ($LiSO_4 \cdot H_2O$), lithium methagallate ($LiGaO_2$), lithium iodate ($LiIO_3$), glycine sulfate (TGS), bismuth germanate ($Bi_{12}GeO_{20}$), lithium germanate ($LiGeO_3$), barium germanium titanate ($Ba_2Ge_2TiO_3$) and the like.

(2) Piezo-electric Semiconductors

Wurtzite, BeO, ZnO, CdS, CdSe, AlN (3) Piezo-electric Ceramics

Barium titanate ($BaTiO_3$), lead titanate zirconate ($PbTiO_3 \cdot PbZrO_3$), lead titanate ($PbTiO_3$), barium lead niobate (($Ba$—$Pb$)$Nb_2O_6$).

(4) Molded bodies of the dispersed powder of (1) piezo-electric crystals, (2) piezo-electric semiconductors or (3) piezo-electric ceramics in plastics may be used.

(5) Piezo-electric Polymers

Polyvinylidene fluoride PVDF (—$CH_2$—$CF_2$—)$_n$, polyvinylidene fluoride/PZT, rubber/PZT, copolymers of trifluoroethylene and fluorinated vinylidene, copolymers of vinylidene cyanide and vinyl acetate, polyvinylidene tetrachloride and the like.

The piezo-electric materials listed above may be used through the process of polarizing them and then forming them into a piezo-electric member, or the process of forming them into a piezo-electric member and then polarizing. The piezo-electric members may be also laminated, as required, so that they can be driven at low voltage.

Overcoat Treatment of Piezo-electric Member

Overcoat treatment of the piezo-electric members can be performed by any of the following methods (1) to (5):

(1) Application of Plastics

Thermoplastic resins such as saturated polyester resin, polyamide resin, polyimide resin, acrylic resin, aramid resin, ethylene-vinyl acetate resin, ion cross-linked olefin copolymer (ionomer), styrene-butadiene block copolymer, polyacetal, polycarbonate, vinyl chloride-vinyl acetate copolymer, cellulose ester, polyimide, styrol resin and the like.

Thermosetting resins such as epoxy resin, phenoxy resin, urethane resin, nylons, silicone resin, fluorinated silicone resin, phenol resin, melamine resin, xylene resin, alkyd resin, thermosetting acrylic resin and the like.

Photoconductive resins such as polyvinyl carbazole, polyvinyl pyrene, polyvinyl anthracene, polyvinylol and the like.

These resins may be used singly or in combinations.

Other materials such as engineering plastics like liquid crystal polymers or mixtures of plastics with powder or whiskers may be conveniently used while photosensitive resins or photoresist resins for making thick films are also applicable. Bakelite, fluorinated resins or glass-epoxy resins (epoxy resin mixed with glass fillers) may also be used. Any application methods of liquids, such as coating, dipping or spraying, known in the art can be used for these materials.

Of these materials, polyimide resin, aramid resin, epoxy resin, phenoxy resin, fluorinated silicone resin, fluorinated resin and glass-epoxy resin show especially good effects.

(2) Deposition of Metal Oxide, Nitride or Sulfide Compounds

Metal oxide compounds ($SiO_2$, SiO, CrO, $Al_2O_3$ and the like), metal nitride compounds ($Si_3N_4$, AlN and the like), metal sulfide compounds (ZnS and the like) or alloys of them are used for coating by vacuum deposition or sputtering.

The plastics of (1) described above or Parylene resins may be applied by deposition.

Among the materials above, $Al_2O_3$, $Si_3N_4$ or Parylene resins have excellent effects.

(3) Application of Hydrocarbon Compounds

Hydrocarbon compounds containing group IV elements represented by hydrocarbons, oxygen-containing hydrocarbons or sulfur-containing hydrocarbons, nitrogen-containing hydrocarbons, silicon-containing hydrocarbons, halogen-containing hydrocarbons represented by fluorine-containing hydrocarbons or hydrocarbons containing group III elements are applied by P-CVD (plasma CVD) for overcoat treatment. A mixed gas of these materials may be also used for application by P-CVD.

Fluorine-containing hydrocarbons have a good effect among the materials described above.

In forming coating films of the materials above, an appropriate undercoat by a-Si (amorphous silicon), a-SiC, a-SiN or the like must be applied depending on the compatibility for adhesion to the piezo-electric member.

(4) Instead of applying the plastics of (1) directly on the plate surface of the piezo-electric member in coating liquid state, the portion for forming a piezo-electric member is immersed in vacuum to replace the portion with the plastics, thereby forming a plastic-coated piezo-electric member.

(5) The surface of the plate of the piezo-electric member is subjected to surface treatment with an ink-repelling solvent.

When the properties of the overcoat films prepared by the methods described in (1) to (5) are compared with one another, the following characteristics are observed (wherein the films of (3) have an undercoat layer).

1 Strength:

Strong (2), (3)>(1), (4)>(5) Weak

2 Smoothness:

Good (1), (4)>(2), (3), (5) No good

3 Adhesion (including vibration-resistance)

Strong (1), (4)>(2), (3)>(5) Weak

4 Durability (including ink-resistance)

Good (1), (4)>(2), (3)>(5) No good

The films of (5) are convenient to handle, lending themselves to post-treatment for (1) to (4). The films of (1) and (4) are particularly low cost.

The methods (1) to (5) described above may be used in appropriate combinations according to the piezo-electric member or the type of the ink.

Materials for Top Plate, Base Plate and Operating Member

Examples of the materials that can be used for the top-plate, base-plate and operating member are listed in (1) to (4) below.

(1) Ceramics $Al_2O_3$, SiC, C, $BaTiO_3$, $BiO_3.3SnO_2$, $Pb(Zr_x, Ti_{1-x})O_3$, ZnO, $SiO_2$, $(1'X)Pb(Zr_x, Ti_{1-x})O_3+(X)La_2O_3$, $Zn_{1-x}Mn_xFe_2O_3$, $\gamma$-$Fe_2O_3$, $Sr.6Fe_2O_3$, $La_{1-x}Ca_xCrO_3$, $SnO_2$, transition metal oxides, ZnO—$Bi_2O_3$, semiconductor $BaTiO_3$, $\beta$-$Al_2O_3$, stabilized zirconia, $LaB_6$, $B_4C$, diamond, TiN, TiC, $Si_3N_4$, $Y_2O_2S$:Eu, PLZT, $ThO_2$, —$CaO.nSiO_2$, $Ca_5(F, Cl)P_3O_{12}$, $TiO_2$, $K_2O.nAl_2O_3$. (2) Glasses Element glass=Si, Se, Te, As Hydrogen bonded glass=$HPO_3$, $H_3PO_4$, $SiO_2$, $B_2O_2$, $P_2O_5$, $GeO_2$, $As_2O_3$ Oxide glass=$Sbo_3$, $Bi_2O_3$, $P_2O_3$, $V_2O_5$, $Sb_2O_5$, $As_2O_3$, $So_3$, $Zro_2$ Fluoride glass=$BeF_2$, Chloride glass=$ZnCl_2$ Sulfide glass=$GeS_2$, $As_2S_3$ Carbonate glass=$K_2CO_3$, $MgCO_3$ Nitrate glass=$NaNO_3$, $KNO_3$, $AgNO_3$ Sulfate glass=$Na_2S_2O_3.H_2O$, $Tl_2SO_4$, alum Silicate glass=$SiO_2$ Silicate alkaline glass=$Na_2O$—CaO—$SiO_2$ Potassium lime glass=$K_2O$—CaO—$SiO_2$ Sodium lime glass=$Na_2O$—CaO—$SiO_2$ Lead glass Barium glass Borosilicate glass (3) Plastics Thermoplastic resins such as saturated polyester resin, polyamide resin, polyimide resin, aramid resin, acrylic resin, ethylene-vinyl acetate resin, ion crosslinked olefin copolymer (ionomer), styrene-butadiene block copolymer, polyacetal, polyphenylene sulfide, polycarbonate, vinyl chloride-vinyl acetate copolymer, cellulose ester, polyimide, styrol resin and the like.

Thermosetting resins such as epoxy resin, phenoxy resin, urethane resin, nylon resin, silicone resin, phenol resin, melamine resin, xylene resin, alkyd resin, thermosetting acrylic resin and the like.

Photoconductive resins such as polyvinyl carbazol, polyvinyl pyrene, polyvinyl anthracene, polyvinyrol and the like.

The materials listed in (1) to (3) above may be used singly or in combinations.

Other materials such as engineering plastics like liquid crystal polymers or mixtures of plastics with powder, whiskers, or glass fillers may also be used.

Photosensitive resins or photo-resist resins for making thick films may also be used while Bakelite, fluorinated resins or glass-epoxy resins (epoxy resins mixed with glass fillers) are also applicable.

(4) The Others

Rubbers and synthetic rubbers may also be used, while all kinds of metals are also applicable provided the side face adjacent to the ink chamber is coated with an insulating film.

The materials listed in (1) to (4) are machined or molded into the top-plate 20 after processing them into plate form, or they may be first formed into the top-plate 20 by pattern etching or photosetting.

Materials for Adhesives

The following materials (1) to (4) can be used for adhesives to assemble the ink-jet head. Electric conductance of the materials are, of course, required when the adhesive layer is used as a conductor for grounding the common electrodes.

(1) Thermosetting resin adhesives of epoxy resin, phenol resin, phenoxy resin, acrylic resin, furan resin, polyurethane resin, polyimide resin, silicone resin and the like.

(2) Thermoplastic resin adhesives of polyvinyl acetate, polyvinyl chloride, polyvinyl acetal, polyvinyl alcohol, polyvinyl butyrl and the like.

(3) UV setting resin adhesives (4) Anaerobic setting adhesives

Materials for Partition Wall

Examples of the materials for the partition wall are as follows.

(1) Thermosetting resins such as epoxy resin, phenoxy resin, urethane resin, nylons, silicone resin, fluorinated silicone resin, phenol resin, melamine resin, xylene resin, alkyd resin, thermosetting acrylic resin and the like. Of these, epoxy resin, phenoxy resin and fluorinated silicone resin are preferable for use.

(2) Thermoplastic resins such as saturated polyester resin, polyamide resin, acrylic resin, aramid resin, ethylene-vinyl acetate resin, ion cross-linked olefin copolymer (ionomer), styrene-butadiene block copolymer, polyacetal, polyphenylene sulfide, polycarbonate, vinyl chloride-vinyl acetate copolymer, cellulose ester, polyimide, styrol resin and the like.

Of the materials above, aramid resin, polyimide resin, polyamide resin and ethylene-vinyl acetate resin are suitable for use.

(3) Liquid crystal polymers (4) Photosensitive resin, photoresist resins for making thick films (5) Rubber, synthetic rubber (6) Thin plates of nickel, stainless steel, titanium, tungsten and the like.

The materials listed in (1) to (5) above may be used singly or in combinations.

Comparisons of the properties of the materials listed in (1) to (6) revealed that materials (1) to (3) are comparable with one another, while exhibiting the features as follows:

Superior (1) to (3)>(4)>(6)>(5) Inferior

A thickness of the material of 100 $\mu$m or less, desirably 50 $\mu$m or less is preferable.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A light control apparatus comprising:

a base member; and an actuator for controlling light, said actuator comprising:
   a piezoelectric member extending in a longitudinal direction, said piezoelectric member having a first surface along the longitudinal direction and a second surface opposing said first surface, a first portion of said first surface being fixedly connected with said base member, a second portion of said first surface not being connected with said base member;
   a first electrode disposed on both the first and second portions of said first surface; and
   a second electrode disposed on said second surface of said piezoelectric member;

wherein said second surface of said piezoelectric member includes first and second portions thereof, which oppose, respectively, said first and second portions of said first surface;

wherein said second electrode is disposed on said second portion of said second surface, said first portion of said second surface being substantially free from coverage by said second electrode;

wherein said piezoelectric member is adapted to deform in response to a voltage applied between said first and second electrodes.

2. An apparatus comprising:

a light source; and an actuator for controlling light, said actuator comprising:
   a piezoelectric member having first and second opposing surfaces, each of the first and second surfaces including first and second non-overlapping portions thereof, the first portion of the first surface substantially opposing the first portion of the second surface, the second portion of the first surface substantially opposing the second portion of the second surface;
   a first electrode provided on the first and second portions of the first surface of the piezoelectric member;
   a base member, the first portion of one of the first surface and the second surface of the piezoelectric member being fixedly connected to the base member so that a portion of the first electrode is disposed between the base member and the piezoelectric member; and
   a second electrode provided on the second portion of the second surface of the piezoelectric member, the first portion of the second surface being substantially free from coverage by the second electrode;

wherein the first and second electrodes oppose each other over an extent of the second portions of the first and second surfaces so that an electric field applied between the first and the second electrodes will cause the piezoelectric member to deform in response to the electric field substantially over an extent of the second portions of the first and second surfaces and the piezoelectric member will not substantially deform over an extent of the first portions of the first and second surfaces;

wherein the actuator is positioned relative to the light source such that the path of light reflected from the actuator is altered in accordance with variations in the electric field applied between the first and second electrodes.

3. An apparatus in accordance with claim 2,
wherein said actuator passes and blocks light from the light source in accordance with a deformation of said piezoelectric member.

4. An apparatus in accordance with claim 2,
wherein said actuator scans light from the light source in accordance with a deformation of said piezoelectric member.

5. An apparatus in accordance with claim 4, wherein said second electrode is disposed on said second surface and has a mirror surface for reflecting light.

6. An apparatus in accordance with claim 2,
wherein light is incident thereon and the actuator controls a direction of reflection of light therefrom in accordance with a deformation of said piezoelectric member.

7. An apparatus in accordance with claim 6, wherein said second electrode is disposed on said second surface and has a mirror surface for reflecting light.

8. A light control apparatus comprising:
a base member; and
a plurality of actuators, each of said actuators for controlling light, each of said actuators comprising:
a piezoelectric member extending in a longitudinal direction, said piezoelectric member having a first surface along the longitudinal direction and a second surface opposing said first surface, a first portion of said first surface being fixedly connected with said base member, a second portion of said first surface not being connected with said base member;
a first electrode disposed on both the first and second portions of said first surface; and
a second electrode disposed on said second surface of said piezoelectric member;

wherein said second surface of said piezoelectric member includes first and second portions thereof, which oppose, respectively, said first and second portions of said first surface;

wherein said second electrode is disposed on said second portion of said second surface, said first portion of said second surface being substantially free from coverage by said second electrode;

wherein said piezoelectric member is adapted to deform in response to a voltage applied between said first and second electrodes.

9. A light control apparatus in accordance with claim 8, wherein each of said actuators are individually connected to said base member.

10. A light control apparatus in accordance with claim 8, wherein said plurality of actuators comprise a fork-like unit.

11. An apparatus comprising:
at least one light source;
a base member; and
a plurality of actuators, each of said actuators for controlling light, each of said actuators comprising:
a piezoelectric member extending in a longitudinal direction, said piezoelectric member having a first surface along the longitudinal direction and a second surface opposing said first surface, a first portion of said first surface being fixedly connected with said base member, a second portion of said first surface not being connected with said base member;
a first electrode disposed on both the first and second portions of said first surface; and
a second electrode disposed on said second surface of said piezoelectric member;

wherein said second surface of said piezoelectric member includes first and second portions thereof, which oppose, respectively, said first and second portions of said first surface;

wherein said second electrode is disposed on said second portion of said second surface, said first portion of said second surface being substantially free from coverage by said second electrode; and wherein said piezoelectric member is adapted to deform in response to a voltage applied between said first and second electrodes;

wherein at least one of the plurality of actuators is positioned relative to the at least one light source such that the path of light from the at least one light source is altered in accordance with variations in the electric field applied between the first and second electrodes of the at least one actuator.

12. An apparatus in accordance with claim 11, further comprising a plurality of light sources, wherein each of said actuators passes and blocks light from a respective one of the plurality of light sources in accordance with a deformation of the corresponding piezoelectric member thereof.

13. An apparatus in accordance with claim 11, further comprising a plurality of light sources, wherein each of said actuators scans light from a respective one of the plurality of light sources in accordance with a deformation of the corresponding piezoelectric member thereof.

14. An apparatus in accordance with claim 13, wherein for each of said piezoelectric members, said second electrode is disposed on said second surface thereof and has a mirror surface for reflecting light.

15. An electro-mechanical apparatus for controlling light comprising:
a piezoelectric member having first and second opposing surfaces, each of the first and second surfaces including first and second non-overlapping portions thereof, the first portion of the first surface substantially opposing the first portion of the second surface, the second portion of the first surface substantially opposing the second portion of the second surface;
a first electrode provided on the first and second portions of the first surface of the piezoelectric member;
a base member, the first portion of one of the first surface and the second surface of the piezoelectric member being fixedly connected to the base member so that a portion of the first electrode is disposed between the base member and the piezoelectric member; and
a second electrode provided on the second portion of the second surface of the piezoelectric member, the first portion of the second surface being substantially free from coverage by the second electrode;

wherein the first and second electrodes oppose each other over an extent of the second portions of the first and second surfaces so that an electric field applied between the first and the second electrodes will cause the piezoelectric member to deform in response to the electric field substantially over an extent of the second portions of the first and second surfaces and the piezoelectric member will not substantially deform over an extent of the first portions of the first and second surfaces.

16. An electro-mechanical apparatus in accordance with claim 15, wherein the piezoelectric member is positioned relative to a light source such that light from the light source is passed and blocked in accordance with variations in the electric field applied between the first and the second electrodes.

17. An electro-mechanical apparatus in accordance with claim 15, wherein the piezoelectric member is positioned relative to a light source such that light from the light source is scanned in accordance with variations in the electric field applied between the first and the second electrodes.

18. An electro-mechanical apparatus in accordance with claim 17, wherein the second electrode has a mirror surface for reflecting light.

19. An electro-mechanical apparatus in accordance with claim 15, wherein the piezoelectric member is positioned relative to a light source such that a direction of reflection of light is selected in accordance with variations in the electric field applied between the first and second electrodes.

20. An electro-mechanical apparatus in accordance with claim 19, wherein the second electrode has a mirror surface for reflecting light.

21. A light control apparatus comprising:
a base member; and
an actuator for controlling light, said actuator comprising:
a piezoelectric member polarized in a polarizing direction and extending in a longitudinal direction orthogonal to the polarizing direction, said piezoelectric member having a first surface and a second surface, said first surface being along the longitudinal direction and being orthogonal to the polarizing direction, said second surface opposing said first surface, a first portion of said first surface being fixedly connected with said base member so that a deformation of said first portion in the longitudinal direction is restricted, a second portion of said first surface not being connected with said base member;
a first electrode disposed on at least a part of said piezoelectric member with respect to the longitudinal direction; and
a second electrode disposed on at least a part of said piezoelectric member with respect to the longitudinal direction so as to oppose said first electrode for at least a part of a longitudinal extent thereof,
wherein said second electrode at least partially opposes the first portion of the first surface of the piezoelectric member,
wherein said piezoelectric member is adapted to deform in response to an electric field generated by a voltage applied between said first and second electrodes.

22. A light control apparatus in accordance with claim 21, wherein said piezoelectric member is positioned relative to a light source such that light from the light source is passed and blocked in accordance with variations in the electric field.

23. A light control apparatus in accordance with claim 21, wherein said piezoelectric member is positioned relative to a light source such that light from the light source is scanned in accordance with variations in the electric field.

24. A light control apparatus in accordance with claim 23, wherein said second electrode is disposed on said second surface and has a mirror surface for reflecting light.

25. A light control apparatus in accordance with claim 21, wherein said piezoelectric member is positioned relative to a light source such that a direction of reflection of light is selected in accordance with variations in the electric field.

26. A light control apparatus in accordance with claim 25, wherein said second electrode is disposed on said second surface and has a mirror surface for reflecting light.

27. A light control apparatus in accordance with claim 21, wherein said first electrode is disposed on both of said first and second portions of said first surface.

28. A light control apparatus in accordance with claim 27, wherein said second surface has a third portion and a fourth portion respectively corresponding to said first portion and said second portion, and wherein said second electrode is disposed only on said third portion of said second surface.

29. A light control apparatus in accordance with claim 21, wherein said first electrode and said second electrode are not overlapped at an area corresponding to the second portion with respect to the longitudinal direction.

30. A light control apparatus comprising:
a base member; and
a plurality of actuators, each of which is for controlling light by being actuated, each of which comprises:
a piezoelectric member polarized in a polarizing direction and extending in a longitudinal direction orthogonal to the polarizing direction, said piezoelectric member having a first surface and a second surface, said first surface being along the longitudinal direction and being orthogonal to the polarizing direction, said second surface opposing said first surface, a first portion of said first surface being fixedly connected with said base member so that a deformation of said first portion in the longitudinal direction is restricted, a second portion of said first surface not being connected with said base member;
a first electrode disposed on at least a part of said piezoelectric member with respect to the longitudinal direction; and
a second electrode disposed on at least a part of said piezoelectric member with respect to the longitudinal direction so as to oppose said first electrode for at least a part of a longitudinal extent thereof,
wherein said second electrode at least partially opposes the first portion of the first surface of the piezoelectric member,
wherein each of said piezoelectric members is adapted to deform in response to an electric field generated by a voltage applied between said first and second electrodes.

31. A light control apparatus in accordance with claim 30, wherein each of said piezoelectric members is positioned relative to a light source such that light from the light source is passed and blocked in accordance with variations in the electric field.

32. A light control apparatus in accordance with claim 30, wherein each of said piezoelectric member is positioned relative to a light source such that a direction of reflection of light is selected in accordance with variations in the electric field.

33. A light control apparatus in accordance with claim 32, wherein, in each actuator, said second electrode is disposed on said second surface of said piezoelectric member and has a mirror surface for reflecting light.

34. A light control apparatus in accordance with claim 30, wherein, in each actuator, said first electrode is disposed on both of said first and second portions of said first surface of the respective one of piezoelectric members.

35. A light control apparatus in accordance with claim 34, wherein, in each actuator, said second surface has a third portion and a fourth portion respectively corresponding to said first portion and said second portion, and wherein said second electrode is disposed only on said third portion of said second surface.

36. A light control apparatus in accordance with claim 30, wherein, in each actuator, said first electrode and said second electrode are not overlapped at an area corresponding to the second portion with respect to the longitudinal direction.

37. A light control apparatus in accordance with claim 30, wherein each of said actuators are individually connected to said base member.

38. A light control apparatus in accordance with claim 30, wherein said actuators are integrated into a folk-like unit.

* * * * *

UNITED STATES PATENT AND TRADEMARK OFFICE
CERTIFICATE OF CORRECTION

PATENT NO. : 6,297,577 B1
DATED : October 2, 2001
INVENTOR(S) : Hideo Hotomi et al.

It is certified that error appears in the above-identified patent and that said Letters Patent is hereby corrected as shown below:

Column 2,
Line 22, delete "complaint", and insert -- compliant --.
Line 25, delete "arts", and insert -- art --.

Column 4,
Line 14, delete "shows", and insert -- show --.
Line 28, delete "illustrates", and insert -- illustrate --.
Line 31, delete "surfaces", and insert -- surface --.

Column 5,
Line 36, after "of", insert -- a --.
Line 59, delete "colort" and insert -- color --

Column 6,
Line 43, delete "riveting", and insert -- the --.
Line 46, delete "rivetting", and insert -- riveting --.

Column 7,
Line 27, delete "zurconate", and insert -- zirconate --.
Line 51, after "Although", delete ",".
Line 52, delete "a gap".
Line 56, after "microns" delete "(um)", and insert -- (µm) --.

Column 8,
Line 31, delete "folk-like", and insert -- fork-like --.

Column 9,
Lines 28 and 29, delete "and bends upward in a instance(see FIG. 18).", and insert -- and bends upward (see FIG. 18). --.

Column 10,
Line 22, delete "piezoelectric", and insert -- piezo-electric --.
Line 60, delete "could be", and insert -- is --.

UNITED STATES PATENT AND TRADEMARK OFFICE
CERTIFICATE OF CORRECTION

PATENT NO.  : 6,297,577 B1
DATED       : October 2, 2001
INVENTOR(S) : Hideo Hotomi et al.

It is certified that error appears in the above-identified patent and that said Letters Patent is hereby corrected as shown below:

Column 11,
Line 46, delete "It should be noted that since the dicing process", and insert
-- In addition to the structures shown so far, the --.
Line 52, delete "ha s", and insert -- has --.

Column 12,
Line 2, delete "electrodes", and insert -- electrode --.
Line 38, delete "chamber", and insert -- chambers --.
Line 38, delete "eximicer", and insert -- an excimer --.

Column 13,
Line 23, delete "electrodes", and insert -- electrode --.
Line 25, after "adhesive,", insert -- it may --.
Lines 41 and 42, delete "decreasing deformation thereof when being", and insert
-- causes a decrease in deformation when --.

Column 15,
Line 10, delete "25", and insert -- 209 --.

Column 16,
Line 5, after "30B", insert -- . --.

Column 18,
Line 51, delete "over molded", and insert -- overmolded --.

Column 19,
Line 21, delete "decreases", and insert -- decrease --.
Line 37, delete "provide", and insert -- impact --.
Line 55, delete "includes", and insert -- incurs --.

Column 20,
Line 11, after "through", insert -- the --.

Column 21,
Line 46, delete "cure polyimide", and insert -- cure. The polyimide --.

UNITED STATES PATENT AND TRADEMARK OFFICE
CERTIFICATE OF CORRECTION

PATENT NO. : 6,297,577 B1
DATED : October 2, 2001
INVENTOR(S) : Hideo Hotomi et al.

It is certified that error appears in the above-identified patent and that said Letters Patent is hereby corrected as shown below:

Column 22,
Line 3, delete "is".
Line 12, delete "a", and insert -- an --.
Line 38, after "404", insert -- in --.
Line 40, after "line", delete "image".
Line 45, after "described", insert -- , --.
Line 46, delete "as", and insert -- are --.

Column 23,
Line 16, delete "ends", and insert -- end --.
Line 21, delete "moves", and insert -- continues --.
Line 23, delete "continues", and insert -- move --.
Line 59, after "to", insert -- be --.

Column 24,
Line 33, delete "assume", and insert -- assumes --.

Column 25,
Line 32, delete "forms", and insert -- form --.
Line 43, delete "565 565", and insert -- 565, --.
Line 53, after "reflected", delete ".".

Column 26,
Line 38, delete "quarts", and insert -- quartz --.

Column 27,
Line 42, delete "AIN", and insert -- A1N --.

Column 28,
Line 35, delete "(1'X)Pb", and insert -- (1-X)Pb --.

UNITED STATES PATENT AND TRADEMARK OFFICE
CERTIFICATE OF CORRECTION

PATENT NO. : 6,297,577 B1
DATED : October 2, 2001
INVENTOR(S) : Hideo Hotomi et al.

It is certified that error appears in the above-identified patent and that said Letters Patent is hereby corrected as shown below:

Column 28,
Line 40, delete "C1)$P_3O_{12}$, $TiO_2$, $K_2O.nAl_2O_3$. (2) Glasses", and insert
-- C1)$P_3O_{12}$, $TiO_2$, $K_2O.nAl_2O_3$.
      (2) Glasses --.

Column 29,
Line 37, delete "butyrl", and insert -- butyryl --.

Column 36,
Line 6, delete "folk-like", and insert -- fork-like --.

Signed and Sealed this

Eighteenth Day of June, 2002

Attest:

JAMES E. ROGAN
*Attesting Officer*     *Director of the United States Patent and Trademark Office*